(12) United States Patent
Hwang et al.

(10) Patent No.: US 10,014,454 B2
(45) Date of Patent: Jul. 3, 2018

(54) LIGHT-EMITTING DEVICE INCLUDING CHIP-SCALE LENS

(71) Applicant: Samsung Electronics Co., Ltd., Suwon-si (KR)

(72) Inventors: Kyung-wook Hwang, Hwaseong-si (KR); Min-gyeong Gwon, Suwon-si (KR); Sae-sil Kim, Suwon-si (KR); Eun-joo Shin, Seoul (KR); Yu-ri Jung, Seoul (KR); Won-soo Ji, Hwaseong-si (KR); Jong-sup Song, Hwaseong-si (KR)

(73) Assignee: Samsung Electronics CO., Ltd. (KR)

( * ) Notice: Subject to any disclaimer, the term of this patent is extended or adjusted under 35 U.S.C. 154(b) by 0 days.

(21) Appl. No.: 15/412,320

(22) Filed: Jan. 23, 2017

(65) Prior Publication Data

US 2017/0324011 A1    Nov. 9, 2017

(30) Foreign Application Priority Data

May 4, 2016    (KR) .................. 10-2016-0055764

(51) Int. Cl.
*H01L 33/58* (2010.01)
*H01L 33/60* (2010.01)
*H01L 33/50* (2010.01)
*H01L 33/44* (2010.01)

(52) U.S. Cl.
CPC .............. *H01L 33/60* (2013.01); *H01L 33/44* (2013.01); *H01L 33/507* (2013.01)

(58) Field of Classification Search
CPC ....... H01L 33/10; H01L 33/405; H01L 33/46; H01L 33/465; H01L 33/60; H01L 33/20; H01L 33/24; H01L 2933/0025; H01L 33/58
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

FOREIGN PATENT DOCUMENTS

JP    57-205701    * 12/1982

OTHER PUBLICATIONS

US 9,156,280, 10/2015, Kang et al. (withdrawn)

*Primary Examiner* — Sonya D McCall Shepard
(74) *Attorney, Agent, or Firm* — Onello & Mello, LLP

(57) ABSTRACT

A light-emitting device includes a light-emitting structure, a lens, and a reflective layer. The light-emitting structure includes a light-emitting stack structure including a first-conductivity-type semiconductor layer, an active layer, and a second-conductivity-type semiconductor layer, which are stacked, a first electrode layer electrically connected to the first-conductivity-type semiconductor layer, and a second electrode layer electrically connected to the second-conductivity-type semiconductor layer. The lens is located on the light-emitting structure. The reflective layer is located on the lens.

15 Claims, 51 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sheffer et al. |
| 8,129,711 B2 | 3/2012 | Kang et al. |
| 8,178,892 B2 | 5/2012 | Huang et al. |
| 8,179,938 B2 | 5/2012 | Kim |
| 8,198,107 B2 | 6/2012 | Wu et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,461,601 B2 | 6/2013 | Herrmann |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,901,586 B2 | 12/2014 | Kim et al. |
| 9,041,024 B2 | 5/2015 | Yan |
| 9,368,702 B2 * | 6/2016 | Bierhuizen ............. B29C 43/18 |
| 2005/0199898 A1 * | 9/2005 | Lin ........................ H01L 33/20 |
| | | 257/98 |
| 2011/0062469 A1 * | 3/2011 | Camras .................. H01L 33/58 |
| | | 257/98 |
| 2011/0089453 A1 * | 4/2011 | Min ....................... H01L 33/58 |
| | | 257/98 |
| 2011/0186872 A1 * | 8/2011 | Kim ..................... H01L 33/486 |
| | | 257/88 |
| 2013/0002690 A1 * | 1/2013 | Ichinose ............. H01L 51/5275 |
| | | 345/522 |
| 2015/0241028 A1 | 8/2015 | Nakamura |
| 2015/0359056 A1 * | 12/2015 | Song ................. H05B 33/0827 |
| | | 315/186 |
| 2016/0064623 A1 * | 3/2016 | Clatterbuck .......... H01L 33/504 |
| | | 257/98 |

\* cited by examiner

100

LIGHT-EMITTING DEVICE INCLUDING CHIP-SCALE LENS

CROSS-REFERENCE TO RELATED APPLICATION

This application claims the benefit of Korean Patent Application No. 10-2016-0055764, filed on May 4, 2016, in the Korean Intellectual Property Office, the disclosure of which is incorporated herein in its entirety by reference.

BACKGROUND

Inventive concepts relate to a light-emitting device, and more particularly, to a light-emitting device including a chip-scale lens.

A light-emitting device light source may have light distribution (light orientation) characteristics suitable for applied products so that the light-emitting device light source may be applied to lighting and electronic products, for example. To this end, a lens having a much larger volume than a light-emitting device chip may be formed on the light-emitting device chip. However, excessive costs of production of lenses may be required, and integration density may be reduced.

SUMMARY

Some example embodiments of the inventive concept provide a light-emitting device including a chip-scale lens and a reflective layer located on the lens so that the light-emitting device may be downscaled and have a light distribution (light orientation) function.

Aspects of the inventive concept should not be limited by the above description, and other unmentioned aspects will be clearly understood by one of ordinary skill in the art from example embodiments described herein.

According to an aspect of the inventive concept, there is provided a light-emitting device. The light-emitting device includes a light-emitting structure and a lens. The light-emitting structure includes a light-emitting stack structure including a first-conductivity-type semiconductor layer, an active layer, and a second-conductivity-type semiconductor layer, which are stacked, a first electrode layer electrically connected to the first-conductivity-type semiconductor layer, and a second electrode layer electrically connected to the second-conductivity-type semiconductor layer. The lens is located on the light-emitting structure. The lens is configured such that at least some of paths of light emitted by the light-emitting structure are inclined with respect to a directional axis about which the lens is located on the light-emitting structure and such that different paths of the at least some of the paths are directed far away from one another in a direction in which the light travels.

According to another aspect, a light-emitting device comprises a light-emitting structure. The light emitting structure comprises a light-emitting stack structure including a first-conductivity-type semiconductor layer, an active layer, and a second-conductivity-type semiconductor layer, which are stacked. A first electrode is electrically connected to the first-conductivity-type semiconductor layer, and a second electrode is electrically connected to the second-conductivity-type semiconductor layer. A lens is on the light-emitting structure, and a reflective layer is on the lens, wherein the lens and reflective layer are configured to direct light emitted by the light-emitting structure at an incline to a central axis of the lens.

According to another aspect, a light-emitting device includes a light-emitting structure, a multi-faceted lens on the light-emitting structure, and a reflective layer on the lens, wherein the lens and reflective layer are configured to distribute light emitted by the light-emitting structure in a direction inclined with respect to an axis about which the lens is located.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

As used herein, the term "and/or" includes any and all combinations of one or more of the associated listed items. Expressions such as "at least one of," when preceding a list of elements, modify the entire list of elements and do not modify the individual elements of the list.

Figure 1:
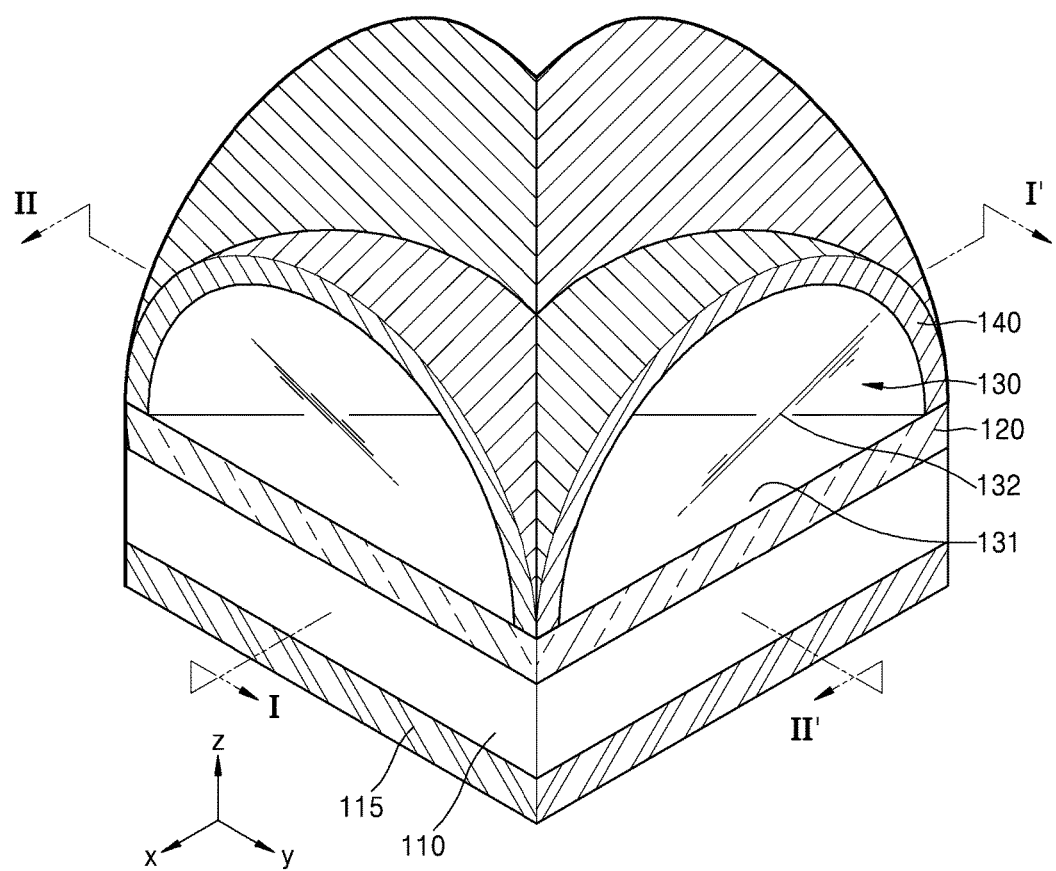
FIG. 1 is a perspective view of a light-emitting device according to an embodiment.
Figure 2:
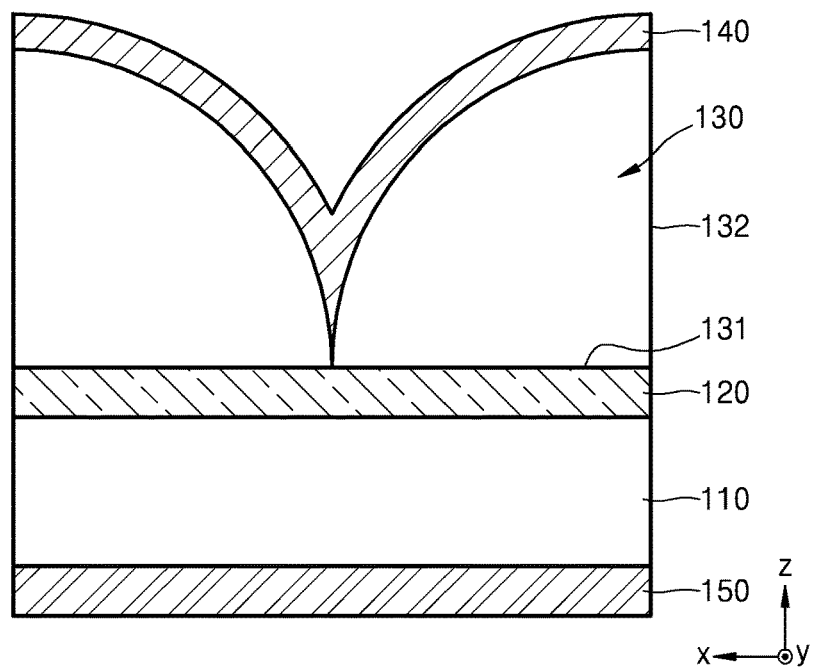
FIGS. 2 and 3 are cross-sectional views taken along lines I-I' and II-II' of FIG. 1, which illustrate a light-emitting device according to an embodiment.
Figure 3:
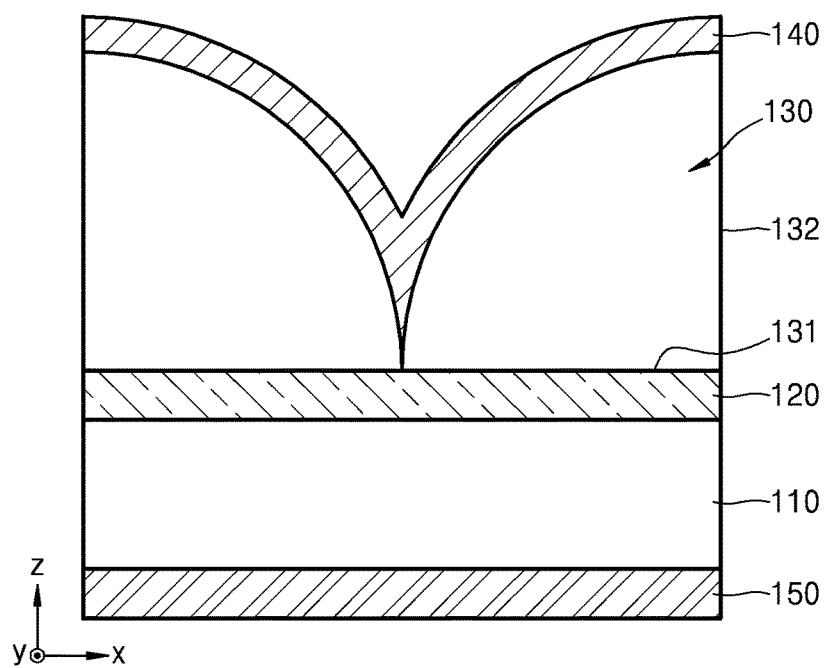
Figure 4:
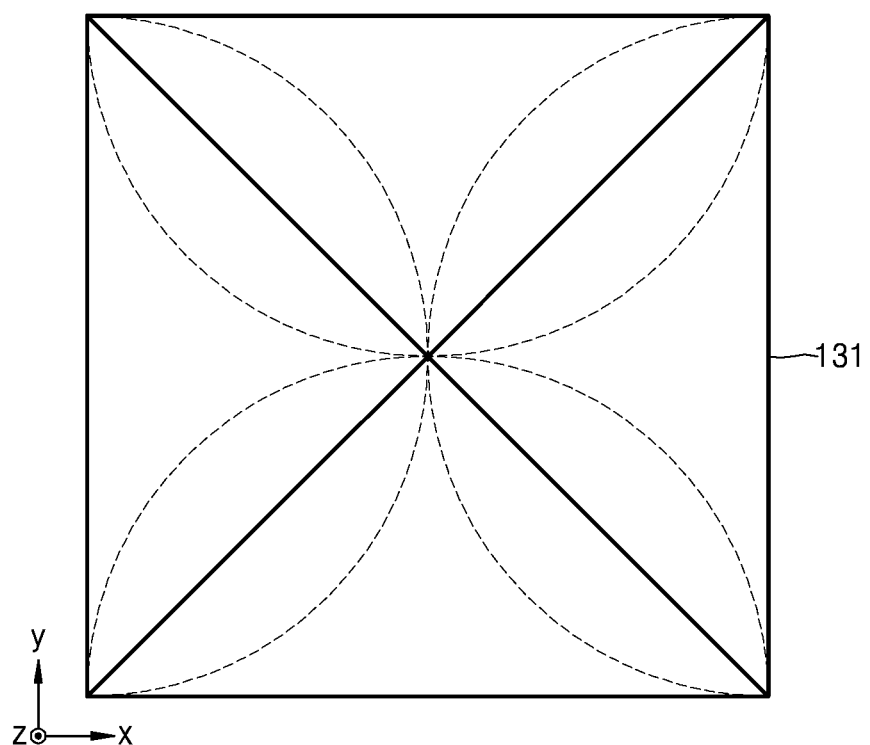
FIG. 4 is a plan view seen by orthographically projecting the perspective view of FIG. 1 to which imaginary spherical lines are applied, to explain a positional relationship between lenses of FIG. 1.

FIG. 1 is a perspective view of a light-emitting device 100 according to an example embodiment. FIGS. 2 and 3 are cross-sectional views taken along lines I-I' and II-II' of FIG. 1, which illustrate the light-emitting device 100 according to the embodiment. FIG. 4 is a plan view seen by orthographically projecting the perspective view of FIG. 1 to which imaginary spherical lines are applied, to explain a positional relationship between lenses 130 of FIG. 1.

Referring to FIGS. 1 to 4, the light-emitting device 100 according to an example embodiment may include a light-emitting structure 110, and a reflection plate 150 may be located under the light-emitting structure 110. Also, a growth substrate 120 may be located on the light-emitting structure 110. The lenses 130 may be located on the growth substrate 120. A reflective layer 140 may be located on the lenses 130.

Although each of the light-emitting structure 110, the growth substrate 120, and the reflection plate 150 is illustrated in the shape of a rectangular parallelepiped, inventive concepts are not limited thereto, and each of the light-emitting structure 110, the growth substrate 120, and the reflection plate 150 may have one of various shapes according to other needs, such as adaptivity for various applied products. In example embodiments each light emitting structure may have multiple lenses or lens facets associated with it, as will be described in greater detail below. For example, each light emitting structure may have two, four, or eight lenses or lens facets associated with it, as in the four lenses of FIG. 1, with a quadrisected spherical shape, or the two lenses 130A of FIG. 7, each of which has a quadrisected spherical shape, lens 130B having a quadrisected spherical shape, lens 130C of FIG. 10 having one of eight equal parts of a spherical shape, lens 130D having a quadrisected elliptical pillar shape, or lens 130E having a quadrangular pyramidal shape.

Referring to FIG. 1, four lenses 130, each of which has a quadrisected spherical shape, may be located on the growth substrate 120. A bottom plane 131 of each of the lenses 130 may be in contact with the growth substrate 120. The bottom planes 131 of the lenses 130 facing the light emitting structure 110 have an area less than or equal to the horizontal cross-sectional area of the light emitting structure 110. The lenses 130 are about the same size as the light emitting structure 110, and therefore have a chip scale size. Side planes 132 of the lenses 130 may be respectively oriented in four directions of ±x and ±y shown in FIG. 1 such that round portions of the lenses 130 lean against one another. In this example embodiment, when one plane is oriented in a specific direction, it may indicate that a normal line to the one plane is parallel to the specific direction. Also, the reflective layer 140 may be located on the round portion of each of the lenses 130, for example.

When necessary, the lenses 130 and/or the reflective layer 140 may be configured such that at least some of the paths of light emitted by the light-emitting structure 110 are inclined with respect to a directional axis about which the lenses 130 are located on the light-emitting structure 110. In this example embodiment, the term "directional axis" refers to an axis (i.e., z-directional axis) that is substantially perpendicular to a surface of the light-emitting structure 110, which is in contact with the lens 130.

In some embodiments, different paths of the at least some of the paths of light emitted by the light-emitting structure 110 may be directed far away from one another. In example embodiments, the lenses 130 and the reflective layer 140 may be configured such that at least some of the paths of light emitted by the light-emitting structure 110 are inclined with respect to a normal line to a surface of the light-emitting structure 110 that is closest to the lens 130, and different paths of the at least some of the paths of the emitted light are directed far away from one another. That is, in example embodiments light emitting device 100 provides omnidirectional, or, at least, multi-directional light, rather than light that is directed in substantially one direction (for example, perpendicular to the surface of bottom plane 131).

The growth substrate 120 may include at least one of materials, such as sapphire, silicon carbide (SiC), and gallium nitride (GaN). In particular, when the growth substrate 120 includes silicon carbide, the growth substrate 120 may be directly molded into a lens because, for example, silicon carbide is relatively easy to mold. The lens 130 may include at least one of glass, SiC, $SiO_2$, $Al_2O_3$, quartz, diamond, poly(methyl methacrylate) (PMMA), and silicone-on-glass (SOG). In such example embodiments, the reflective layer 140 and/or the reflection plate 150 may include at least one of: a metal, a distributed Bragg reflector (DBR), white silicone (or $TiO_2$ silicone), and a composite organic material. The DBR may be formed by alternately stacking a first insulating layer having a first refractive index and a second insulating layer having a second refractive index.

Figure 5:
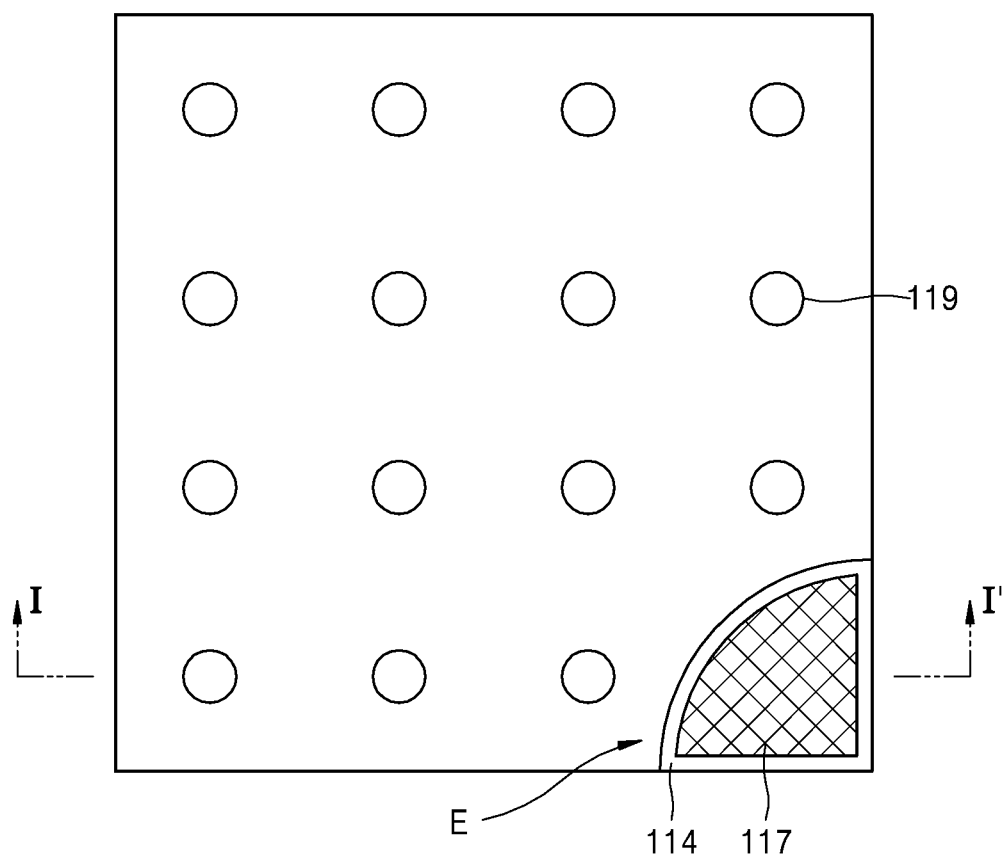
FIG. 5 is a plan view of a semiconductor light-emitting device according to an embodiment.
Figure 6:
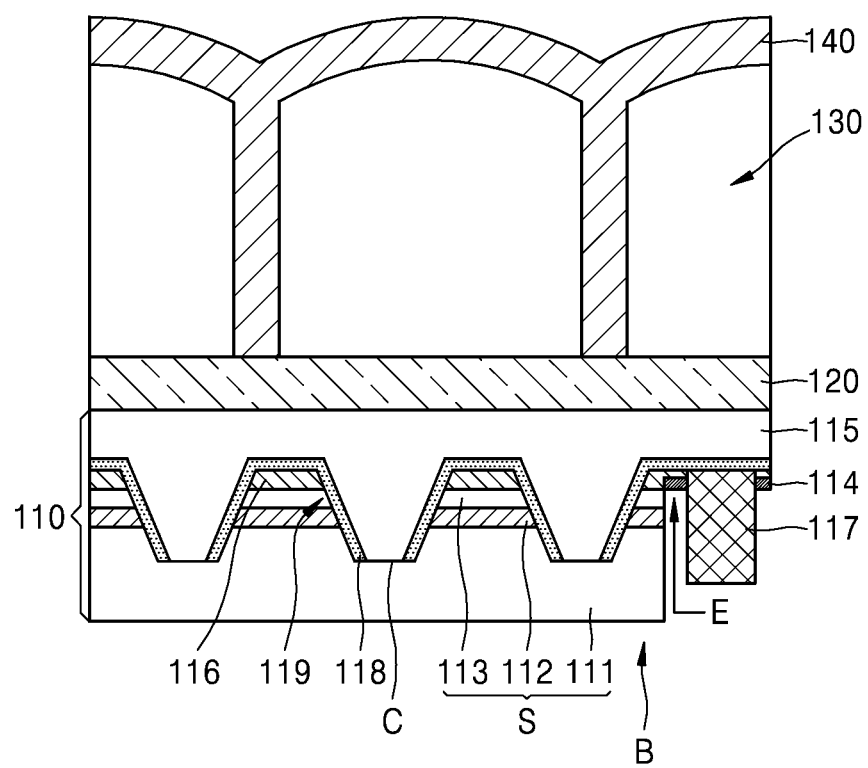
FIG. 6 is a side cross-sectional view taken along a line I-I' of FIG. 5, which illustrates the semiconductor light-emitting device shown in FIG. 5.

FIG. 5 is a plan view of a semiconductor light-emitting device 200 according to an example embodiment. FIG. 5 is a plan view, which is viewed in a direction B of FIG. 6. FIG. 6 is a side cross-sectional view taken along a line I-I' of FIG. 5, which illustrates the semiconductor light-emitting device 200 shown in FIG. 5.

Referring to FIGS. 5 and 6, a semiconductor light-emitting structure 110 may include a light-emitting stack structure S, a first electrode layer 115, an insulating layer 118, and a second electrode layer 116. The light-emitting stack structure S may include a first-conductivity-type semiconductor layer 111, an active layer 112, and a second-conductivity-type semiconductor layer 113, which may be stacked sequentially. For example, the light-emitting stack structure S may be formed using a chemical vapor deposition (CVD) process, a physical vapor deposition (PVD) process, or an atomic layer deposition (ALD) process.

The first electrode layer 115 may be electrically insulated from the second-conductivity-type semiconductor layer 113 and the active layer 112 and may include at least one contact hole 119, which may extend into at least a partial region of the first-conductivity-type semiconductor layer 111, so that the first electrode layer 115 may be electrically connected to the first-conductivity-type semiconductor layer 111. The at least one contact hole 119 may extend from an interface of the first electrode layer 115 through the second electrode layer 116, the second-conductivity-type semiconductor layer 113, and the active layer 112 into the first-conductivity-type semiconductor layer 111. The at least one contact hole 119 may be formed by using an etching process such as, for example, an inductive coupled plasma-reactive ion etching (ICP-RIE) process.

An insulating layer 118 may be provided on the first electrode layer 115 so that the first electrode layer 115 may be electrically insulated from regions other than the growth substrate 120 and the first-conductivity-type semiconductor layer 111. As shown in FIG. 5, the insulating layer 118 may be formed not only between the first electrode layer 115 and the second electrode layer 116, but also on a side surface of the at least one contact hole 119.

In this manner, the second electrode layer 116, the second-conductivity-type semiconductor layer 113, and the active layer 112, which are exposed on the side surface of the at least one contact hole 119, may be electrically insulated from the first electrode layer 115. The insulating layer 118 may be formed by depositing an insulating material, such as $SiO_2$, $SiO_xN_y$, and $Si_xN_y$, for example.

A contact region C of the first-conductivity-type semiconductor layer 111 may be exposed by the contact hole 119, and a partial region of the first electrode layer 115 may be in contact with the contact region C through the contact hole 119. In this manner, the first electrode layer 115 may be connected to the first-conductivity-type semiconductor layer 111.

In example embodiments, the number, shape, and pitch of contact holes 119 and contact diameters (or contact areas) between the contact holes 119 and the first- and second-conductivity-type semiconductor layers 111 and 113 may be appropriately controlled to reduce a contact resistance (refer to FIG. 5). Additionally, the contact holes 119 may be arranged in various shapes in rows and columns to improve the flow of current. The number of conductive vias and contact areas may be controlled such that an area of the contact region C ranges from about 0.1% to 20% of the planar area of the light-emitting stack structure S. In some embodiments, the area of the contact region C may range from about 0.5% to 15% of the planar area of the light-emitting stack structure S and, in example embodiments, may range from about 1% to 10% of the planar area of the light-emitting stack structure S. When the area of the contact region C is less than about 0.1% of the planar area of the light-emitting stack structure S, current spreading may not be uniform to reduce emission characteristics. When the area of the contact region C is more than about 20%, an emission area may be reduced to degrade emission characteristics and luminance. As a result, in example embodiments, the area of the contact region is between 0.1% and 20% of the planar area of the light-emitting stack structure S.

The diameter of conductive vias in a region contacting the first-conductivity-type semiconductor layer 111 may range from, for example, about 1 μm to about 50 μm. The number of the conductive vias may range from 1 to 48000 per light-emitting stack structure S depending on the area of the light-emitting stack structure S, for example. In example embodiments, depending on the area of the light-emitting stack structure S, the number of conductive vias may be, for example, from 2 to 45000, specifically, from 5 to 40000, and more specifically, from 10 to 35000. The conductive vias may be arranged as a matrix, in rows and columns, and spaced a distance of from about 10 μm to about 1000 μm apart from one another. The distance between the conductive vias may range from, for example, about 50 μm to about 700 μm, specifically, about 100 μm to about 500 μm, and more specifically, about 150 μm to about 400 μm.

Should the distance between the conductive vias be less than about 10 μm, the number of the conductive vias may increase, and an emission area may be relatively reduced to degrade luminous efficiency. Should the distance between the conductive vias be more than about 1000 μm, current spreading may be precluded to degrade luminous efficiency. The depth of the conductive vias may depend on thicknesses of the second-conductivity-type semiconductor layer 113 and the active layer 112. For example, the depth of the conductive vias may range from about 0.1 μm to about 5.0 μm.

As shown in FIG. 5, the first electrode layer 115 may include an electrode forming region E, which may extend and be exposed outside the light-emitting stack structure S. The electrode forming region E may include an electrode pad unit 117 configured to connect an external power source to the second electrode layer 116. Although only one electrode forming region E is illustrated, the first electrode layer 115 may include a plurality of electrode forming regions E, as needed. As shown in FIG. 5, the electrode forming region E may be formed in one corner of light-emitting structure 110 to maximize an emission area.

In an example embodiment, an etch stop insulating layer 114 may be located around the electrode pad unit 117. The etch stop insulating layer 114 may be formed after the light-emitting stack structure S is formed and before the second electrode layer 116 is formed. The etch stop insulating layer 114 may act as an etch stop layer during an etching process for forming the electrode forming region E.

Figure 7:
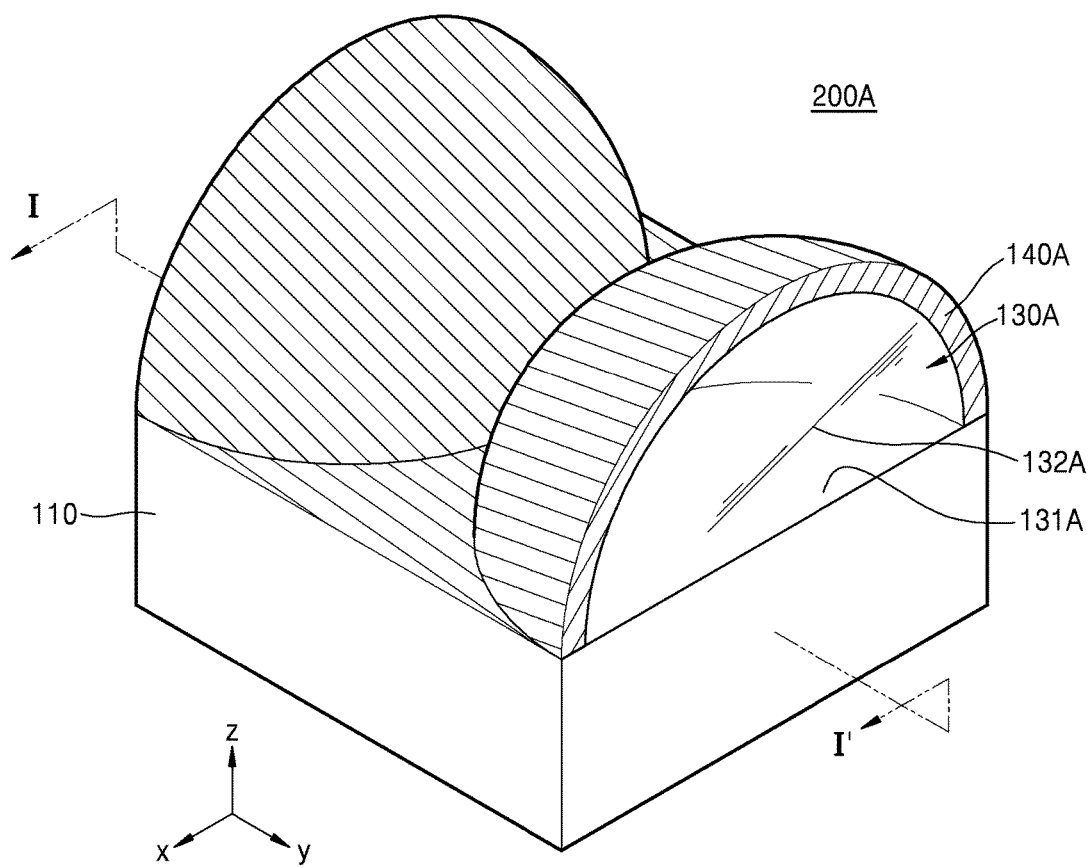
FIG. 7 is a perspective view of a light-emitting device according to an embodiment.
Figure 8:
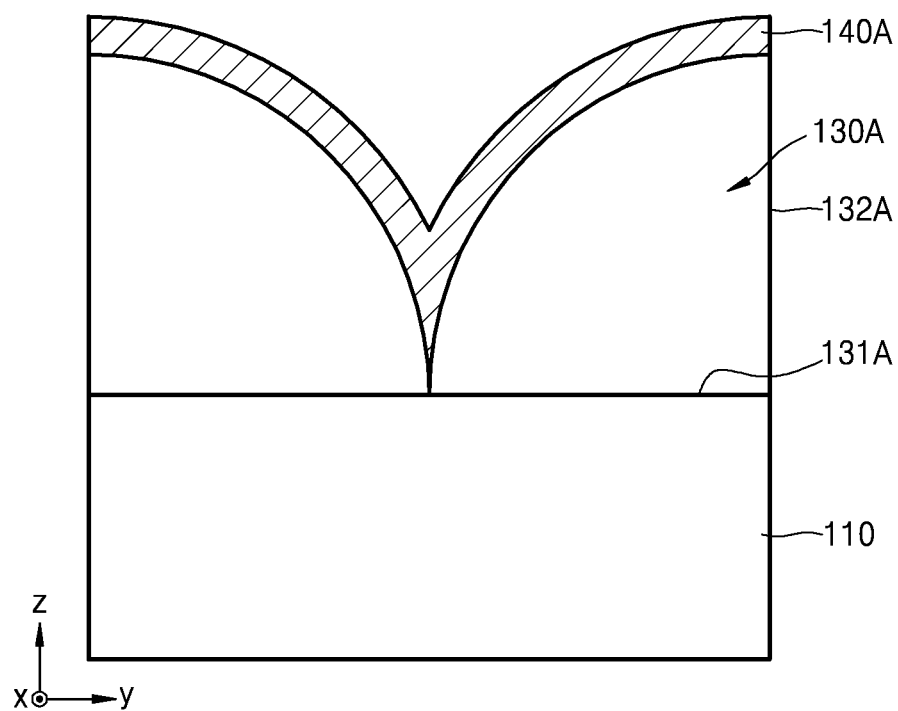
FIG. 8 is a cross-sectional view taken along a line I-I' of FIG. 7, which illustrates a light-emitting device according to an embodiment.

FIG. 7 is a perspective view of a light-emitting device 100A according to an example embodiment. FIG. 8 is a cross-sectional view taken along a line I-I' of FIG. 7, which illustrates the light-emitting device 100A according to the present example embodiment.

Referring to FIGS. 7 and 8, the light-emitting device 100A may include a light-emitting structure 110, a lens 130A may be located on the light-emitting structure 110, and a reflective layer 140A may be located on the lens 130A. Although not shown in FIGS. 7 and 8, a growth substrate 120 may be located between the lens 130A and the light-emitting structure 110, and a reflection plate (refer to 150 in FIGS. 1 to 4) may be provided under the light-emitting structure 110. Although the light-emitting structure 110 is illustrated in the shape of a rectangular parallelepiped, inventive concepts are not limited thereto, and the light-emitting structure 110 may have one of various shapes according to other needs, such as adaptivity for applied products.

Referring to FIG. 7, two lenses 130A, each of which has a quadrisected spherical shape, may be located on the light-emitting structure 110. Planes 131A of the lenses 130A may be in contact with the light-emitting structure 110, while other planes 132A of the lenses 130A may be oriented in different directions, such that round portions of the two lenses 130 lean against one another.

Figure 9:
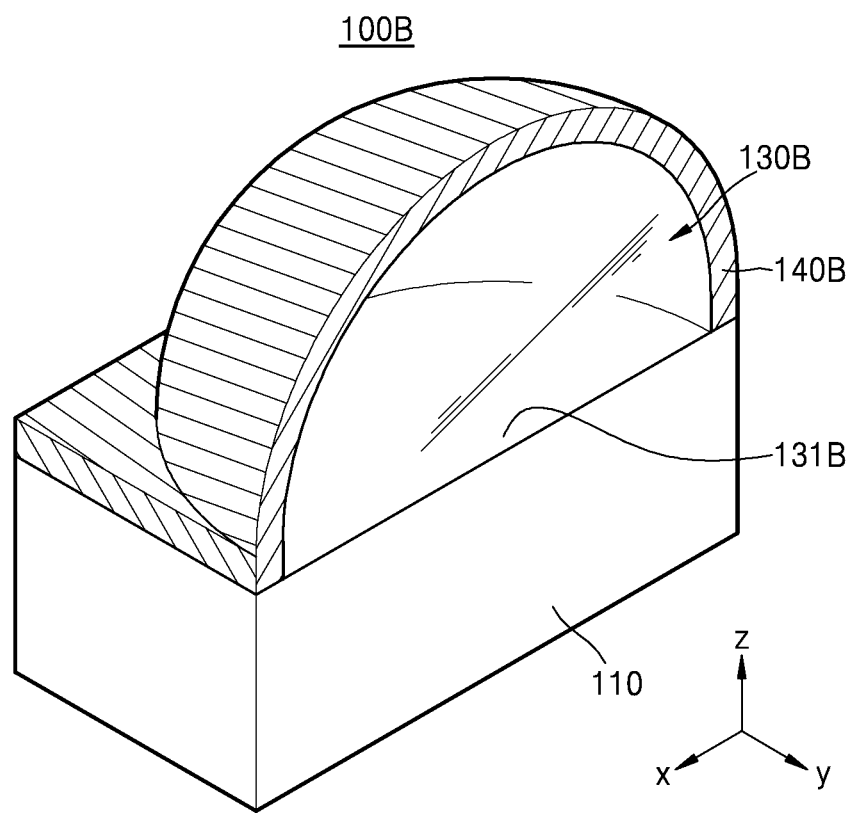
FIGS. 9 to 11 are perspective views of light-emitting device s according to embodiments.

FIG. 9 is a perspective view of a light-emitting device 100B according to an example embodiment.

Referring to FIG. 9, the light-emitting device 100 according to the present example embodiment may include a light-emitting structure 110, and a lens 130B may be located on the light-emitting structure 110. A reflective layer 140B may be located on the lens 130B. The lens 130B located on the light-emitting structure 110 may have a quadrisected spherical shape. Plane 131B of the lens 130B may be in contact with the light-emitting structure 110. Although not shown in FIG. 9, a growth substrate (refer to 120 in FIGS. 1 to 4) may be located between the lens 130B and the light-emitting structure 110, and a reflection plate (refer to 150 in FIGS. 1 to 4) may be provided under the light-emitting structure 110.

Figure 10:
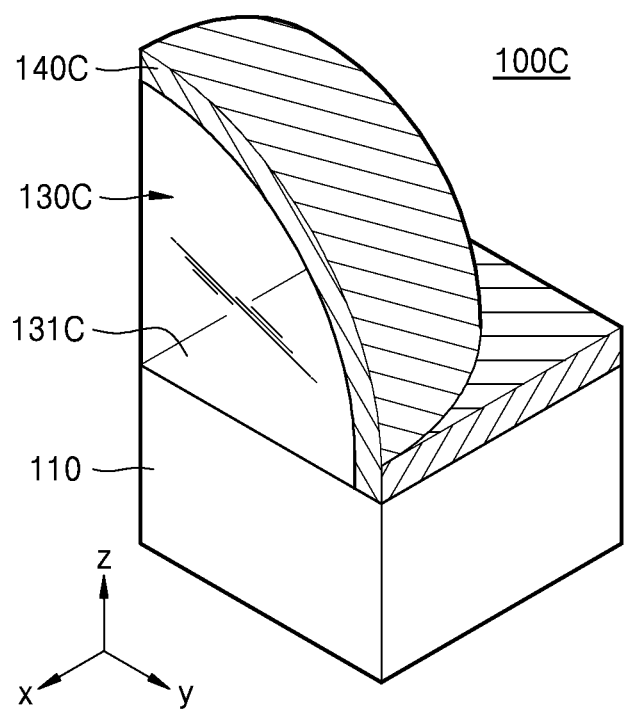

FIG. 10 is a perspective view of a light-emitting device 100C according to an example embodiment.

Referring to FIG. 10, the light-emitting device 100C according to the present example embodiment may include a light-emitting structure 110. A lens 130C may be located on the light-emitting structure 110, and a reflective layer 140C may be located on the lens 130C. The lens 130C may have one of eight equal parts of a spherical shape, and plane 131C of the lens 130C may be in contact with the light-emitting structure 110. Although not shown in FIG. 10, a growth substrate (refer to 120 in FIGS. 1 to 4) may be located between the lens 130C and the light-emitting structure 110, and a reflection plate (refer to 150 in FIGS. 1 to 4) may be provided under the light-emitting structure 110.

Figure 11:
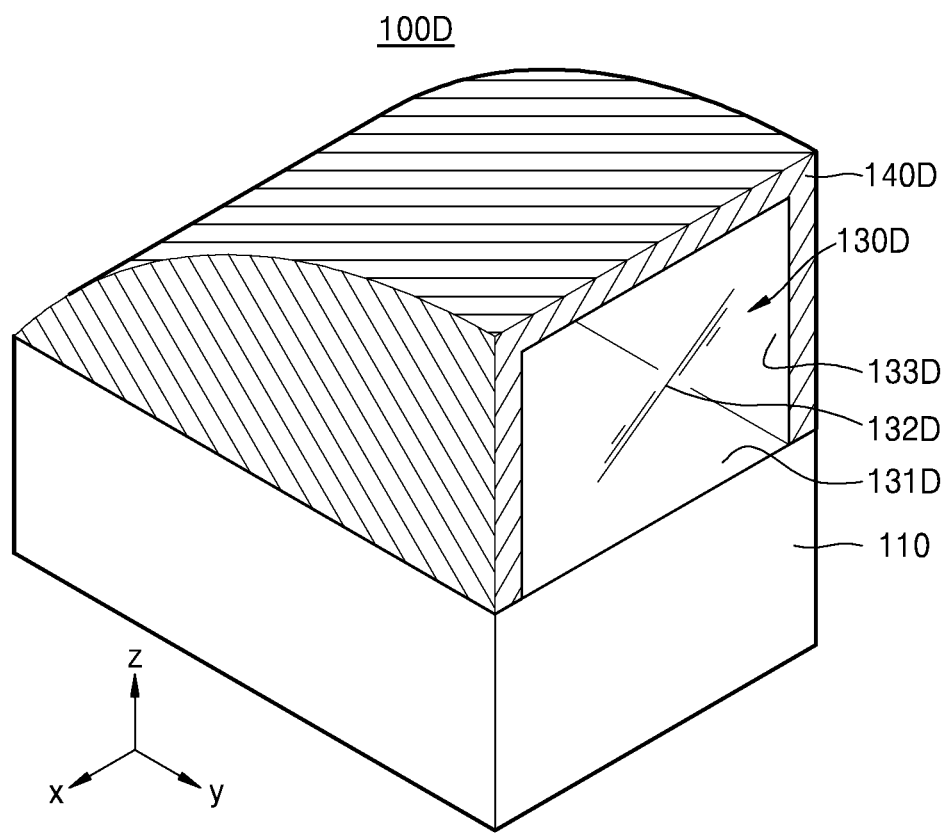

FIG. 11 is a perspective view of a light-emitting device 100D according to an example embodiment.

Referring to FIG. 11, the light-emitting device 100D according to the present example embodiment may include a light-emitting structure 110. A lens 130D may be located on the light-emitting structure 110, and a reflective layer 140D may be located on the lens 130D. The lens 130D may have a quadrisected elliptical pillar shape about an axis parallel to a height axis thereof. Cut surface 131D of cut surfaces of the lens 130D may be in contact with a growth substrate. An ellipse including the quadrisected elliptical pillar shape may have an eccentricity of 0 or more and less than 1 before cut. When the ellipse has an eccentricity of about 0, the lens 130D may have a quadrisected cylindrical shape. Additionally, the reflective layer 140D may be located on a curved surface of the lens 130D. In some embodiments, the reflective layer 140 may extend to a side surface 133D of the lens 130D, which is not the cut surface of the lens 130D but a plane surface thereof. Although not shown in FIG. 11, a growth substrate (refer to 120 in FIGS. 1 to 4) may be located between the lens 130D and the light-emitting structure 110, and a reflection plate (refer to 150 in FIGS. 1 to 4) may be provided under the light-emitting structure 110.

Figure 12:
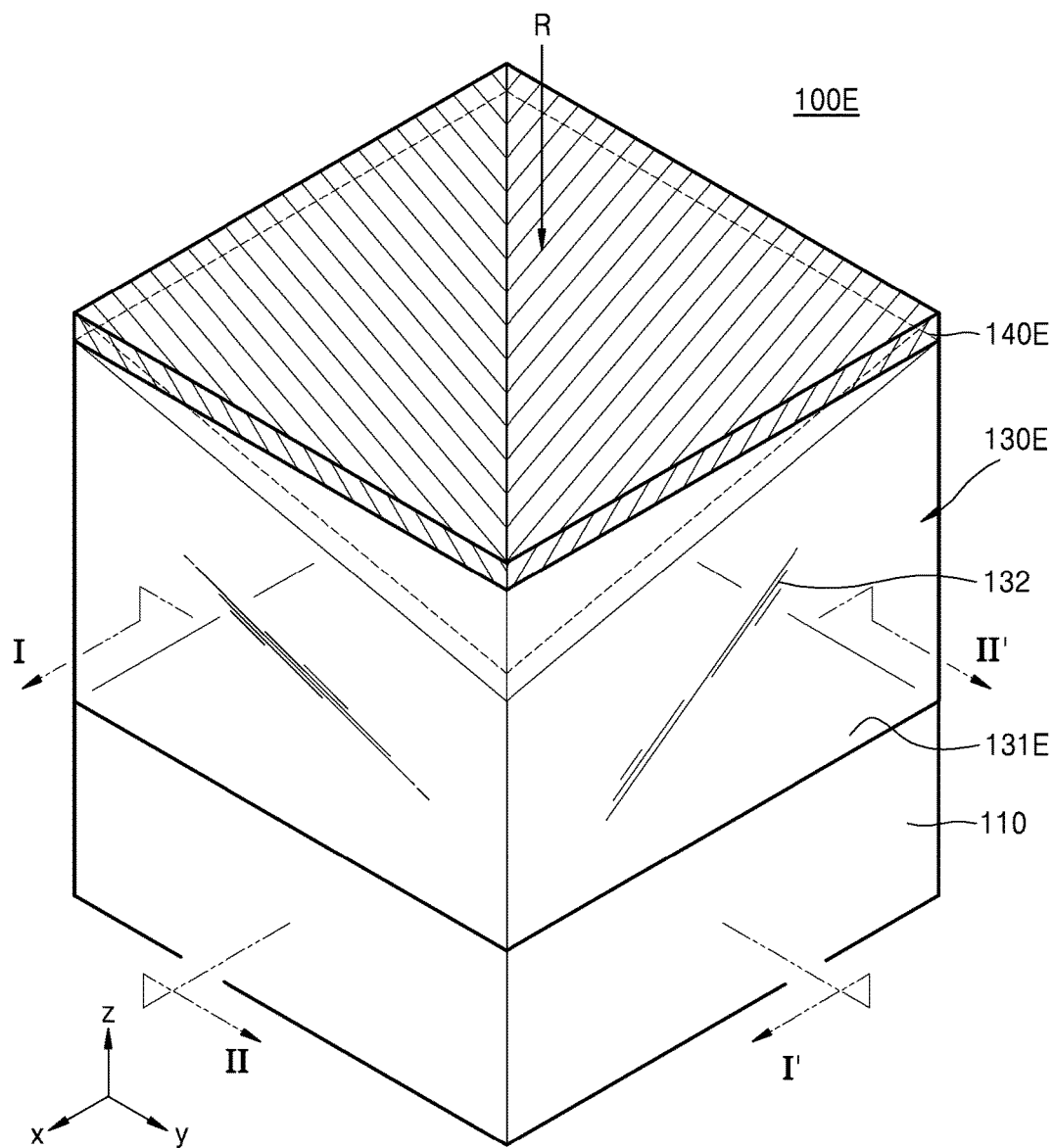
FIG. 12 is a perspective view of a light-emitting device according to an embodiment.
Figure 13:
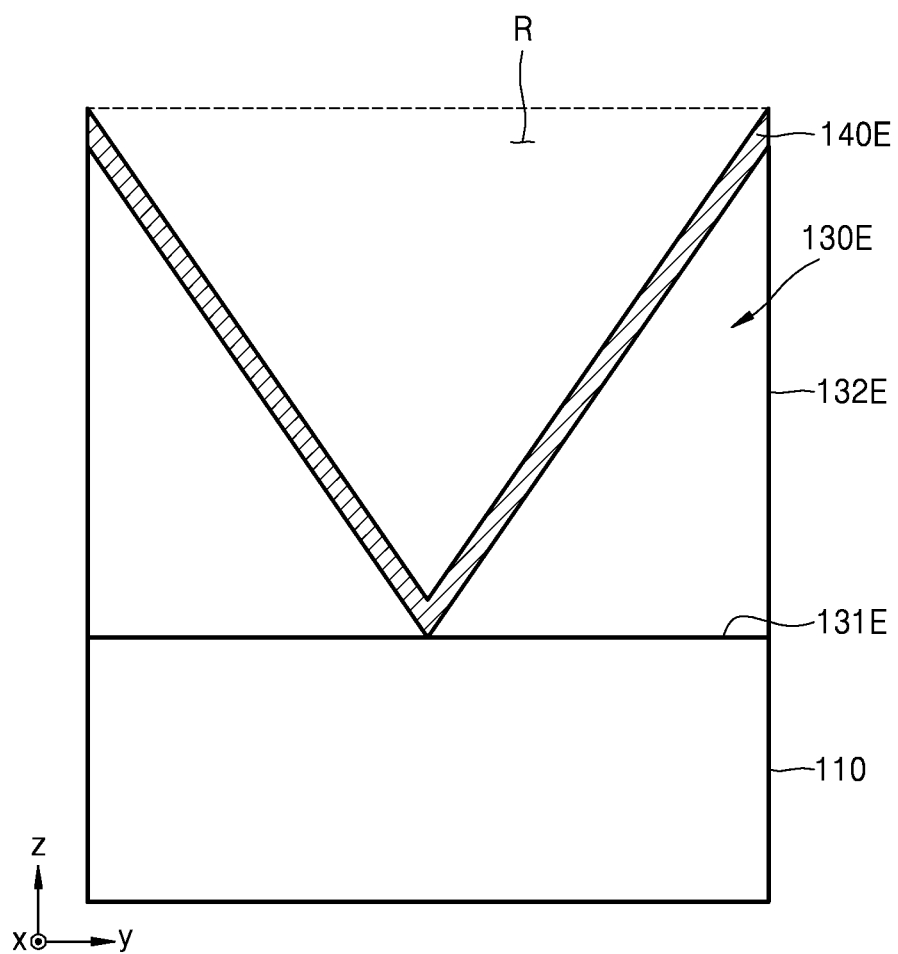
FIGS. 13 and 14 are cross-sectional views taken along lines I-I' and II-II' of FIG. 12, which illustrate a light-emitting device according to an embodiment.
Figure 14:
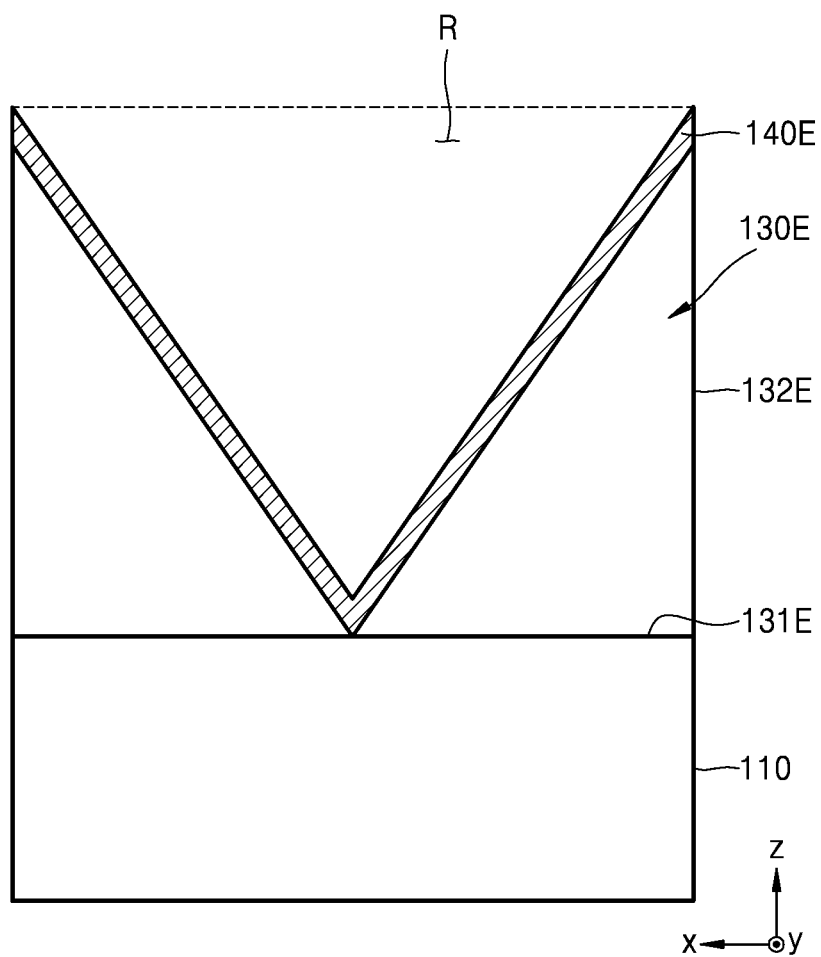

FIG. 12 is a perspective view of a light-emitting device 100E according to an example embodiment. FIGS. 13 and 14 are cross-sectional views taken along I-I' and II-II' of FIG. 12, which illustrate the light-emitting device 100E according to the example embodiment.

Referring to FIG. 12, the light-emitting device 100E according to the present example embodiment may include a light-emitting structure 110. A lens 130E may be located on the light-emitting structure 110, and a reflective layer 140E may be located on the lens 130E. The lens 130E may have a shape in which a quadrangular pyramid R having the same height and the same base area as a square pillar is removed from the square pillar. A surface 131E of the lens 130E, which may include a vertex of the removed quadrangular pyramid R, may be in contact with the light-emitting structure 110. Although not shown in FIGS. 12 to 14, a growth substrate (refer to 120 in FIGS. 1 to 4) may be located between the lens 130E and the light-emitting structure 110, and a reflection plate 150 (refer to 150 in FIGS. 1 to 4) may be further provided under the light-emitting structure 110.

Figure 15:
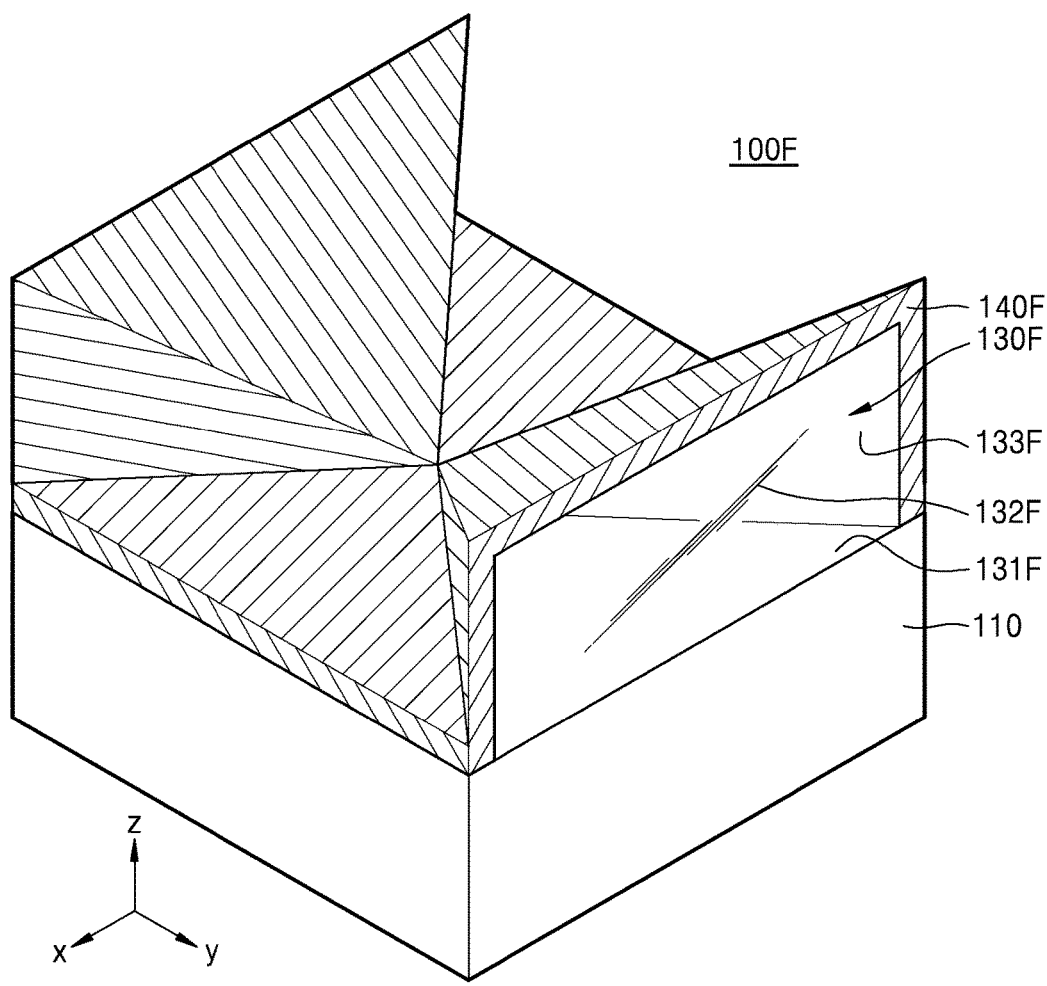
FIGS. 15 to 18 are perspective views of light-emitting devices according to embodiments.

FIG. 15 is a perspective view of a light-emitting device 100F according to an example embodiment. Referring to FIG. 15, the light-emitting device 100F according to the present example embodiment may include a light-emitting structure 110. A lens 130F may be located on the light-emitting structure 110, and a reflective layer 140F may be located on the lens 130F. The lens 130F may include two quadrangular pyramids. One side surface 131F of side surfaces of the lens 130F may be in contact with the light-emitting structure 110.

In example embodiments, vertexes of two quadrangular pyramids of the lens 130F may meet at one point on the light-emitting structure 110. In example embodiments, the reflective layer 140F may be located on three side surfaces 133F of the lens 130F other than a side surface 131F of the lens 130F that is in contact with the light-emitting structure 110. In such example embodiments, terms 'side surfaces' refer to the remaining sides of a quadrangular pyramid other than a square base side of the quadrangular pyramid. Additionally, the reflective layer 140F may be located on an exposed surface of the light-emitting structure 110 on which the lens 130F is not located. Although not shown in FIG. 15, a growth substrate (refer to 120 in FIGS. 1 to 4) may be located between the lens 130F and the light-emitting structure 110, and a reflection plate (refer to 150 in FIGS. 1 to 4) may be further provided under the light-emitting structure 110.

Figure 16:
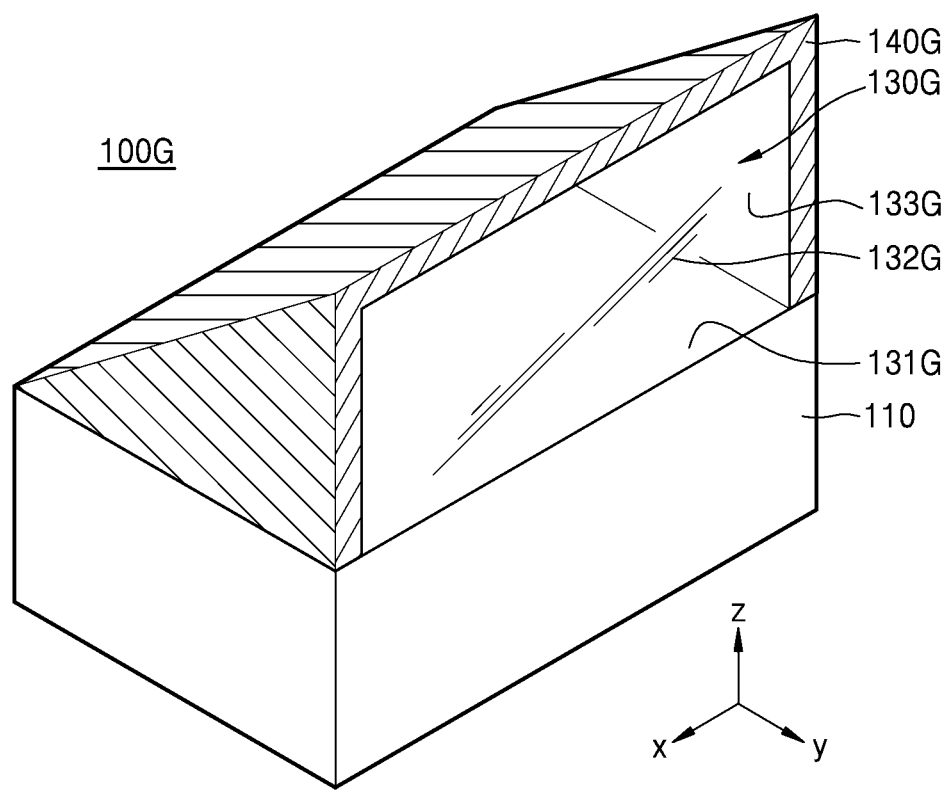

FIG. 16 is a perspective view of a light-emitting device 100G according to an example embodiment. Referring to FIG. 16, the light-emitting device 1000 according to the present example embodiment may include a light-emitting structure 110. A lens 130G may be located on the light-emitting structure 110, and a reflective layer 140G may be located on the lens 130G. The lens 130G may have a triangular prism shape. One side surface 131G of side surfaces of the lens 130G may be in contact with the light-emitting structure 110. In such example embodiments, terms 'side surfaces' refer to the remaining three sides of a triangular prism other than two triangular base sides of the triangular prism. The reflective layer 140G may extend to two base surfaces 132G of the triangular prism shape of the lens 130G. Although not shown in FIG. 16, a growth substrate (refer to 120 in FIGS. 1 to 4) may be located between the lens 130F and the light-emitting structure 110, and a reflection plate (refer to 150 in FIGS. 1 to 4) may be further provided under the light-emitting structure 110.

Figure 17:
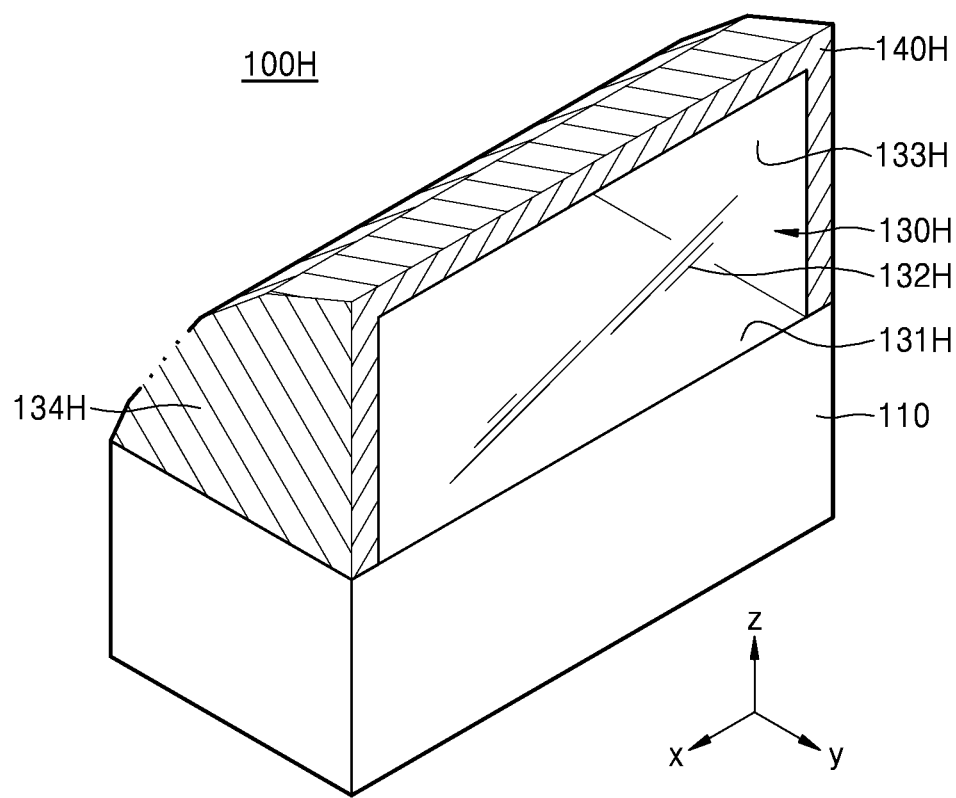

FIG. 17 is a perspective view of a light-emitting device 100H according to an example embodiment. Referring to FIG. 17, the light-emitting device 100H according to the present example embodiment may include a light-emitting structure 110. A lens 130H may be located on the light-emitting structure 110, and a reflective layer 140H may be located on the lens 130H. The lens 130H may have a polygonal pillar shape, and one side surface 131H of side surfaces of the lens 130H may be in contact with the light-emitting structure 110. In such example embodiments, terms 'side surfaces' refer to the remaining sides of a polygonal pillar other than two polygonal base sides of the polygonal pillar. In this example embodiment, the reflective layer 140H may be located on a side surface 133H of the lens 130H other than at least one side surface 134H of the lens 130H and a surface of the lens 130H that is in contact with the light-emitting structure 110. Additionally, the reflective layer 140H may extend to two base surfaces 132H of the lens 130H. Although not shown in FIG. 17, a growth substrate (refer to 120 in FIGS. 1 to 4) may be located between the lens 130H and the light-emitting structure 110, and a reflection plate (refer to 150 in FIGS. 1 to 4) may be provided under the light-emitting structure 110.

Figure 18:
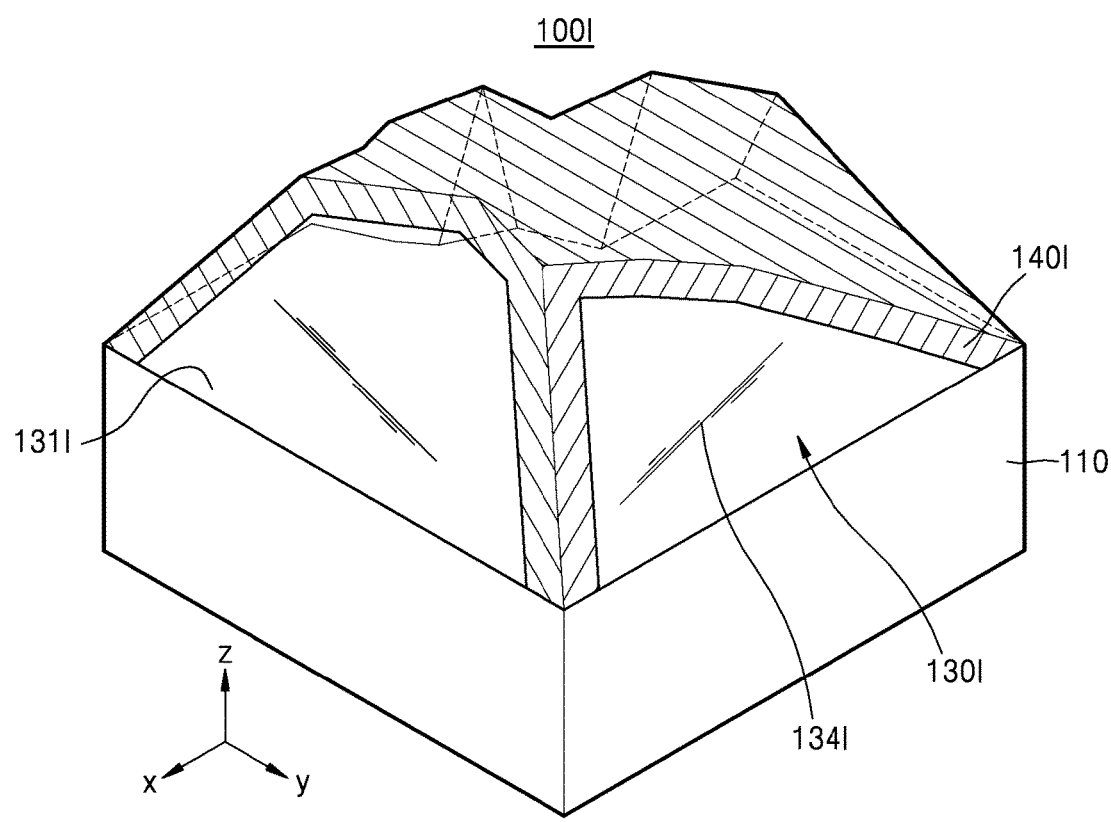

FIG. 18 is a perspective view of a light-emitting device 100I according to an example embodiment. Referring to FIG. 18, the light-emitting device 100I according to the present example embodiment may include a light-emitting structure 110, a lens 130I may be located on the light-emitting structure 110, and a reflective layer 140I may be located on the lens 130I. The lens 130I may have an arbitrary polyhedral shape, and one side 131I of the polyhedral shape may be in contact with the light-emitting structure 110. The reflective layer 140I may be located on the lens 130I, except for at least one side 134I of the lens 130I and the side 131I that is in contact with the light-emitting structure 110. Although not shown in FIG. 18, a growth substrate (refer to 120 in FIGS. 1 to 4) may be located between the lens 130I and the light-emitting structure 110, and a reflection plate (refer to 150 in FIGS. 1 to 4) may be provided under the light-emitting structure 110.

Figure 19:
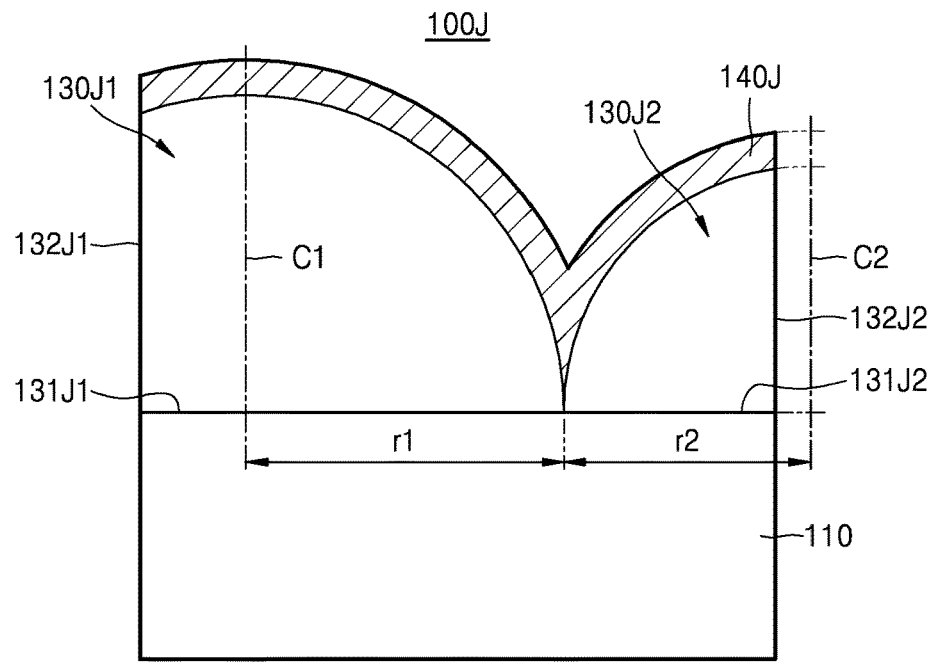
FIGS. 19 to 24 are cross-sectional views of light-emitting devices according to embodiments.

FIG. 19 is a cross-sectional view of a light-emitting device 100J according to an example embodiment.

Referring to FIG. 19, the light-emitting device 100J according to the present example embodiment may include a light-emitting structure 110. A lens 130J may be located on the light-emitting structure 110, and a reflective layer 140J may be located on the lens 130J. The lens 130J may include a first lens portion 130J1 and a second lens portion 130J2, each of which is formed by cutting a hemisphere. A cut surface 132J1 of the first lens portion 130J1 may not pass through a central surface C1 of a hemisphere, and a cut surface 132J2 of the second lens portion 130J2 may not pass through a central surface C2 of a hemisphere. A radius r1 of the first lens portion 130J1 may be different from a radius r2 of the second lens portion 130J2 (r1≠r2). Although not shown in FIG. 19, a growth substrate (refer to 120 in FIGS. 1 to 4) may be located between the lens 130J and the light-emitting structure 110, and a reflection plate (refer to 150 in FIGS. 1 to 4) may be provided under the light-emitting structure 110.

Figure 20:
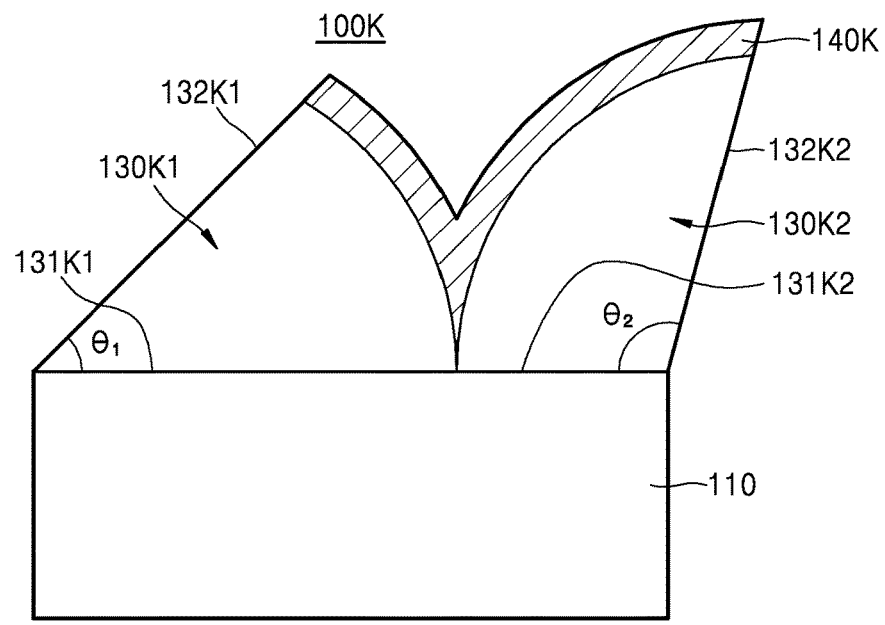

FIG. 20 is a cross-sectional view of a light-emitting device 110K according to an example embodiment.

Referring to FIG. 20, the light-emitting device 100K according to the present example embodiment may include a light-emitting structure 110, a lens 130K may be located on the light-emitting structure 110, and a reflective layer 140K may be located on the lens 130K. The lens 130K may be divided into a first lens portion 130K1 and a second lens portion 130K2. The first lens portion 130K1 may have the shape of a partial hemisphere formed by cutting a hemisphere, and the second lens portion 130K2 may have the shape of a partial hemisphere formed by cutting a hemisphere. Cut surfaces 132K1 and 132K2 of the first lens portion 130K1 and the second lens portion 130K2 may not be perpendicular to flat surfaces 131K1 and 131K2 of the first and second lens portions 130K1 and 130K2, respectively. As a result, each of angles formed by the cut surfaces 132K1 and 132K2 of the first and second lens portions 130K1 and 130K2 with the flat surfaces 130K1 and 131K2 of the first and second lens portions 130K1 and 130K2 may not be 90°. That is, assuming that an angle formed by the flat surface 131K1 of the first lens portion 130K1 with the cut surface 132K1 of the first lens portion 130K1 is θ1 and an angle formed by the flat surface 131K2 of the second lens portion 130K22 with the cut surface 132K2 of the second lens portion 130K2 is θ2, each of the angles θ1 and θ2 may be larger than 0° and less than 180°. The angle θ1 may be equal to or different from the angle θ2 in example embodiments. Although not shown in FIG. 20, a growth substrate (refer to 120 in FIGS. 1 to 4) may be located between the lens 130K and the light-emitting structure 110, and a reflection plate (refer to 150 in FIGS. 1 to 4) may be further provided under the light-emitting structure 110.

Figure 21:
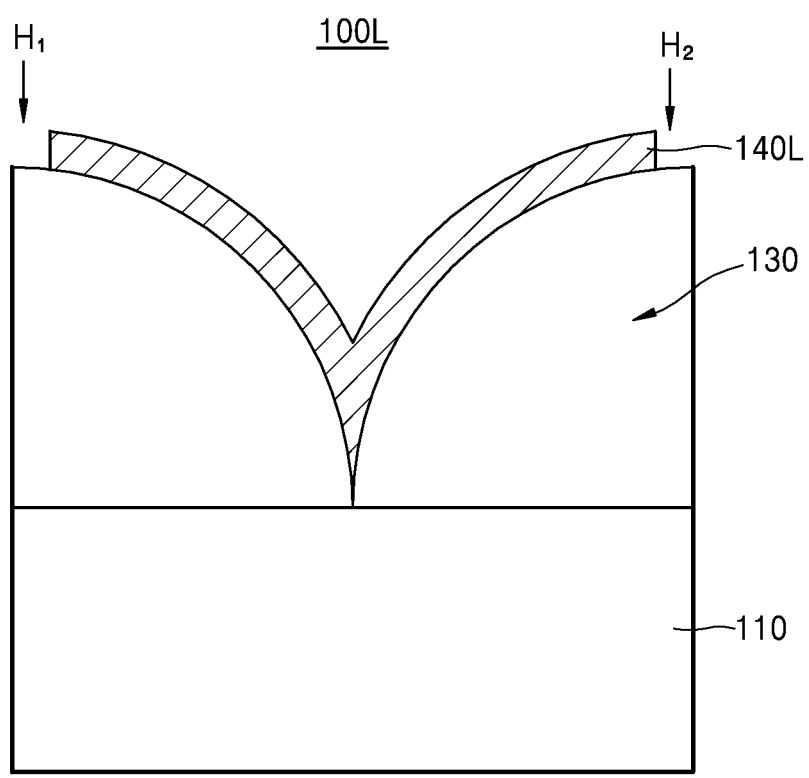

FIG. 21 is a cross-sectional view of a light-emitting device 100L according to an example embodiment.

Referring to FIG. 21, the light-emitting device 100L according to the present example embodiment may include a light-emitting structure 110, a lens 130 may be located on the light-emitting structure 110, and a reflective layer 140L may be located on the lens 130. At least a portion of a round surface of the lens 130 may be covered with the reflective layer 140L. In example embodiments, as can be seen from openings H1 and H2, the reflective layer 140L may not be located on portions of a surface of the lens 130. In example embodiments, a desired distribution of light may be obtained by adjusting positions and sizes of the openings H1 and/or H2. Although not shown in FIG. 21, a growth substrate (refer to 120 in FIGS. 1 to 4) may be located between the lens 130 and the light-emitting structure 110, and a reflection plate (refer to 150 in FIGS. 1 to 4) may be further provided under the light-emitting structure 110.

Figure 22:
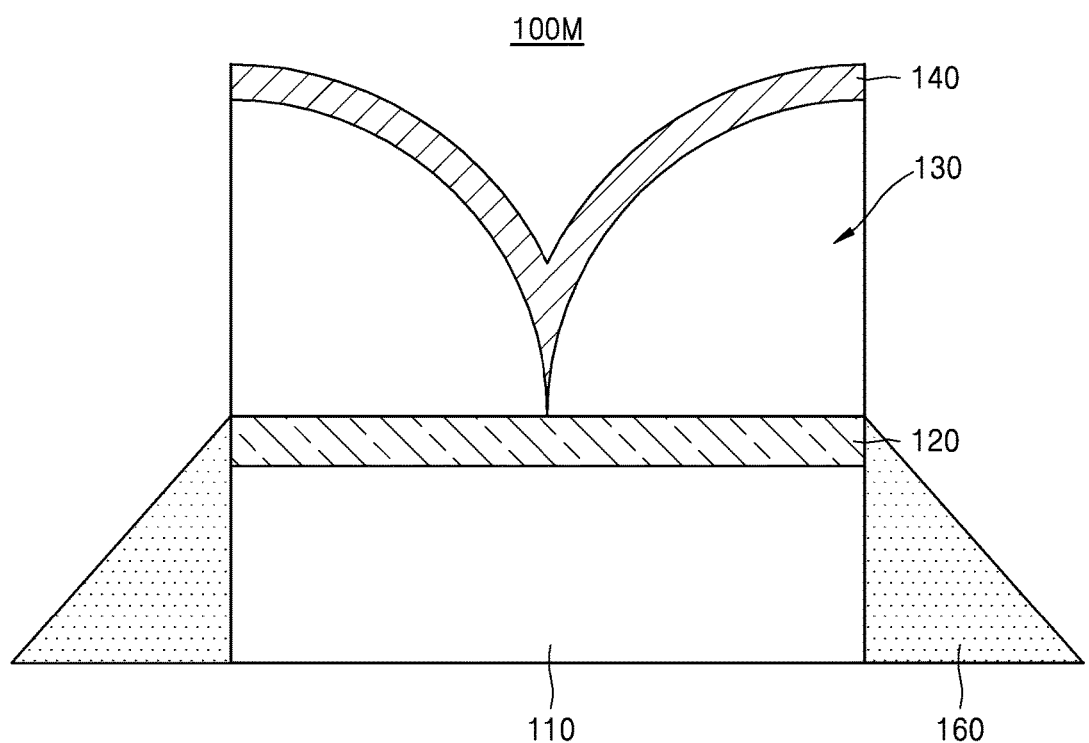

FIG. 22 is a cross-sectional view of a light-emitting device 100M according to an example embodiment.

Referring to FIG. 22, the light-emitting device 100M according to the present example embodiment may include a light-emitting structure 110, and a growth substrate 120 may be located on the light-emitting structure 110. A lens 130 may be located on the growth substrate 120. A reflective layer 140 may be located on the lens 130. A blocking layer 160 may be located on an exposed portion of the growth substrate 120. The blocking layer 160 may extend to the light-emitting structure 110, for example. The illustrated profile of the blocking layer, which is only exemplary, should not be construed to limit the scope of the inventive concept and may have a different shape in accordance with principles of inventive concepts. Although not shown in FIG. 22, a reflection plate 150 may be located under the light-emitting structure 110.

Figure 23:
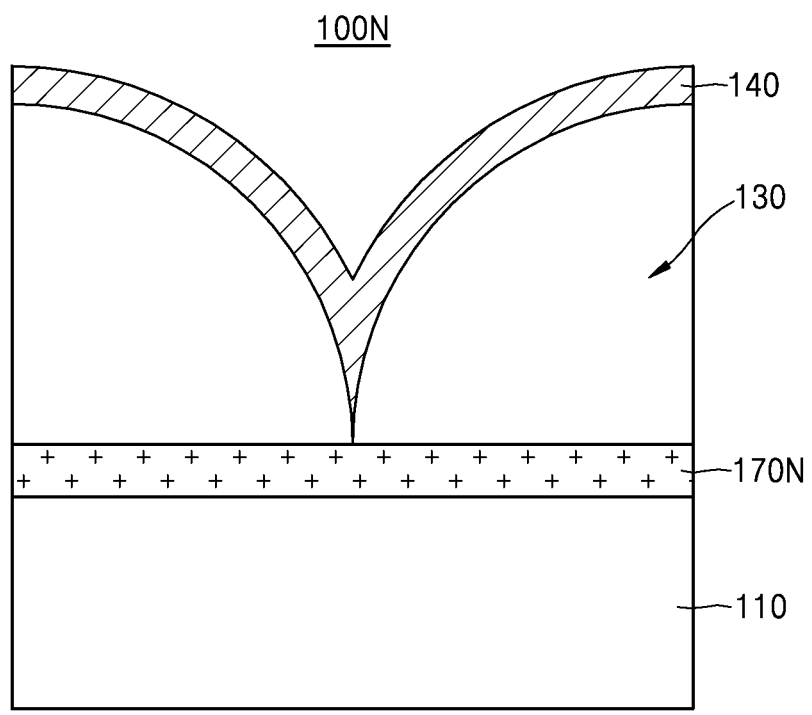
Figure 24:
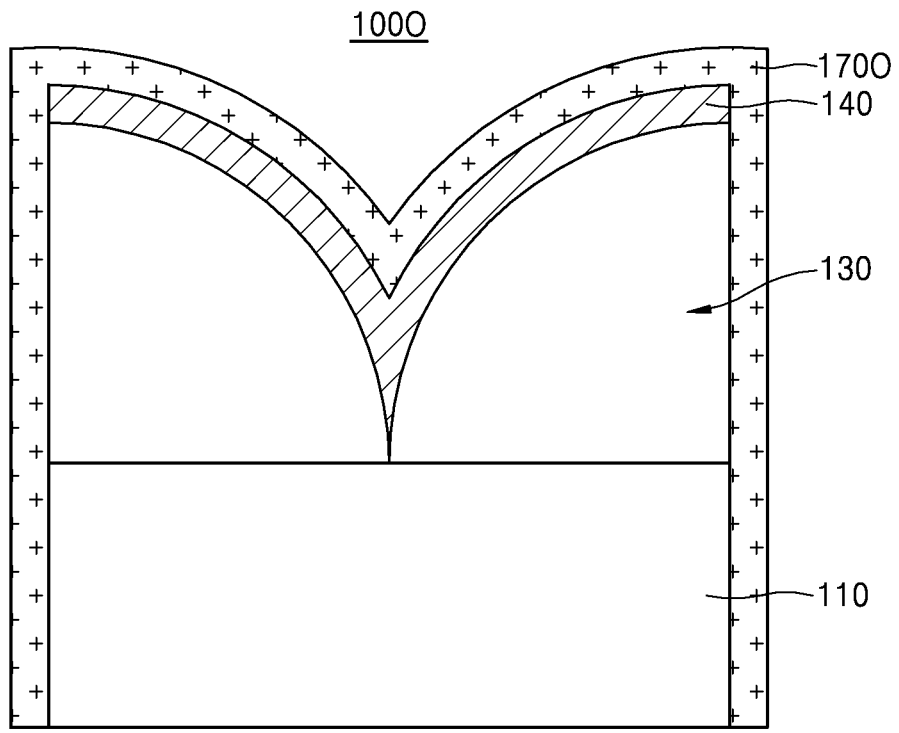

FIGS. 23 and 24 are cross-sectional views of light-emitting devices 110N and 110O according to example embodiments.

Referring to FIGS. 23 and 24, each of the light-emitting devices 110N and 110O according to the present example embodiments may include a light-emitting structure 110, a lens 130 may be located on the light-emitting structure 110, and a reflective layer 140 may be located on the lens 130. A light conversion layer 170N or 170O may be at least partially provided inside or outside the entire structure of each of the light-emitting devices 110N, which includes the light-emitting structure 110, the lens 130, and the reflective layer 140. Although not shown in FIGS. 23 and 24, a growth substrate (refer to 120 in FIGS. 1 to 4) may be located between the lens 130 and the light-emitting structure 110, and a reflection plate (refer to 150 in FIGS. 1 to 4) may additionally be provided under the light-emitting structure 110. The light conversion layer 170N or 170O may be used to improve color quality when the light-emitting structure 110 is a white light source, for example. In example embodiments, the light conversion layer 170N or 170O may include at least one of various light conversion materials, such as phosphors and quantum dots (QDs). The light conversion materials will be described in greater detail below.

Figure 25:
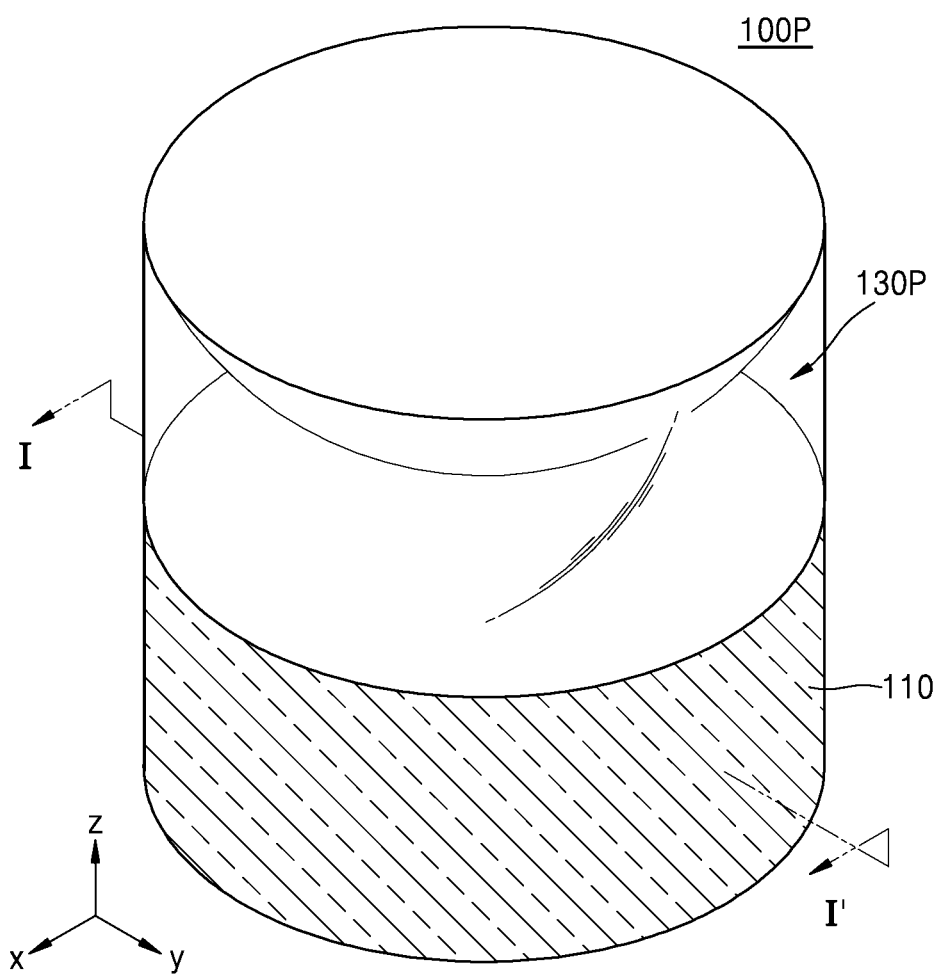
FIG. 25 is a perspective view of a light-emitting device according to an embodiment.
Figure 26:
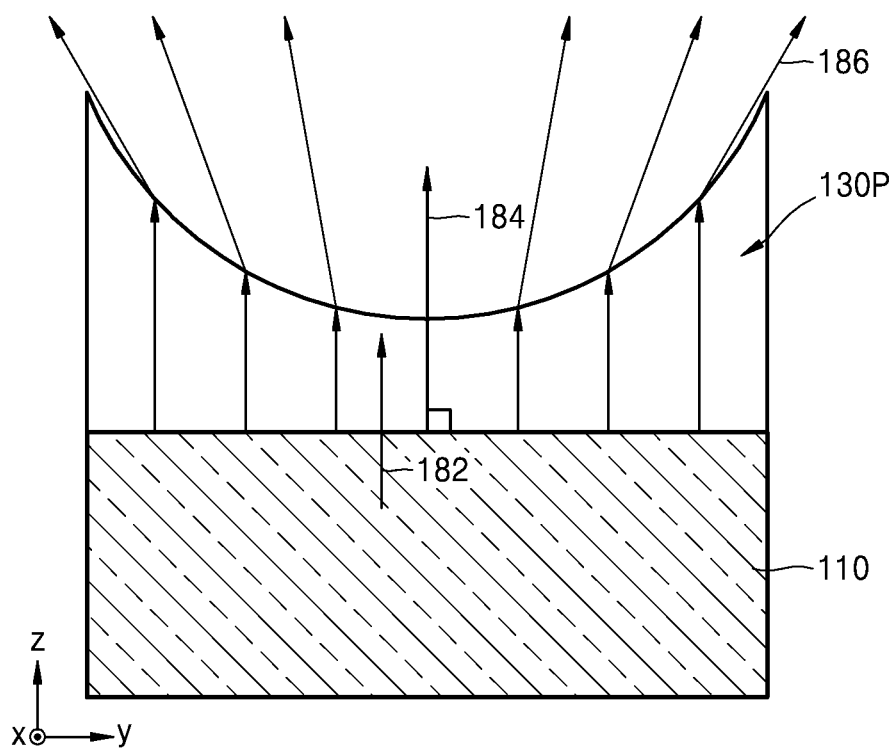
FIG. 26 is a cross-sectional view taken along a line I-I' of FIG. 25, which illustrates a light-emitting device according to an embodiment.

FIG. 25 is a perspective view of a light-emitting device 100P according to an example embodiment. FIG. 26 is a cross-sectional view taken along a line I-I' of FIG. 25, which illustrates the device 100P according to the example embodiment.

Referring to FIGS. 25 and 26, the light-emitting device 100P according to the present example embodiment may include a light-emitting structure 110 and a lens 130P. The light-emitting structure 110 may include a stack structure of a first-conductivity-type semiconductor layer, an active layer, and a second-conductivity-type semiconductor layer, a first electrode electrically connected to the first-conductivity-type semiconductor layer, and a second electrode electrically connected to the second-conductivity-type semiconductor layer. The lens 130P may be located on the light-emitting structure. Although not shown in FIGS. 25 to 27, a growth substrate (refer to 120 in FIGS. 1 to 4) may be located between the lens 130P and the light-emitting structure 110, and a reflection plate (refer to 150 in FIGS. 1 to 4) may additionally be provided under the light-emitting structure 110.

The lens 130P may be configured such that at least some of paths 186 of light emitted by the light-emitting structure 110 are inclined with respect to a directional axis 182 about which the lens 130P is located on the light-emitting structure, and such that different paths 186 of the at least some of the paths 186 are directed far away from one another. In example embodiments directional axis 182 refers to an axis (i.e., a z-directional axis) that is substantially perpendicular to a surface of the light-emitting structure 110, which is in contact with the lens 130. That is, in example embodiments light emitting device 100 provides omnidirectional, or, at least, multidirectional light, rather than light that is directed along, or parallel to, directional axis 182 that is substantially perpendicular to a surface of the light emitting structure 110.

Alternatively, the lens 130P may be configured such that at least some of the paths 186 of light emitted by the light-emitting structure 110 are inclined with respect to a normal line 184 to a surface of the light-emitting structure 110 that is closest to the lens 130P, and different paths 186 of the at least some of the paths 186 are directed far away from one another in a direction. Lens 130P may be a concave lens having one flat surface, for example.

Figure 27:
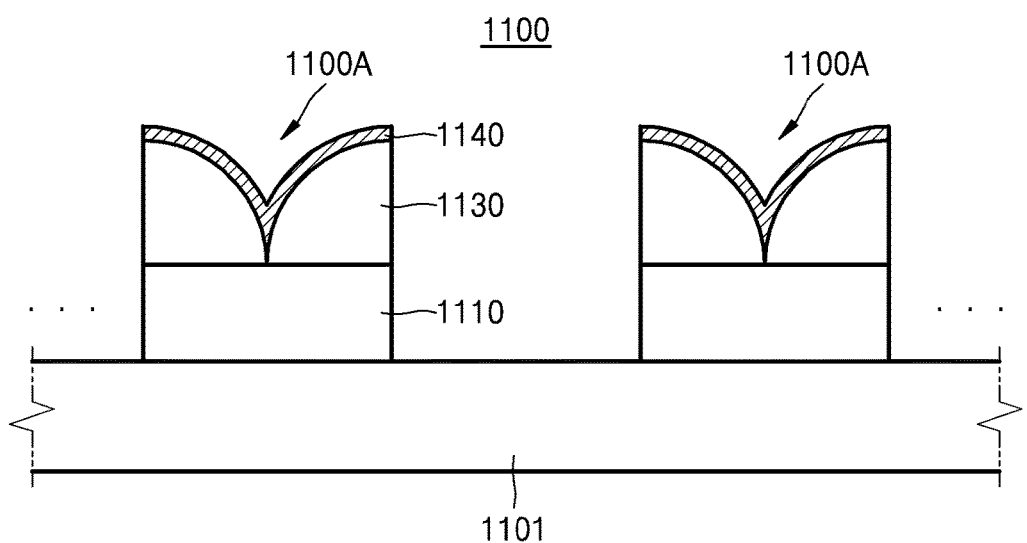
FIGS. 27 and 28 are schematic cross-sectional views of white light source modules including light-emitting devices according to embodiments.
Figure 28:
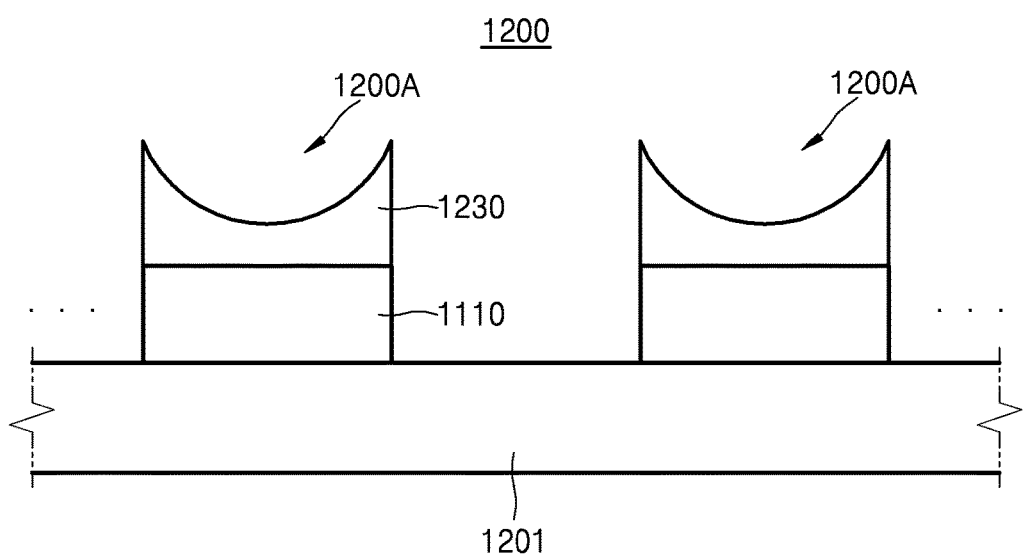

FIGS. 27 and 28 are schematic cross-sectional views of white light source modules 1100 and 1200 including light-emitting devices according to example embodiments.

Referring to FIG. 27, the light source module 1100 for an LCD backlight (BL) may include a circuit substrate 1101 and a plurality of white light-emitting devices 1100A arranged on the circuit substrate 1101. A conductive pattern may be formed on a top surface of the circuit substrate 1101 and connected to the white light-emitting device 1100A.

Each of the white light-emitting devices 1100A may include a light-emitting structure 1110 configured to emit blue light, and the light-emitting structure 1110 may be directly mounted on the circuit substrate 1101 in a chip-on-board (COB) manner. Each of the white light-emitting devices 1100A may be one of the light-emitting devices 100A to 110O according to the above-described embodiments.

Although not shown, the white light-emitting device 1100A may additionally include a light conversion layer as described with reference to FIGS. 23 and 24. A wide beam angle according to an embodiment may contribute toward reducing a thickness or a width of an LCD and also improve radiation characteristics.

Referring to FIG. 28, a light source module 1200 for an LCD backlight may include a circuit substrate 1201 and a plurality of white light-emitting devices 1200A arranged on the circuit substrate 1201. A conductive pattern may be formed on a top surface of the circuit substrate 1101 and connected to the white light-emitting device 1200A.

Each of the white light-emitting devices 1200A may include a light-emitting structure 1110 configured to emit blue light, and the light-emitting structure 1110 may be directly mounted on the circuit substrate 1101 in a COB manner. Each of the white light-emitting devices 1200A may be the light-emitting device 110P according to the above-described example embodiment.

Although not shown, the white light-emitting device 1100A may additionally include a light conversion layer as described with reference to FIGS. 23 and 24. A wide beam angle according to an example embodiment may contribute toward reducing a thickness or a width of an LCD and also improve radiation characteristics.

Phosphors and/or QDs and wavelength conversion materials will be described in detail later.

Figure 29:
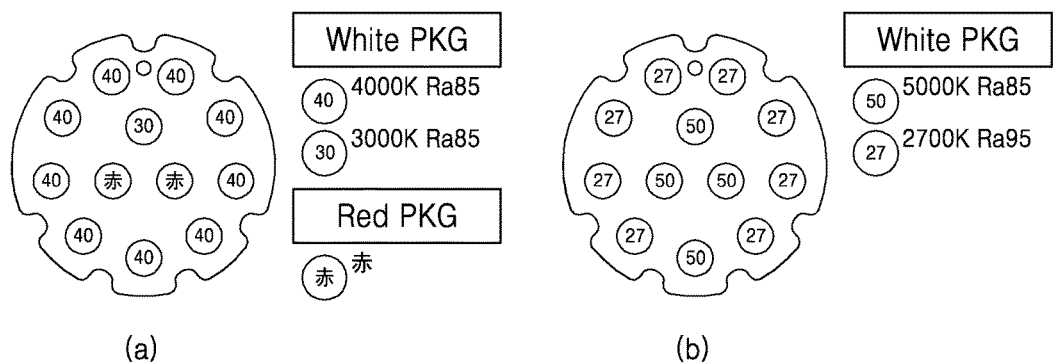
FIG. 29 is a schematic cross-sectional view of a white light source module including a light-emitting device manufactured by using a method of manufacturing a light-emitting device according to an embodiment, wherein the white light source module may be applied to a lighting apparatus.
Figure 30:
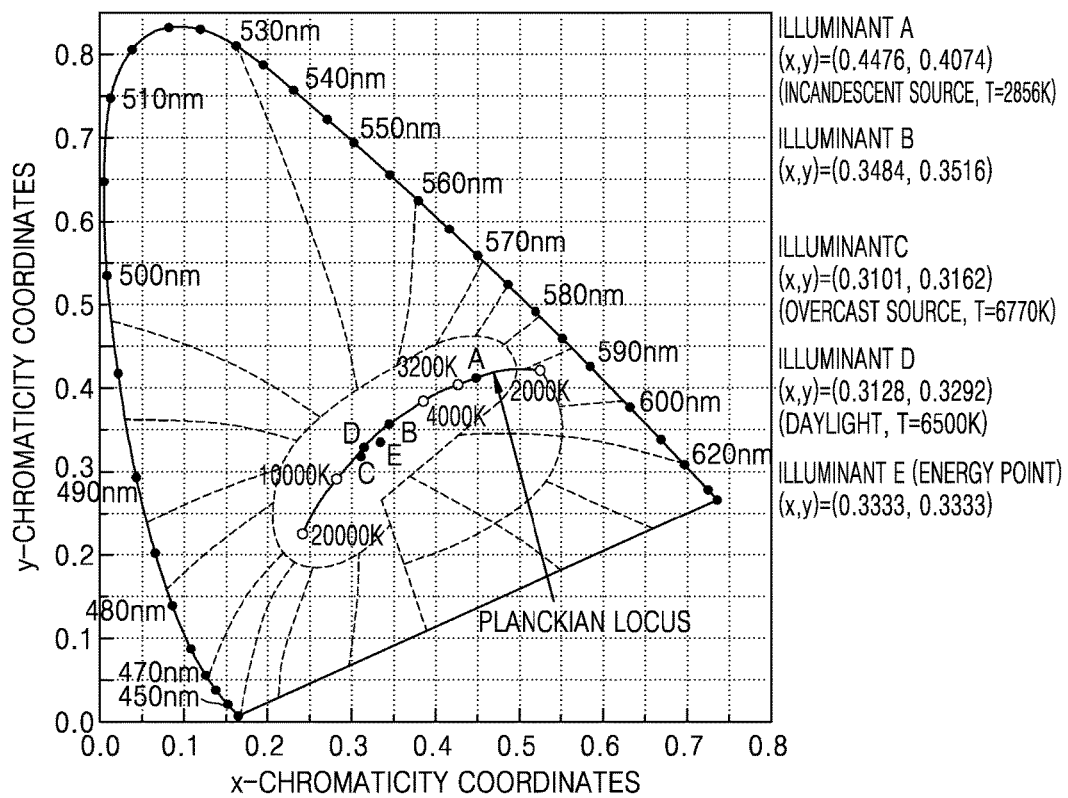
FIG. 30 is an international commission on illumination (CIE) chromaticity diagram of a complete radiator spectrum that may be used for a light-emitting device manufactured by using a method of manufacturing a light-emitting device according to an embodiment.

FIG. 29 is a schematic cross-sectional view of a white light source module including a light-emitting device according to an example embodiment, wherein the white light source module may be applied to a lighting apparatus. FIG. 30 is an international commission on illumination (CIE) chromaticity diagram of a complete radiator spectrum that may be used for a light-emitting device according to an example embodiment.

In example embodiments, each of light source modules shown in (a) and (b) of FIG. 29 may include a plurality of light-emitting device packages 30, 40, red, 27, and 50 mounted on a circuit substrate. Each of the light-emitting device packages 30, 40, red, 27, and 50 may be one of the light-emitting devices 100 to 100P according to the above-described example embodiments. A plurality of light-emitting device packages mounted on one light source module may include homogenous packages configured to emit light having the same wavelength or include heterogeneous packages configured to emit light having different wavelengths as in the present example embodiment.

Referring to (a) of FIG. 29, a white light source module may be created by combining white light-emitting device packages 40 and 30 having a color temperature of about 4,000 K and about 3,000 K with a red light-emitting device package. The white light source module may adjust a color temperature in the range of about 3,000 K to about 4,000 K and provide white light having a CRI Ra of from about 85 to about 100.

In another example embodiment, a white light source module may include only white light-emitting device packages, and some of the white light-emitting device packages may be configured to emit white light having different color temperatures. For example, referring to (a) of FIG. 29, a white light source module may be created by combining a white light-emitting device package 27 having a color temperature of about 2,700 K with a white light-emitting device package 50 having a color temperature of about 5,000 K. The white light source module may adjust a color temperature in the range of from about 2,700 K to about 5,000 K and provide white light having a CRI Ra of from about 85 to about 99. The number of light-emitting device packages for each color temperature may be changed according to a basic color temperature setting value. For example, in an example lighting apparatus, of which a basic color temperature setting value is around a color temperature of about 4,000 K, the number of packages corresponding to the color temperature of about 4,000 K may be larger than the number of packages corresponding to a color temperature of about 3,000 K or the number of red light-emitting device packages.

In example embodiments, a heterogeneous light-emitting device package may include a blue light-emitting device, a white light-emitting device manufactured by combining yellow, green, red, or orange phosphors, and at least one of violet, blue, green, red, or infrared (IR) light-emitting devices so as to control a color temperature and a color rendering index (CRI) of white light.

In a single light-emitting device package, light in a desired color may be determined according to the wavelength of a light emitting device, such as a light-emitting diode (LED) chip, the kinds of phosphors, and a combination ratio of the phosphors. When white light is determined, a color temperature and a CRI may be controlled.

For example, when an LED chip emits blue light, a light-emitting device package including at least one of yellow, green, and red phosphors may be configured to emit white light having various color temperatures according to a combination ratio of the phosphors. Alternatively, a light-emitting device package in which a green or red phosphor is applied to the blue LED chip may be configured to emit green or red light. The light-emitting device package configured to emit white light may be combined with the light-emitting device package configured to emit green or red light so as to control a color temperature and CRI of white light. Additionally, a light-emitting device package may include at least one of light-emitting devices configured to emit violet, blue, green, red, or IR light.

A CRI of the lighting apparatus may be controlled to be within the range of from 40 (e.g., a sodium (Na) lamp) to 100 (e.g., solar light) and emit various types of white light having a color temperature ranging from 1500 K to 20000 K. In example embodiments, color of illumination light may be adjusted to an ambient atmosphere or mood by generating visible light (e.g., purple light, blue light, green light, red light, and orange light) or infrared (IR) light. Additionally, in example embodiments the light-emitting device may generate light having a special wavelength to stimulate plant growth.

White light generated by a combination of a blue light-emitting device with yellow, green, red phosphor and/or green and red light-emitting devices may have at least two peak wavelengths. As shown in FIG. 30, coordinates (x, y) of the white light in a CIE 1931 coordinate system may be located in a segment region connecting (0.4476, 0.4074), (0.3484, 0.3516), (0.3101, 0.3162), (0.3128, 0.3292), and (0.3333, 0.3333) or located in a region surrounded with the segment and a blackbody radiator spectrum. A color temperature of the white light may be between 1500 K and 20000 K. In FIG. 30, since the white light around point E (0.3333, 0.3333) disposed under the black-body radiator spectrum (Planckian locus) is relatively weak in the light of the yellow-based component, it may be used as an illumination light source in a region in which a user may have a more vivid or fresh feeling than naked eyes. Therefore, an illumination product using the white light around point E (0.3333, 0.3333) disposed under the black-body radiator spectrum (Planckian locus) may be suitable as lighting for shopping malls that sell groceries and clothes, for example.

Various materials, such as phosphors and/or quantum dots (QDs), may be used as materials capable of converting the wavelength of light emitted by a light-emitting device.

The phosphor may have the following empirical formulas and colors:

Oxide-based: yellow and green color $Y_3Al_5O_{12}:Ce$, $Tb_3Al_5O_{12}:Ce$, $Lu_3Al_5O_{12}:Ce$ Silicate-based: yellow and green color $(Ba,Sr)_2SiO_4:Eu$, yellow color and orange color $(Ba,Sr)_3SiO_5:Ce$ Nitride-based: green color $\beta$-SiAlON:Eu, yellow color $La_3Si_6O_{11}:Ce$, orange color $\alpha$-SiAlON:Eu, red color $CaAlSiN_3:Eu$, $Sr_2Si_5N_8:Eu$, $SrSiAl_4N_7:Eu$, $SrLiAl_3N_4:Eu$, $$Ln_{4-x}(Eu_zM_{1-z})_xSi_{12-y}Al_yO_{3+x+y}N_{18-x-y}\ (0.5 \leq x \leq 3, 0 < z < 0.3, 0 < y \leq 4) \quad \text{Formula (1)}$$

In the first formula, Ln may be at least one element selected from the group consisting of Group Ma elements and rare-earth elements, and M may be at least one element selected from the group consisting of calcium (Ca), barium (Ba), strontium (Sr), and magnesium (Mg).

Fluoride-based: KSF-based red color $K_2SiF_6:Mn^{4+}$, $K_2TiF_6:Mn^{4+}$, $NaYF_4:Mn^{4+}$, $NaGdF_4:Mn_4^+$, $K_3SiF_7:Mn^{4+}$ The composition of the phosphor basically conforms with stoichiometry, and the respective elements may be substituted by other elements included in the respective groups of the periodic table. For example, strontium (Sr) may be substituted by at least one selected from the group consisting of barium (Ba), calcium (Ca), and magnesium (Mg) of alkaline-earth group II, and Y may be substituted by at least one selected from the group terbium (Tb), lutetium (Lu), scandium (Sc), and gadolinium (Gd) of the lanthanum group. In addition, europium (Eu), which is an activator, may be substituted by at least one selected from the group consisting of cerium (Ce), terbium (Tb), praseodymium (Pr), erbium (Er), and ytterbium (Yb) according to a desired energy level. The activator may be applied solely or a sub-activator may be additionally applied for characteristic modification.

In example embodiments, a fluoride-based red phosphor may be coated with a Manganese-free fluoride to improve reliability at a high temperature and a high humidity. Alternatively, the surface of the fluoride-based red phosphor or the surface of the manganese-free fluoride coating layer may additionally be coated with an organic material. Unlike other phosphors, the fluoride-based red phosphor may embody a narrow full width at half-maximum (FWHM) of about 40 nm or less and be applied to a high-resolution TV, such as an ultrahigh-definition (UHD) TV.

The following Table 1 shows types of phosphors in respective fields to which a white light-emitting device using a blue LED chip (about 440 nm to about 460 nm) or a UV LED chip (about 119 nm to about 440 nm) is applied.

TABLE 1

| Purpose | Phosphor |
|---|---|
| LED TV BLU | $\beta$-SiAlON:Eu$^{2+}$ |
| | (Ca, Sr)AlSiN$_3$:Eu$^{2+}$ |
| | La$_3$Si$_6$O$_{11}$:Ce$^{3+}$ |
| | K$_2$SiF$_6$:Mn$^{4+}$ |
| | K$_2$TiF$_6$:Mn$^{4+}$ |
| | NaYF$_4$:Mn$^{4+}$ |
| | NaGdF$_4$:Mn$^{4+}$ |
| | SrLiAl$_3$N$_4$:Eu |
| | Ln$_{4-x}$(Eu$_z$M$_{1-z}$)$_x$Si$_{12-y}$Al$_y$O$_{3+x+y}$N$_{18-x-y}$ |
| | ($0.5 \leq x \leq 3, 0 < z < 0.3, 0 < y \leq 4$) (1) |
| Illumination | Lu$_3$Al$_5$O$_{12}$:Ce$^{3+}$ |
| | Ca-$\alpha$-SiAlON:Eu$^{2+}$ |
| | La$_3$Si$_6$N$_{11}$:Ce$^{3+}$ |
| | (Ca, Sr)AlSiN$_3$:Eu$^{2+}$ |
| | Y$_3$Al$_5$O$_{12}$:Ce$^{3+}$ |
| | K$_2$SiF$_6$:Mn$^{4+}$ |
| | K$_2$TiF$_6$:Mn$^{4+}$ |
| | NaYF$_4$:Mn$^{4+}$ |
| | NaGdF$_4$:Mn$^{4+}$ |
| | SrLiAl$_3$N$_4$:Eu |
| | Ln$_{4-x}$(Eu$_z$M$_{1-z}$)$_x$Si$_{12-y}$Al$_y$O$_{3+x+y}$N$_{18-x-y}$ |
| | ($0.5 \leq x \leq 3, 0 < z < 0.3, 0 < y \leq 4$) (1) |
| Side view (Mobile, Note PC) | Lu$_3$Al$_5$O$_{12}$:Ce$^{3+}$ |
| | Ca-$\alpha$-SiAlON:Eu$^{2+}$ |
| | La$_3$Si$_6$N$_{11}$:Ce$^{3+}$ |
| | (Ca, Sr)AlSiN$_3$:Eu$^{2+}$ |
| | Y$_3$Al$_5$O$_{12}$:Ce$^{3+}$ |
| | (Sr, Ba, Ca, Mg)$_2$SiO$_4$:Eu$^{2+}$ |
| | K$_2$SiF$_6$:Mn$^{4+}$ |
| | K$_2$TiF$_6$:Mn$^{4+}$ |
| | NaYF$_4$:Mn$^{4+}$ |
| | NaGdF$_4$:Mn$^{4+}$ |
| | SrLiAl$_3$N$_4$:Eu |
| | Ln$_{4-x}$(Eu$_z$M$_{1-z}$)$_x$Si$_{12-y}$Al$_y$O$_{3+x+y}$N$_{18-x-y}$ |
| | ($0.5 \leq x \leq 3, 0 < z < 0.3, 0 < y \leq 4$) (1) |
| Interior (Head Lamp, etc) | Lu$_3$Al$_5$O$_{12}$:Ce$^{3+}$ |
| | Ca-$\alpha$-SiAlON:Eu$^{2+}$ |
| | La$_3$Si$_6$N$_{11}$:Ce$^{3+}$ |
| | (Ca, Sr)AlSiN$_3$:Eu$^{2+}$ |
| | Y$_3$Al$_5$O$_{12}$:Ce$^{3+}$ |
| | K$_2$SiF$_6$:Mn$^{4+}$ |
| | K$_2$TiF$_6$:Mn$^{4+}$ |
| | NaYF$_4$:Mn$^{4+}$ |
| | NaGdF$_4$:Mn$^{4+}$ |
| | SrLiAl$_3$N$_4$:Eu |
| | Ln$_{4-x}$(Eu$_z$M$_{1-z}$)$_x$Si$_{12-y}$Al$_y$O$_{3+x+y}$N$_{18-x-y}$ |
| | ($0.5 \leq x \leq 3, 0 < z < 0.3, 0 < y \leq 4$) (1) |

In addition, wavelength conversion materials, such as quantum dots (QDs), may be used for a wavelength conversion unit as materials capable of replacing phosphors or in combination with the phosphors.

Figure 31:
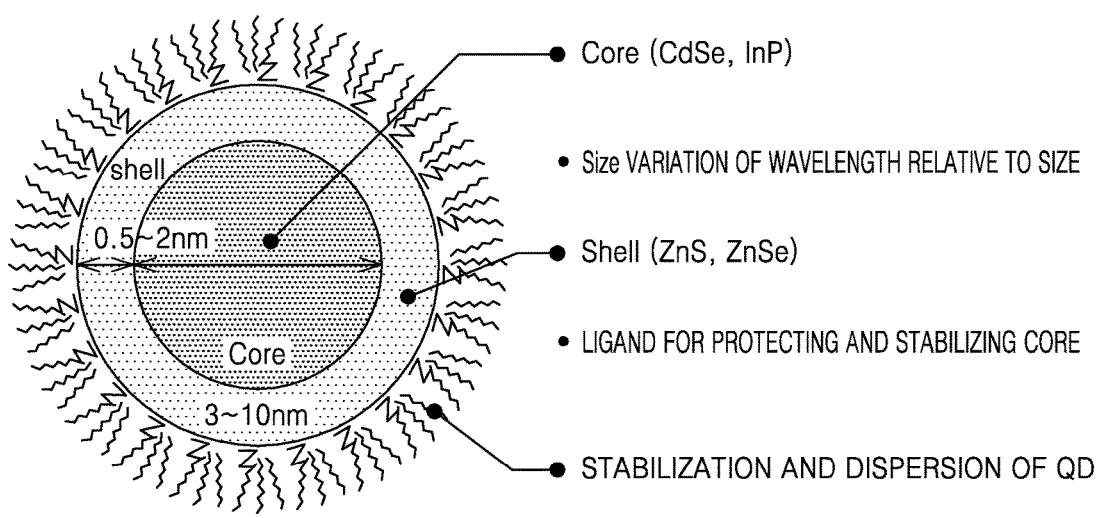
FIG. 31 is a schematic diagram showing a sectional structure of a QD serving as a wavelength conversion material that may be used for a light-emitting device manufactured by using a method of manufacturing a light-emitting device according to an embodiment.

FIG. 31 is a schematic diagram showing a sectional structure of a QD that may be used as a wavelength conversion material for a light-emitting device according to an embodiment.

In example embodiments, a QD may have a core-shell structure using a Group III-V compound semiconductor or a Group II-VI compound semiconductor. For example, the QD may include a core, such as CdSe or InP, and a shell, such as ZnS and ZnSe. Additionally, the QD may include a ligand for stabilizing the core and the shell. For example, the core may have a diameter of from about 1 nm to about 30 nm, and more particularly, from about 3 nm to about 10 nm. The shell may have a thickness of from about 0.1 nm to about 20 nm, and more particularly, from about 0.5 nm to about 2 nm.

The QD may be embodied in various colors according to size. In example embodiments, when the QD is used as a material capable of replacing phosphors, the QD may be used as a red phosphor or a green phosphor. When a QD is used, a narrow full-width-half-maximum (FWHM) of, for example, about 35 nm may be embodied.

The wavelength conversion material may be contained in an encapsulant. Alternatively, the wavelength conversion material may be previously formed as a film type and bonded to a surface of an optical structure, such as an LED chip or a light guide plate (LGP). In such example embodiments, the wavelength conversion material may have a uniform structure and may be easily applied to a desired region.

Figure 32:
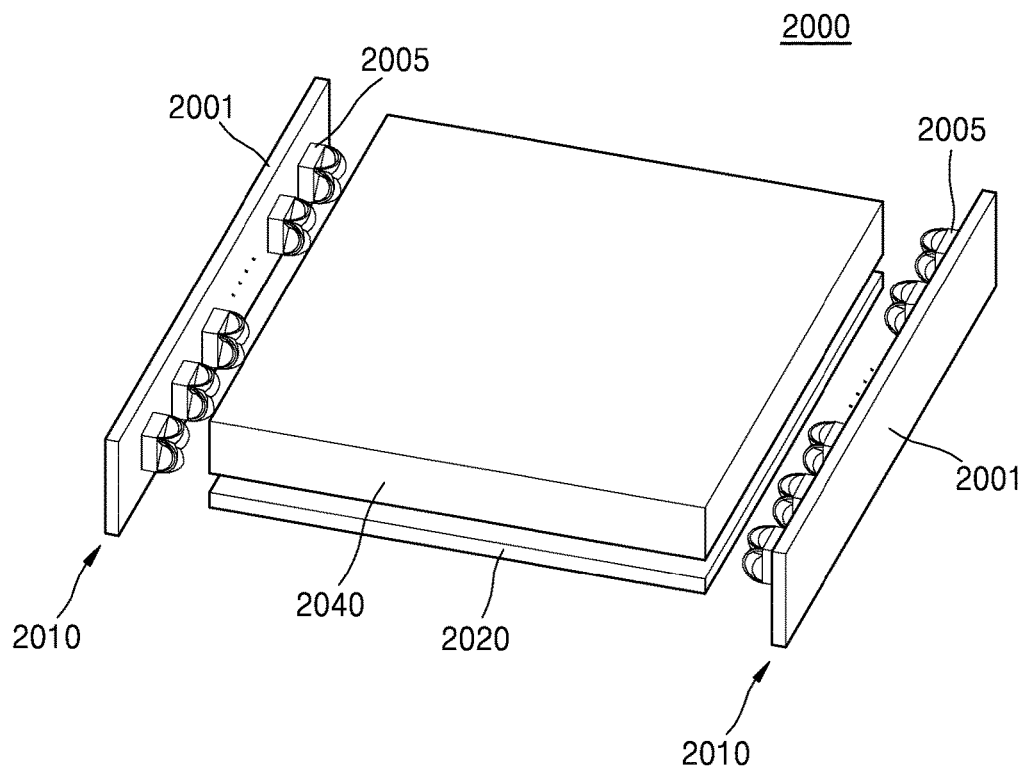
FIG. 32 is a schematic perspective view of a backlight unit (BLU) including a light-emitting device according to an embodiment.

FIG. 32 is a schematic perspective view of a backlight unit (BLU) 2000 including a light-emitting device according to an example embodiment.

The BLU 2000 may include an LGP 2040 and light source modules 2010 provided on two side surfaces of the LGP 2040. Additionally, the BLU 2000 may further include a reflection plate 2020 located under the LGP 2040. In the present example embodiment, the BLU 2000 may be an edge-type BLU. In some example embodiments, the light source module 2010 may be provided on only one side surface of the LGP 2040 or may additionally provided on another side surface of the LGP 2040. The light source module 2010 may include a printed circuit board (PCB) 2001 and a plurality of light sources 2005 mounted on a top surface of the PCB 2001. The light source 2005 may be one of the light-emitting devices 100 to 100P according to the above-described example embodiments.

Figure 33:
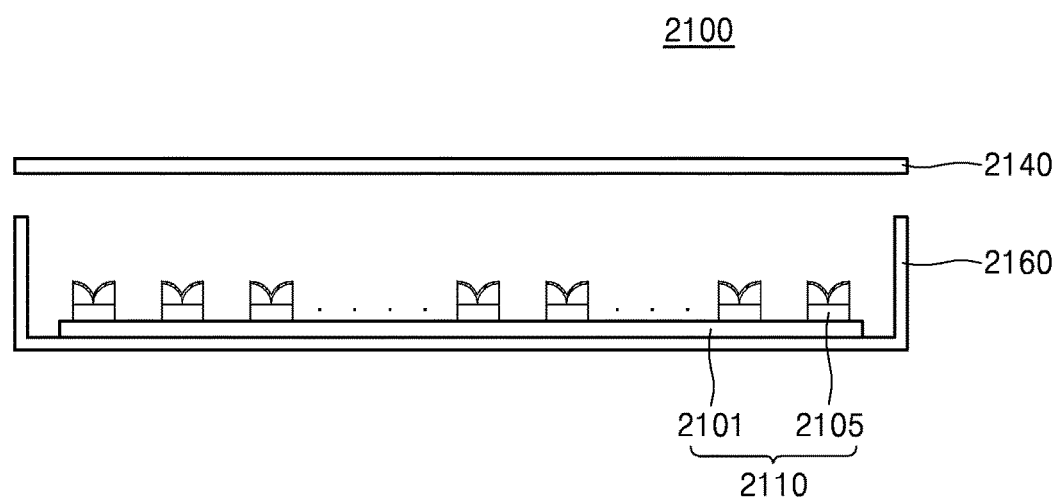
FIG. 33 is a diagram of a direct-light-type BLU including a light-emitting device according to an embodiment.

FIG. 33 is a diagram of a direct-light-type BLU 2100 including a light-emitting device according to an example embodiment.

The BLU 2100 may include an optical diffusion plate 2140 and a light source module 2110 arranged under the optical diffusion plate 2140. Additionally, the BLU 2100 may include a bottom case 2160, which may be located under the optical diffusion plate 2140 and contain the light source module 2110. In the present example embodiment, the BLU 2100 may be a direct-light-type BLU.

The light source module 2110 may include a PCB 2101 and a plurality of light sources 2105 mounted on a top surface of the PCB 2101. The light source 2105 may be one of the light-emitting devices 100 to 100P according to the above-described example embodiments.

Figure 34:
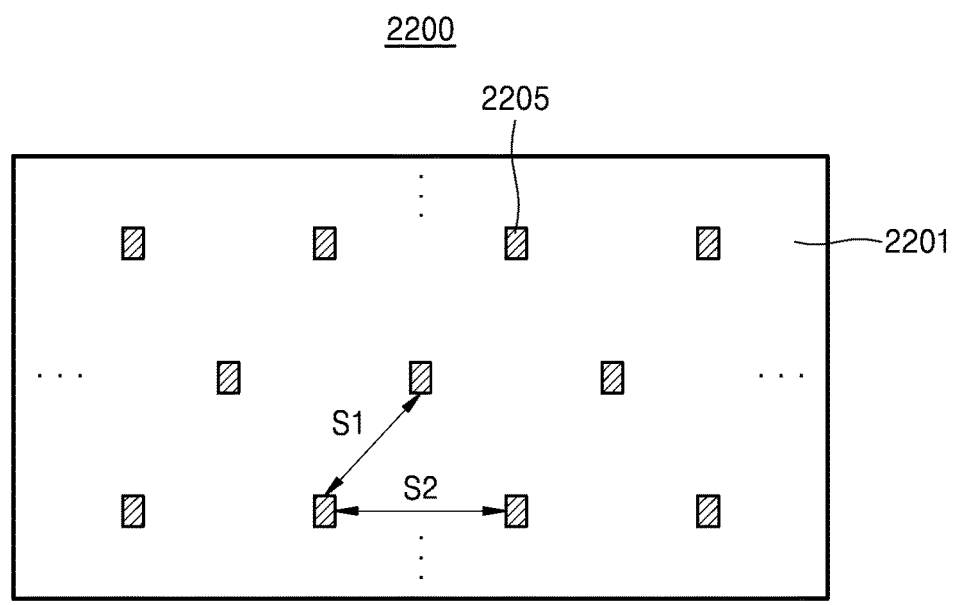
FIG. 34 is a diagram of a BLU including a light-emitting device according to an embodiment.

FIG. 34 is a diagram of a BLU including a light-emitting device according to an example embodiment.

In particular, FIG. 34 illustrates an example in which a light source 2205 is located in a direct-light-type BLU 2200.

The light source 2205 may be one of the light-emitting devices 100 to 100P according to the above-described example embodiments.

The direct-light-type BLU 2200 according to the present example embodiment may include a plurality of light sources 2205 arranged on a substrate 2201. The light sources 2205 may be arranged as a matrix in rows and columns, which may be arranged to be zigzag, for example. A second matrix, in which a plurality of light sources 2205 disposed in straight lines are arranged in rows and columns, may be arranged within a first matrix having the same shape as the second matrix. As a result, each of light sources 2205 included in the second matrix is located within a quadrangle formed by four adjacent light sources 2205 included in the first matrix.

In order to improve luminance uniformity and optical efficiency of the direct-light-type BLU, the first and second matrices may have different arrangement structures and intervals. Also, in addition to a method of arranging a plurality of light sources, distances S1 and S2 between adjacent light sources may be optimized to ensure luminance uniformity. Because, in example embodiments, row and columns including the light sources 2205 are arranged not in straight lines but to be zigzag, the number of light sources 2205 may be reduced by as much as about 15% to 25% for the same emission area.

Figure 35:
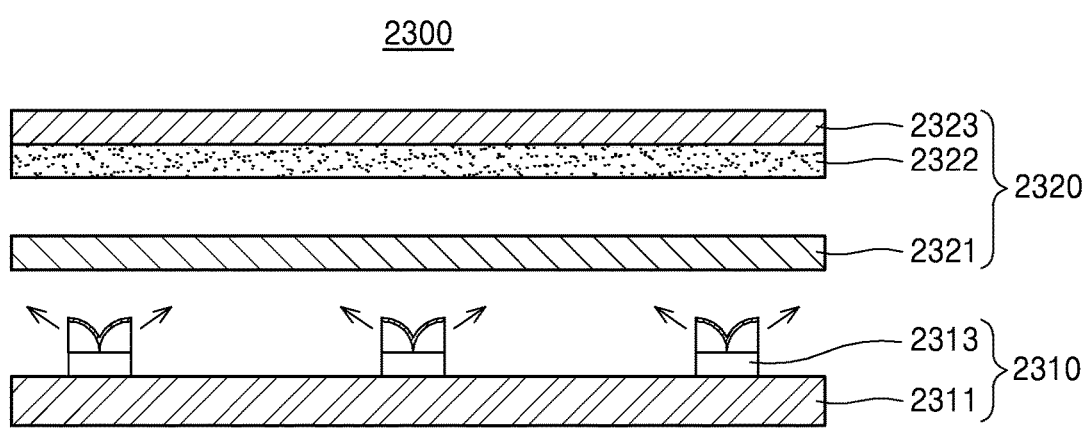
FIG. 35 is a diagram of a direct-light-type BLU including a light-emitting device according to an embodiment.

FIG. 35 is a diagram of a direct-light-type BLU 2300 including a light-emitting device according to an example embodiment.

In particular, the BLU 2300 according to the present embodiment may include an optical sheet 2320 and a light source module 2310 arranged under the optical sheet 2320. The optical sheet 2320 may include a diffuser sheet 2321, a condenser sheet 2322, and a protection sheet 2323.

The light source module 2310 may include a circuit substrate 2311, a plurality of light sources 2312 mounted on the circuit substrate 2311, and a plurality of optical devices 2313 located on the plurality of light sources 2312, respectively. The light source 2312 may be one of the light-emitting devices 100 to 100P according to the above-described embodiments.

Each of the optical devices 2313 may control a beam angle of emitted light by refraction. In particular, an optical beam angle lens configured to diffuse light emitted by the light source 2312 toward a wide region may be used as each of the optical devices 2313. Because, in example embodiments, the light source 2312 to which the optical device 2313 is adhered exhibits a wide light distribution, when the light source module 2310 is used for a backlight unit (BLU) or a flat-panel lighting apparatus, the number of the light sources 2312 for the same area may be reduced, compared to other configurations.

Figure 36:
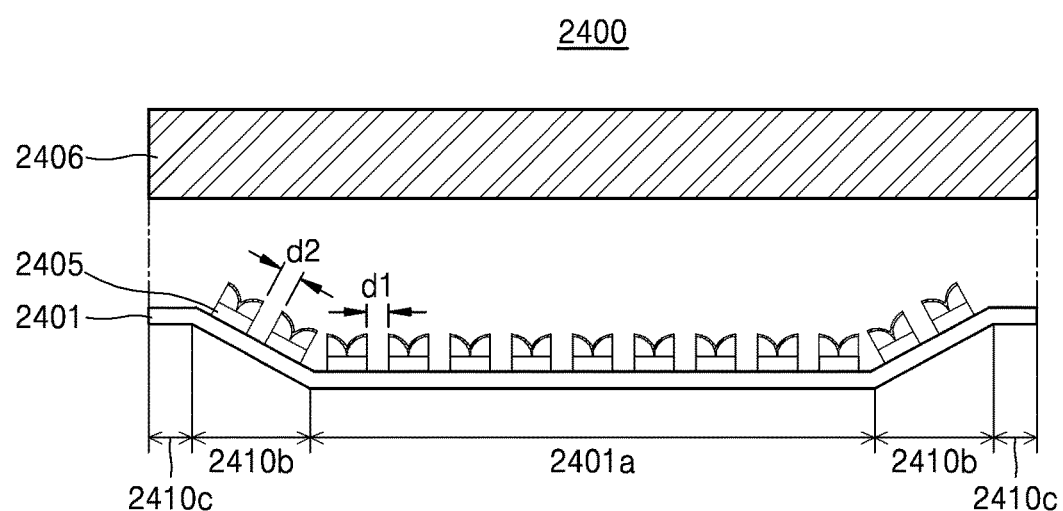
FIG. 36 is a diagram of a direct-light-type BLU including a light-emitting device according to an embodiment.

FIG. 36 is a diagram of a direct-light-type BLU 2400 including a light-emitting device according to an example embodiment.

In example embodiments, the BLU 2400 may include a light source 2405 mounted on a circuit substrate 2401 and at least one optical sheet 2406 located on the light source 2405. The light source 2405 may be a white light-emitting device containing red phosphor. The light source 2405 may be a module mounted on the circuit substrate 2401. The light source 2405 may be one of the light-emitting devices 100 to 100P according to the above-described example embodiments.

The circuit substrate 2401 according to the present example embodiment may include a first plane portion 2401a corresponding to a main region, an inclined portion 2401b located around the first plane portion 2401a and a second plane portion 2401c located at a corner of the circuit substrate 2401 outside the inclined portion 2401b. In example embodiments, at least a portion of the inclined portion 2401b may be bent. The light sources 2405 may be arranged at intervals of a first distance d1 on the first plane portion 2401a. At least one light source 2405 may be arranged at intervals of a second distance d2 on the inclined portion 2401b. The first distance d1 may be equal to the second distance d2. A width (or length in a sectional view) of the inclined portion 2401b may be less than the width of the first plane portion 2401a or greater than the width of the second plane portion 2401c. Additionally, at least one light source 2405 may be arranged on the second plane portion 2401c in example embodiments.

The inclination of the inclined portion 2401b with respect to the first plane portion 2401a may be appropriately controlled within a range of between about 0° to about 90°. The circuit substrate 2401 may adopt the above-described structure and maintain uniform brightness around the edge of the optical sheet 2406.

Figure 37:
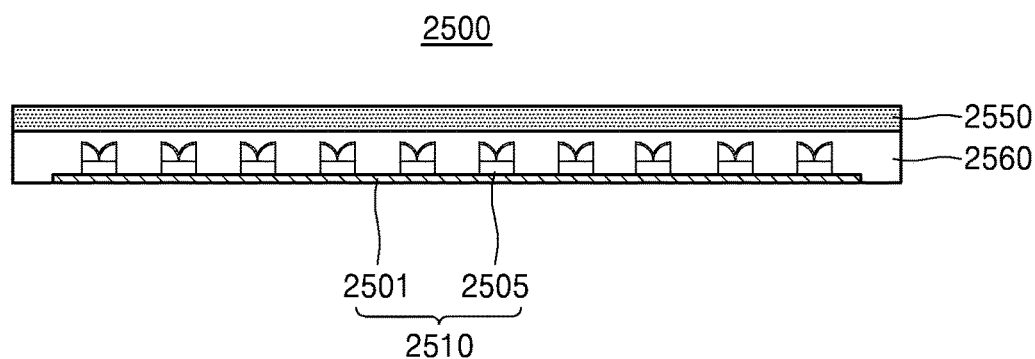
FIGS. 37 to 39 are diagrams of BLUs including light-emitting devices according to an embodiment.
Figure 38:
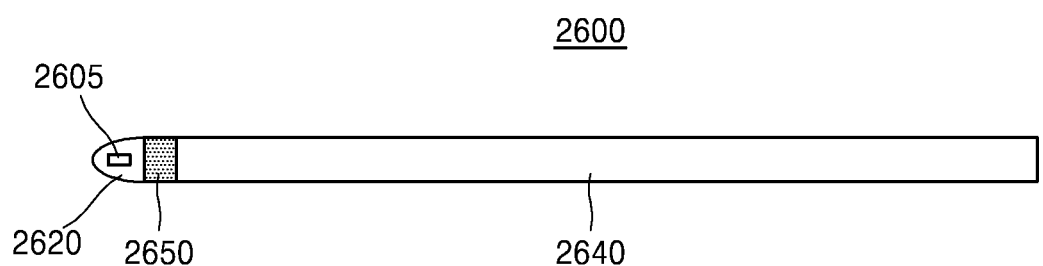
Figure 39:
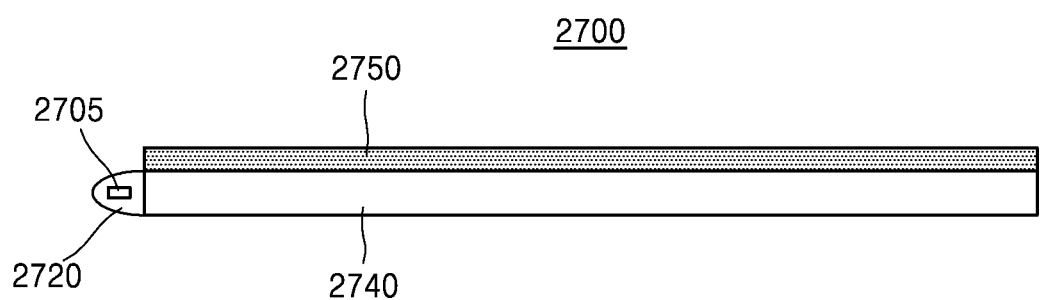

FIGS. 37 to 39 are diagrams of BLUs 2500, 2600, and 2700 including light-emitting devices according to an example embodiment.

In example embodiments, wavelength conversion units 2550, 2650, and 2750 may not be located in light sources 2505, 2605, and 2705 but in the BLUs 2500, 2600, and 2700 outside the light sources 2505, 2605, and 2705 so that the BLUs 2500, 2600, and 2700 may convert light. Each of the light sources 2505, 2605, and 2705 may be one of the light-emitting devices 100 to 100P according to the above-described example embodiments.

The BLU 2500 of FIG. 37 may be a direct-light-type BLU and may include the wavelength conversion unit 2550, a light source module 2510 arranged under the wavelength conversion unit 2550, and a bottom case 2560 configured to contain the light source module 2510. Additionally, the light source module 2510 may include a PCB 2501 and a plurality of light sources 2505 mounted on a top surface of the PCB 2501.

In the BLU 2500, the wavelength conversion unit 2550 may be located on the bottom case 2560. Accordingly, the wavelength of at least part of light emitted by the light source module 2510 may be converted by the wavelength conversion unit 2550. The wavelength conversion unit 2550 may be manufactured and applied as an additional film or unified with an optical diffuser plate (not shown) and provided to the BLU 2500.

The BLUs 2600 and 2700 of FIGS. 38 and 39 may be edge-type BLUs and may include wavelength conversion units 2650 and 2750, LGPs 2640 and 2740, and reflection units 2620 and 2720 located on one sides of the LGPs 2640 and 2740, and light sources 2605 and 2705, respectively. Light emitted by the light sources 2605 and 2705 may be guided by the reflection units 2620 and 2720 into the LGPs 2640 and 2740, respectively. In the BLU 2600 of FIG. 38, the wavelength conversion unit 2650 may be located between the LGP 2640 and the light source 2605. In the BLU 2700 of FIG. 39, the wavelength conversion unit 2750 may be located on a light emission surface of the LGP 2740, for example.

The wavelength conversion units 2550, 2650, and 2750 may include typical phosphors. In particular, QD phosphors may be used to make up for characteristics of QDs that are vulnerable to heat or moisture applied by a light source.

Figure 40:
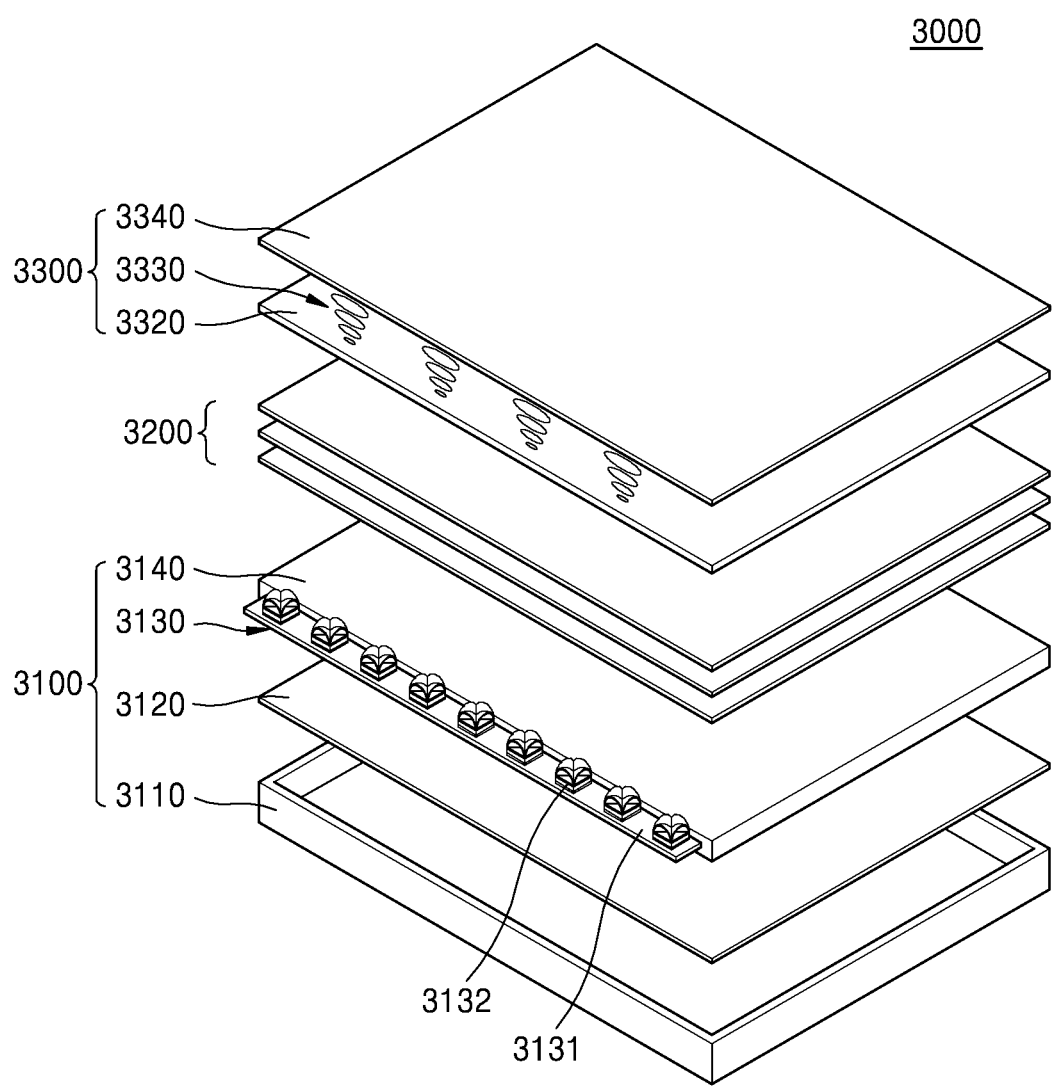
FIG. 40 is a schematic exploded perspective view of a display apparatus including a light-emitting device according to an embodiment.

FIG. 40 is a schematic exploded perspective view of a display apparatus 3000 including a light-emitting device according to an example embodiment.

In example embodiments, the display apparatus 3000 may include a BLU 3100, an optical sheet 3200, and an image display panel (e.g., a liquid crystal (LC) panel) 3300. The BLU 3100 may include a bottom case 3110, a reflection plate 3120, an LGP 3140, and a light source module 3130 provided on at least one side surface of the LGP 3140. The light source module 3130 may include a PCB 3131 and a light source 3132.

In particular, the light source 3132 may be a side-view-type light-emitting device mounted on a side surface of the LGP 3140 adjacent to a light emission surface. The light source 3132 may be one of the light-emitting devices 100 to 100P according to the above-described example embodiments. The optical sheet 3200 may be interposed between the LGP 3140 and the image display panel 3300 and may include several kinds of sheets, such as a diffuser sheet, a prism sheet, or a protection sheet, for example.

The image display panel 3300 may display an image using light emitted by the optical sheet 3200. The image display panel 3300 may include an array substrate 3320, an LC layer 3330, and a color filter substrate 3340. The array substrate 3320 may include pixel electrodes arranged in a matrix shape, thin-film transistors (TFTs) configured to apply a driving voltage to the pixel electrodes, and signal lines configured to operate the TFTs.

The color filter substrate 3340 may include a transparent substrate, a color filter, and a common electrode. The color filter may include filters configured to selectively transmit light having a specific wavelength from among white light emitted by the BLU 3100. The LC layer 3330 may be rearranged due to an electric field formed between the pixel electrode and the common electrode and control a light transmittance of light. The light of which the light transmittance is controlled may be transmitted through the color filter of the color filter substrate 3340 and display an image. The image display panel 3300 may further include a driver circuit unit configured to process an image signal.

Because the display apparatus 3000 according to the present example embodiment uses the light source 3132 configured to emit blue light, green light, and red light having relatively narrow FWHMs, after the emitted light is transmitted through the color filter substrate 3340, blue, green and red colors having high color purities may be embodied.

Figure 41:
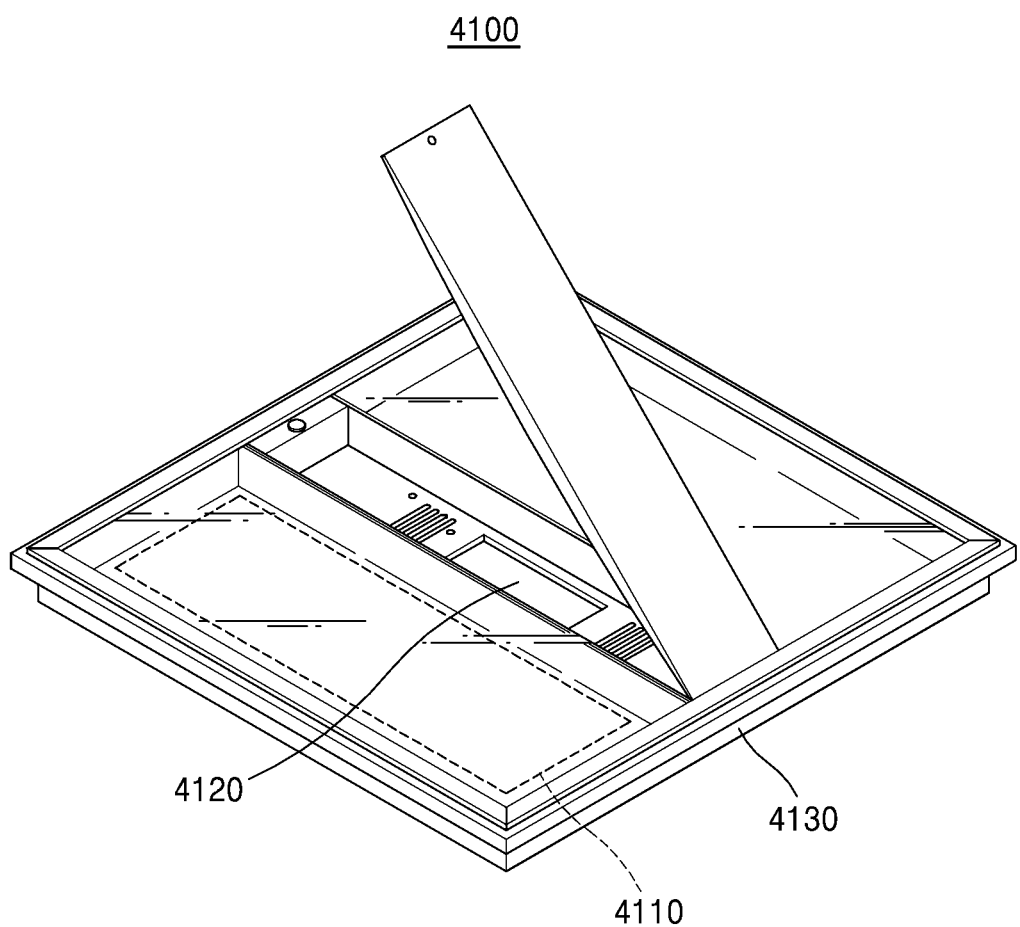
FIG. 41 is a schematic perspective view of a flat-panel lighting apparatus including a light-emitting device according to an embodiment.

FIG. 41 is a schematic perspective view of a flat-panel lighting apparatus 4100 including a light-emitting device according to an example embodiment.

In an example embodiment, the flat-panel lighting apparatus 4100 may include a light source module 4110, a power supply device 4120, and a housing 4030. The light source module 4110 may include a light-emitting device array serving as a light source. The light source module 4110 may include a light source that is one of the light-emitting devices 100 to 100P according to the above-described example embodiments. The power supply device 4120 may include a light-emitting device driver.

The light source module 4110 may include a light-emitting device array and may have a generally planar shape. The light-emitting device array may include a light-emitting device and a controller configured to store driving information of the light-emitting device.

The power supply device 4120 may be configured to supply power to the light source module 4110. The housing 4130 may form a space to contain the light source module 4110 and the power supply device 4120 and have a hexahedral shape having one open side surface, but inventive concepts are not limited thereto. The light source module 4110 may be located to emit light through the open side surface of the housing 4130.

Figure 42:
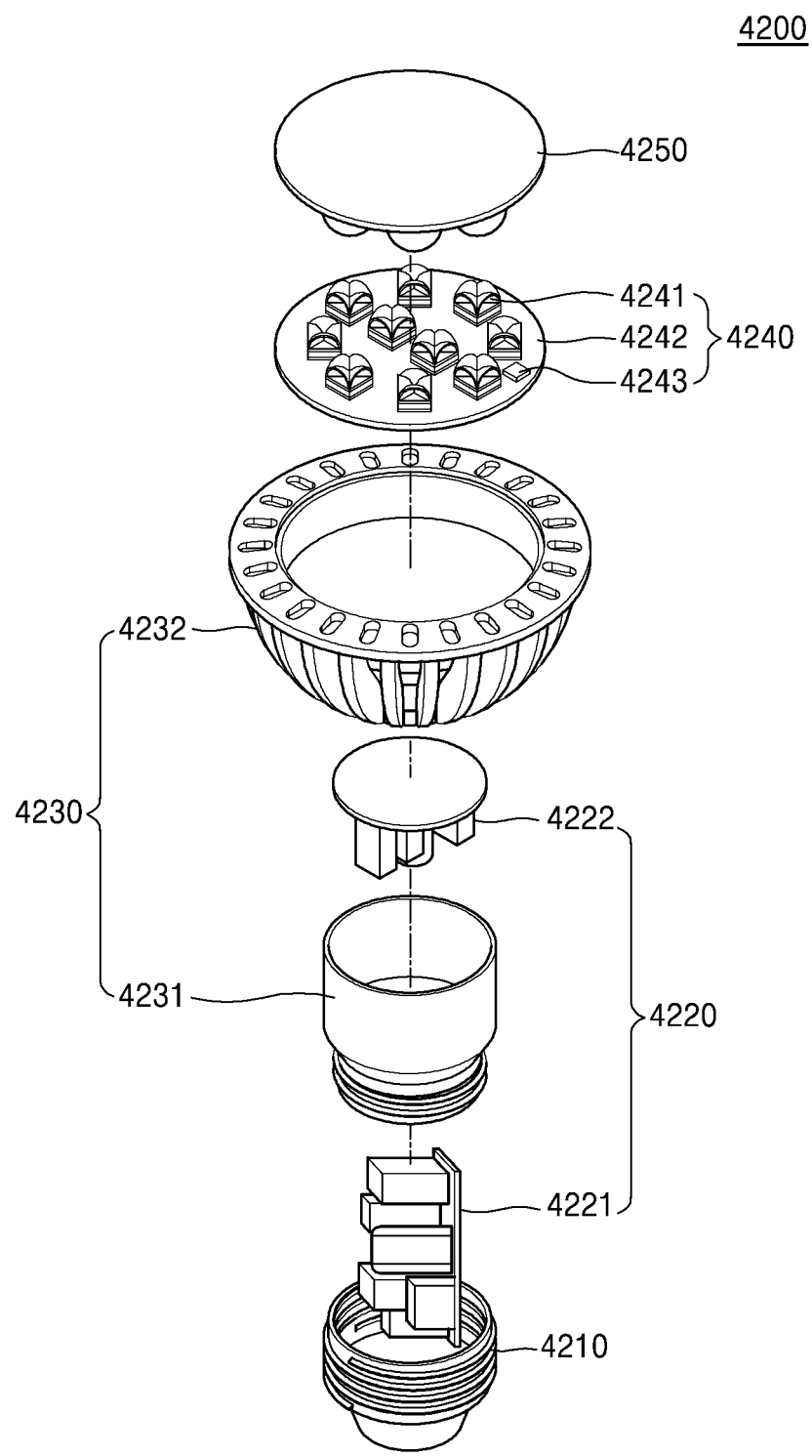
FIG. 42 is a schematic exploded perspective view of a lighting apparatus including a light-emitting device according to an embodiment.

FIG. 42 is a schematic exploded perspective view of a lighting apparatus 4200 including a light-emitting device according to an example embodiment.

In example embodiments, the lighting apparatus 4200 may include a socket 4210, a power source unit 4220, a radiation unit 4230, a light source module 4240, and an optical unit 4250. The light source module 4240 may include a light-emitting device array, and the power source unit 4220 may include a light-emitting device driver.

The socket 4210 may be configured to be capable of being replaced by a lighting apparatus of the related art (in example embodiments employing a screw-into-socket configuration, also referred to as an "Edison bulb," for example). Power supplied to the lighting apparatus 4200 may be applied through the socket 4210. As shown in FIG. 42, the power supply unit 4220 may be formed by assembling a first power supply unit 4221 and a second power supply unit 4222. The radiation unit 4230 may include an internal radiation unit 4231 and an external radiation unit 4232. The internal radiation unit 4231 may be directly connected to the light source module 4240 and/or the power source unit 4220 so that heat may be transmitted to the external radiation unit 4232. The optical unit 4250 may include an internal optical unit (not shown) and an external optical unit (not shown) and may be configured to uniformly disperse light emitted by the light source module 4240.

The light source module 4240 may receive power from the power source unit 4220 and emit light to the optical unit 4250. The light source module 4240 may include at least one light-emitting device package 4241, a circuit substrate 4242, and a controller 4243. The controller 4243 may store driving information regarding the light-emitting device package 4241. The light-emitting device package 4241 may include one of the light-emitting devices 100 to 100P according to the above-described example embodiments.

Figure 43:
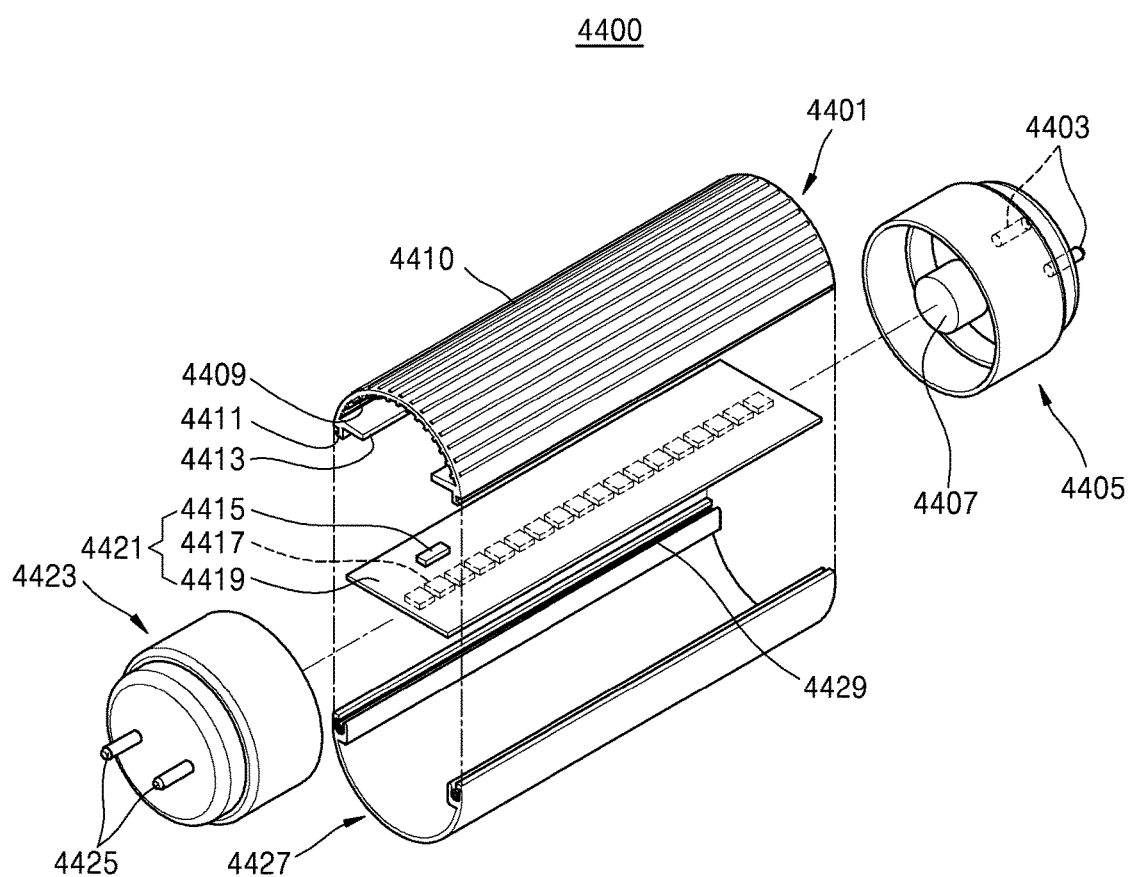
FIG. 43 is a schematic exploded perspective view of a bar-type lighting apparatus including a light-emitting device according to an embodiment.

FIG. 43 is a schematic exploded perspective view of a bar-type lighting apparatus 4400 including a light-emitting device according to an example embodiment.

In example embodiments, the lighting apparatus 4400 may include a radiation member 4401, a cover 4427, a light source module 4421, a first socket 4405, and a second socket 4423. A plurality of radiation pins (e.g., radiation pins 4409 and 4410) may be formed in the shape of rough portions inside the radiation member 4401 and/or on an outer surface of the radiation member 4401. The radiation pins 4409 and 4410 may be designed to have various shapes and intervals. A support 4413 having a protruding shape may be formed inside the radiation member 4401. The light source module 4421 may be fixed to the support 4413. Clasps 4411 may be formed at two end portions of the radiation member 4401.

Clasp grooves 4429 may be formed in the cover 4427. The clasps 4411 of the radiation member 4401 may be hook-combined to the clasp grooves 4429. Positions of the clasp grooves 4429 and the clasp 4411 may be exchanged.

The light source module 4421 may include a light-emitting device array. The light source module 4421 may include a PCB 4419, a light source 4417, and a controller 4415. The controller 4415 may store driving information regarding the light source 4417. Circuit interconnections for operating the light source 4417 may be formed on the PCB 4419. Also, constituent elements for operating the light source 4417 may be formed on the PCB 4419. The light source 4417 may include one of the light-emitting devices 100 to 100P according to the above-described example embodiments.

The first and second sockets 4405 and 4423, which are a pair of sockets, may be combined with two ends of a cylindrical cover unit including the radiation member 4401 and the cover 4427. For example, the first socket 4405 may include an electrode terminal 4403 and a power supply device 4407, and the second socket 4423 may include a dummy terminal 4425. In addition, an optical sensor and/or a communication module may be embedded in any one of the first socket 4405 or the second socket 4423. For example, the optical sensor and/or the communication module may be embedded in the second socket 4423 including the dummy terminal 4425. In other example embodiments, the optical sensor and/or the communication module may be embedded in the first socket 4405 including the electrode terminal 4403.

Figure 44:
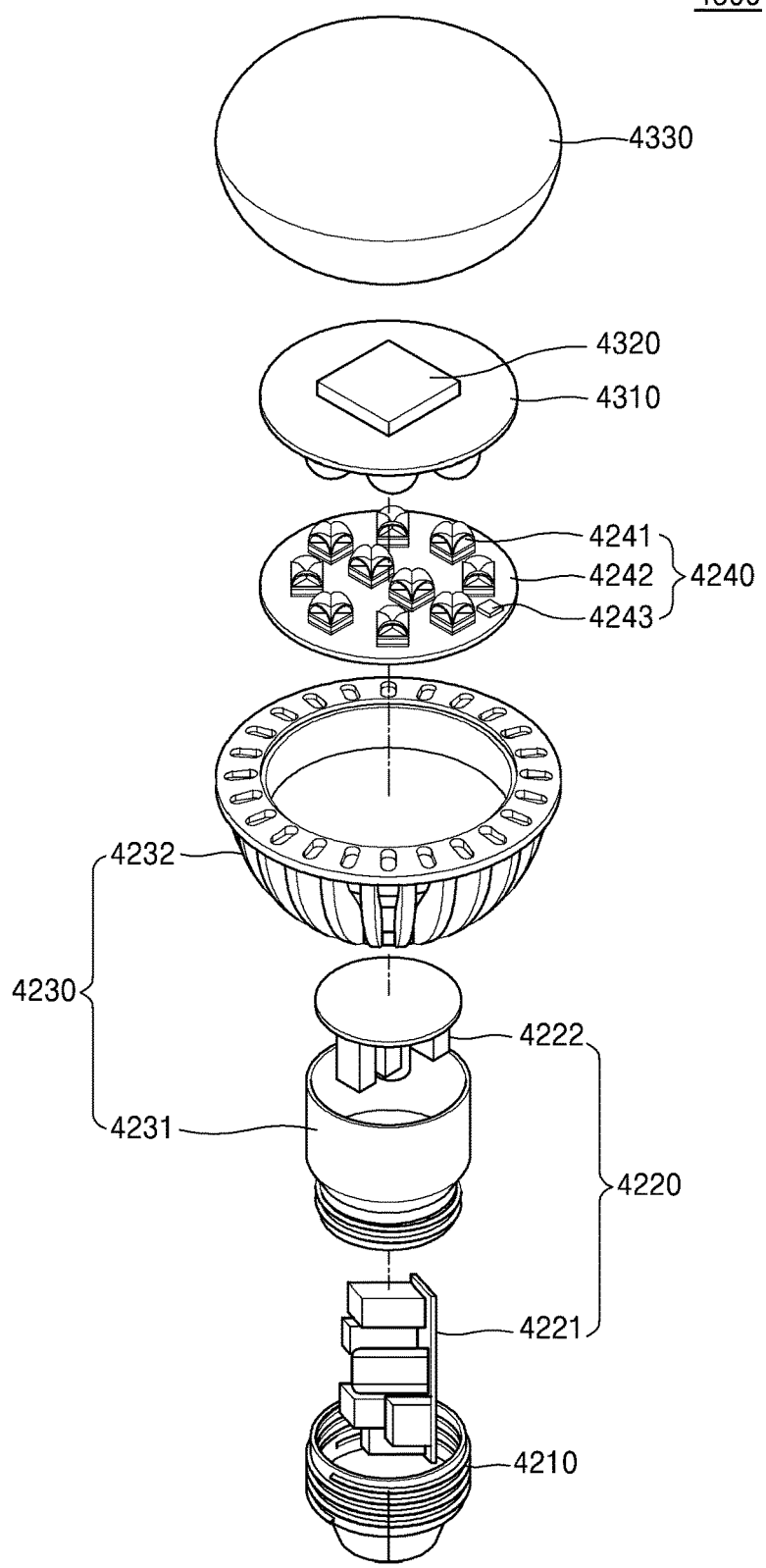
FIG. 44 is a schematic exploded perspective view of a lighting apparatus including a light-emitting device manufactured by using a method of manufacturing a light-emitting device according to an embodiment.

FIG. 44 is a schematic exploded perspective view of a lighting apparatus 4500 including a light-emitting device according to an example embodiment.

In example embodiments, the lighting apparatus 4500 according to the present example embodiment may differ from the lighting apparatus 4200 of FIG. 42 in that a reflection plate 4310 and a communication module 4320 are located on a light source module 4240. The reflection plate 4310 may be configured to uniformly disperse light emitted by the light source module 4240 sideward and backward and thereby reduce light dazzle.

The communication 4320 may be mounted on the reflection plate 4310, and home-network communications may be enabled via the communication module 4320. For example, the communication module 4320 may be a wireless communication module using Zigbee, WiFi, or LiFi, and control household illumination (i.e., turning-on/off of a lighting apparatus and control of brightness) by means of a smartphone or a wireless controller. Also, electronic appliances (e.g. TVs, refrigerators, air-conditioners, door locks, and automobiles) installed inside and outside houses and automobile systems may be controlled by a LiFi communication module using the wavelength of visible light of lighting apparatuses installed inside and outside the houses. The reflection plate 4310 and the communication module 4320 may be covered with a cover unit 4330.

Figure 45:
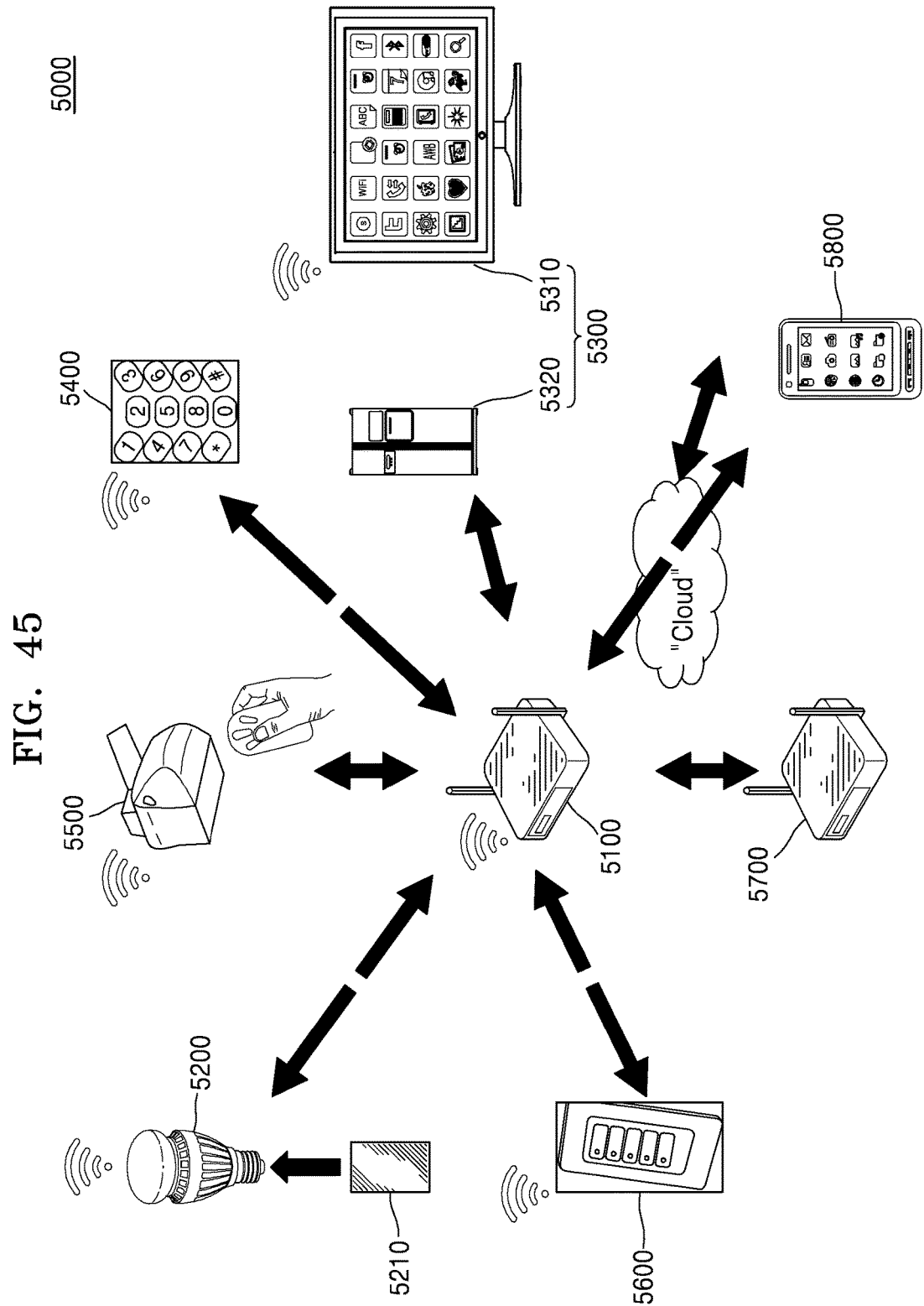
FIG. 45 is a schematic diagram of an indoor illumination control network system including a light-emitting device manufactured by using a method of manufacturing a light-emitting device according to an embodiment.

FIG. 45 is a schematic diagram of an indoor illumination control network system including a light-emitting device according to an example embodiment.

In example embodiments, the network system 5000 may be a complex smart illumination-network system into which illumination technology using an LED, Internet of Things (IoT) technology, and wireless communication technology are converged. The network system 5000 may be embodied using various lighting apparatuses and wired/wireless communication apparatuses. The network system 5000 may be embodied using a sensor, a controller, a communication unit, and software for controlling, maintaining, and managing a network.

The network system 5000 may be applied not only to closed spaces (e.g., houses and offices) defined in buildings but also to open spaces (e.g., parks and streets). The network system 5000 may be embodied based on the IoT environment and collect and process various pieces of information and provide the information to users, for example.

In example embodiments LED lamp 5200 included in the network system 5000 may receive information regarding ambient environments from the gateway 5100 and control illumination of the LED lamp 5200. Also, the LED lamp 5200 may confirm operation states of other apparatuses 5300 to 5800 included in the IoT environment and control the other apparatuses 5300 to 5800, based on a visible light communication function of the LED lamp 5200. The LED lamp 5200 may include one of the light-emitting devices 100 to 100P according to the above-described example embodiments.

The network system 5000 may include a gateway 5100, an LED lamp 5200, and a plurality of apparatuses 5300 to 5800. The gateway 5100 may be configured to process data that are transmitted and received according to different communication protocols. The LED lamp 5200 may be connected to the gateway 5100 to be capable of communicating with the gateway 5100 and include an LED. The plurality of apparatuses 5300 to 5800 may be connected to the gateway 5100 to be capable of communicating with the gateway 5100 by various wireless communication methods. To embody the network system 5000 based on an IoT environment, each of the LED lamp 5200 and the apparatuses 5300 to 5800 may include at least one communication module. In an embodiment, the LED lamp 5200 may be connected to the gateway 5100 to be capable of communicating with the gateway 5100 by using a wireless communication protocol (e.g., WiFi, ZigBee, LiFi, etc.). To this end, the LED lamp 5200 may have at least one lamp communication module 5210.

The network system 5000 may be applied not only to closed spaces, such as houses or offices, but also to open spaces, such as streets or parks. When the network system 5000 is applied to a house, the network system 5000 may include a plurality of apparatuses 5300 to 5800, which may be connected to the gateway 5100 to be capable of communicating with the gateway 5100 based on IoT technology. The plurality of apparatuses 5300 to 5800 may include household appliances 5300, a digital door lock 5400, a garage door lock 5500, a lighting switch 5600 installed on a wall, a router 5700 configured to relay wireless communication networks, and a mobile device 5800 (e.g., a smartphone, a tablet PC, or a laptop computer), for example.

In the network system 5000, the LED lamp 5200 may confirm operation states of various apparatuses 5300 to 5800 or automatically control the brightness of the LED lamp 5200 itself, depending on ambient environments and statuses, using household wireless communication networks (e.g., Zigbee, WiFi, LiFi, etc.). Additionally, the apparatuses 5300 to 5800 included in the network system 5000 may be controlled using LiFi communication using visible light emitted by the LED lamp 5200, for example.

Initially, the network system 5000 may automatically control the brightness of the LED lamp 5200 based on circumferential environments transmitted from the gateway 5100 through the lamp communication module 5210 or circumferential environment information collected by a sensor mounted on the LED lamp 5200. For example, the brightness of the LED lamp 5200 may be automatically controlled depending on the type of a TV program viewed on a TV 5310 or the brightness of a screen of the TV 5310. To this end, the LED lamp 5200 may receive operation information of the TV 5310 from the lamp communication module 5210 connected to the gateway 5100. In example embodiments in accordance with principles of inventive concepts, lamp communication module 5210 may be unified with a sensor and/or a controller included in the LED lamp 5200 to form a module.

For example, when a program value of a TV program viewed on the TV 5310 is a drama, the LED lamp 5200 may lower a color temperature to 12,000K or less (e.g., 5,000K)

according to a preset value and adjust a color sense, thus creating a cozy atmosphere. On the other hand, when a program value is a gag program, or comedy, the network system 5000 may be configured such that the LED lamp 5200 may increase a color temperature to 5,000K or more according to a set value so as to be adjusted to bluish white light.

When there is no one in the home and a predetermined time has elapsed after the digital door lock 5400 is locked, waste of electricity may be prevented by turning off all the turned-on LED lamps 5200, turning off a subset of the lamps 5200, or otherwise reducing power consumption. Alternatively, when a security mode is set by the mobile device 5800 and the digital door lock 5400 is locked while there is no one in the home, the LED lamp 5200 may remain turned on or cycled on and off.

An operation of the LED lamp 5200 may be controlled depending on ambient environments collected by various sensors connected to the network system 5000. For example, when the network system 5000 is embodied in a building; lamps, position sensors, and a communication module may be combined in the building and position information of people in the building may be collected. In this manner, the lamps may be turned on or off or the collected information may be provided in real-time to enable the management of facilities or efficient utilization of idle spaces. In general, because lighting apparatuses (e.g., the LED lamp 5200) are located in almost all spaces of each floor in the building, various pieces of information in the building may be collected by a sensor unified with the LED lamp 5200 and used to manage facilities and utilize idle spaces in accordance with principles of inventive concepts.

In addition, the LED lamp 5200, an image sensor, a storage device, and the lamp communication module 5210 may be combined into a device, and the device may be utilized to maintain the security of a building or sense and handle emergency situations. For example, when a smoke sensor or temperature sensor is attached to the LED lamp 5200, damage may be minimized by rapidly sensing whether or not a fire has occurred and that information passed on or alarms otherwise set. Furthermore, the brightness of a lamp may be controlled in consideration of weathers or sunshine amount so as to economize energy and provide conformable lighting environments.

As described above, the network system 5000 may be applied not only to closed spaces, such as houses, offices, or buildings, but also to open spaces, such as streets or parks. When the network system 5000 is applied to an open space having no physical limitation, it may be relatively difficult to embody the network system 5000 based on the distance limit of wireless communication and communication interference caused by various obstacles. By mounting a sensor and a communication module on each lighting mechanism and using each lighting mechanism as an information collecting unit and a communication relay unit, the network system 500 may be embodied efficiently in open environments in accordance with principles of inventive concepts.

Figure 46:
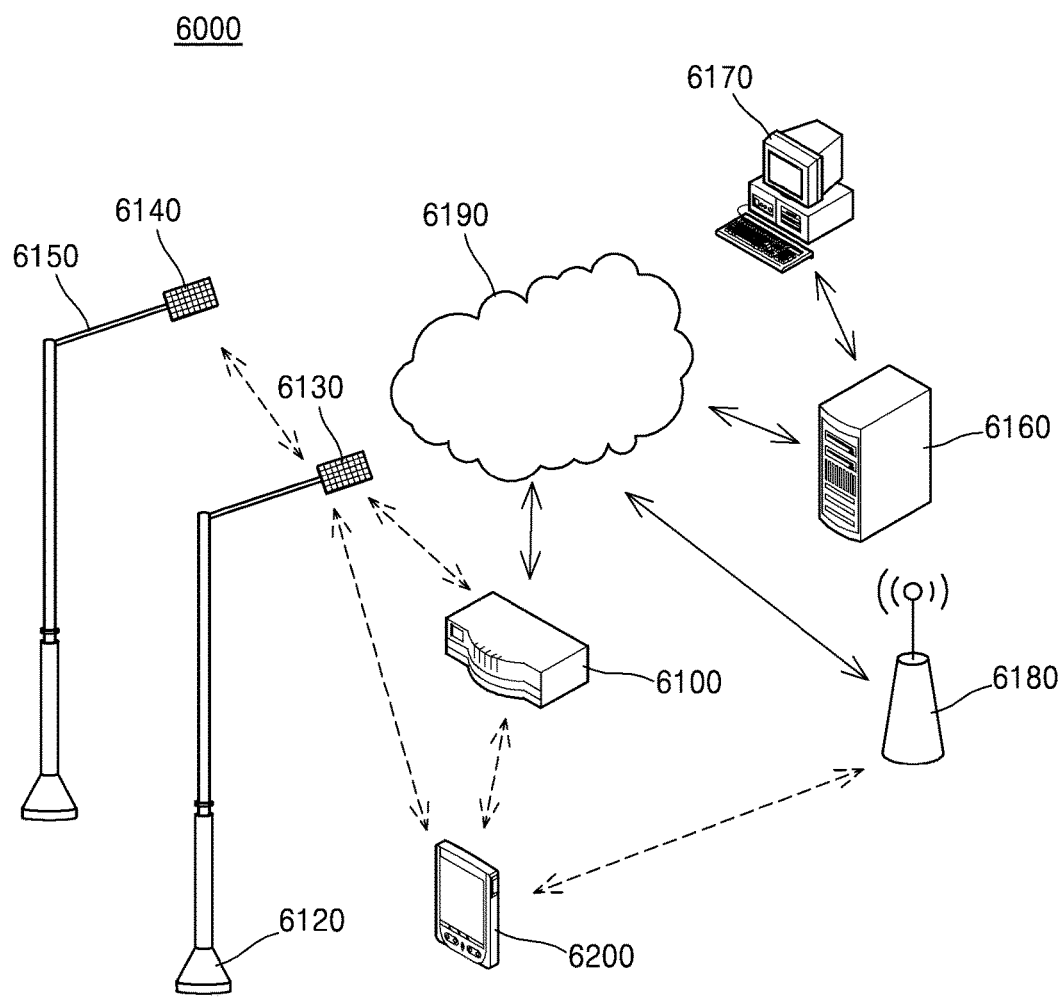
FIG. 46 is a schematic diagram of a network system including a light-emitting device manufactured by using a method of manufacturing a light-emitting device according to an embodiment.

FIG. 46 is a schematic diagram of a network system 6000 including a light-emitting device according to an example embodiment.

In particular, FIG. 46 illustrates the network system 6000 applied to an open space, according to an example embodiment. The network system 6000 according to the present example embodiment may include a communication connection device 6100, a plurality of lighting mechanisms (e.g., lighting mechanisms 6120 and 6150) installed at predetermined intervals and connected to the communication connection device 6100 to be capable of communicating with the communication connection device 6100, a server 6160, a computer 6170 configured to manage the server 6160, a communication base station 6180, a communication network 6190 configured to connect apparatuses capable of communicating with one another, and a mobile device 6200.

The lighting mechanisms 6120 and 6150 installed in an external open space, such as a street or a park, may include smart engines 6130 and 6140, respectively. Each of the smart engines 6130 and 6140 may include a light-emitting device configured to emit light, a driver configured to drive the light-emitting device, a sensor configured to collect information regarding the circumferential environment, and a communication module. The light-emitting device included in each of the smart engines 6130 and 6140 may include one of the light-emitting devices 100 to 100P according to the above-described example embodiments.

The communication module may enable the smart engines 6130 and 6140 to communicate with other peripheral apparatuses according to a communication protocol, such as WiFi, Zigbee, or LiFi.

In an example embodiment, one smart engine 6130 may be connected to another smart engine 6140 to be capable of communicating with the smart engine 6140. In such an embodiment, WiFi extension technology (or WiFi mesh) may be applied to communication between the smart engines 6130 and 6140. A smart engine 6130 may be connected by wire or wirelessly to the communication connection device 6100 connected to the communication network 6190. To increase communication efficiency, a plurality of smart engines (e.g., the smart engines 6130 and 6140) may be grouped and connected to one communication connection device 6100 as a group.

The communication connection device 6100, which is an access point (AP) capable of wired/wireless communication, may mediate between the communication network 6190 and other apparatuses. The communication connection device 6100 may be connected to the communication network 6190 by at least one of wired/wireless communication methods. In example embodiments, the communication connection device 6100 may be mechanically contained in any one of the lighting mechanisms 6120 and 6150.

The communication connection device 6100 may be connected to the mobile device 6200 through a communication protocol, such as WiFi. A user of the mobile device 6200 may receive the circumferential environment information, which is collected by the smart engines 6130 and 6140, through the communication connection device 6100 connected to the smart engine 6130 of the lighting mechanism 6120 disposed adjacent thereto. The circumferential environment information may include surrounding traffic information and weather information, for example. The mobile device 6200 may be connected to the communication network 6190 through the communication base station 6180 using a wireless cellular communication method, such as 3G or 4G.

The server 6160 connected to the communication network 6190 may receive information collected by the smart engines 6130 and 6140 mounted on the lighting mechanisms 6120 and 6150 and simultaneously, monitor operation states of the lighting mechanisms 6120 and 6150. To manage the lighting mechanisms 6120 and 6150 based on monitoring results of the operation states of the lighting mechanisms 6120 and 6150, the server 6160 may be connected to the computer 6170 configured to provide a management system. The computer 6170 may execute software capable of monitoring and managing the operation states of the lighting mechanisms 6120 and 6150, specifically, the smart engines 6130 and 6140.

Figure 47:
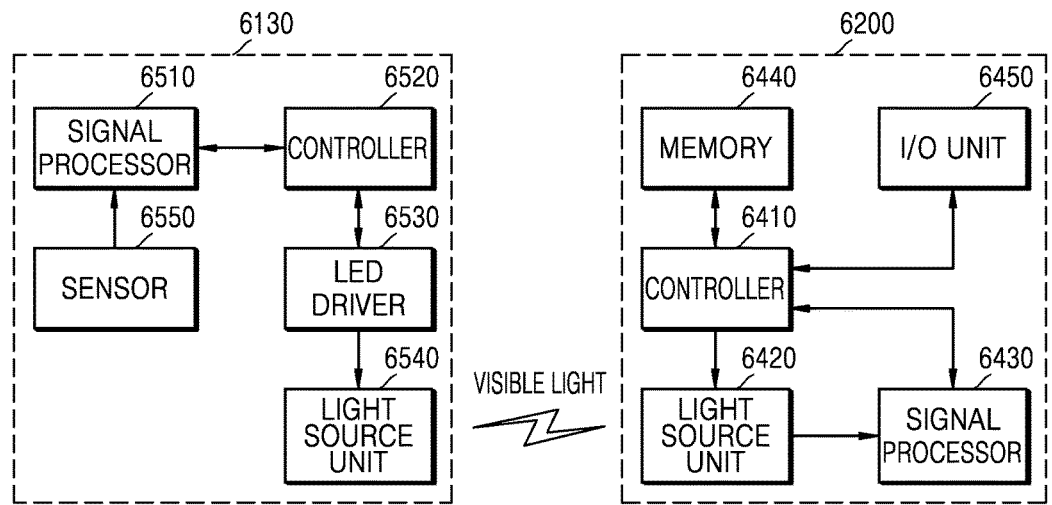
FIG. 47 is a block diagram of an operation of communicating a smart engine of a lighting mechanism including a light-emitting device according to an embodiment with a mobile device.

FIG. 47 is a block diagram of an operation of communicating a smart engine of a lighting mechanism including a light-emitting device according to an example embodiment with a mobile device.

In particular, FIG. 47 is a block diagram of an operation of communicating a smart engine (refer to 6130 in FIG. 46) of a lighting mechanism (refer to 6120 in FIG. 46) with a mobile device 6200 using visible-light wireless communication. Various communication methods may be used to transmit information collected by the smart engine 6130 to a user's mobile device 6200.

Via a communication connection device (refer to 6100 in FIG. 46) connected to the smart engine 6130, information collected by the smart engine 6130 may be transmitted to the mobile device 6200 or the smart engine 6130 and the mobile device 6200 may be connected to one another to be capable of directly communicating with each other. The smart engine 6130 and the mobile device 6200 may directly communicate with each other by LiFi, for example.

The smart engine 6130 may include a signal processor 6510, a controller 6520, an LED driver 6530, a light source unit 6540, and a sensor 6550. The mobile device 6200 connected to the smart engine 6130 by visible-light wireless communication may include a controller 6410, a light receiving unit 6420, a signal processor 6430, a memory 6440, and an input/output (I/O) unit 6450.

LiFi technology is wireless communication technology that may wirelessly transmit information using light having a visible wavelength range: light that may be perceived by the human eye. Visible-light wireless communication technology may be distinguished from wired optical communication technology and infrared (IR) wireless communication of the related art in that light having a visible wavelength range (i.e., light having a specific visible wavelength range emitted by a light-emitting device package according to the above-described embodiment) is used. Additionally, visible-light wireless communication technology may be distinguished from wired optical communication technology of the related art in that a wireless communication environment is used. Furthermore, unlike radio-frequency (RF) wireless communication, visible-light wireless communication technology may be excellent in convenience and physical security because frequencies may be freely used without regulation or permission. Also, with visible-light wireless communication technology, a user may see a communication link with the eyes. Finally, visible-light wireless communication technology may be characterized as convergence technology by serving as both a light source and a communication device.

The signal processor 6510 of the smart engine 6130 may process data to be transmitted and received by visible-light wireless communication. In an example embodiment, the signal processor 6510 may convert information collected by the sensor 6550 into data and transmit the data to the controller 6520. The controller 6520 may control operations of the signal processor 6510 and the LED driver 6530. In particular, the controller 6520 may control operations of the LED driver 6530 based on data transmitted by the signal processor 6510. The LED driver 6530 may enable the light source unit 6540 to emit light in response to a control signal transmitted by the controller 6520, and transmit data to the mobile device 6200.

The mobile device 6200 may include a controller 6410, a memory 6440 configured to store data, an I/O unit 6450 including a display, a touch screen, and an audio output unit, and a signal processor 6430 and further include a light receiving unit 6420 configured to recognize visible light including data. The light receiving unit 6420 may sense visible light and convert the visible light into an electric signal. The signal processor 6430 may decode data included in the electric signal converted by the light receiving unit 6420. The controller 6410 may store the data decoded by the signal processor 6430 in the memory 6440 or output the decoded data via the I/O unit 6450 so that a user may recognize the data.

Figure 48:
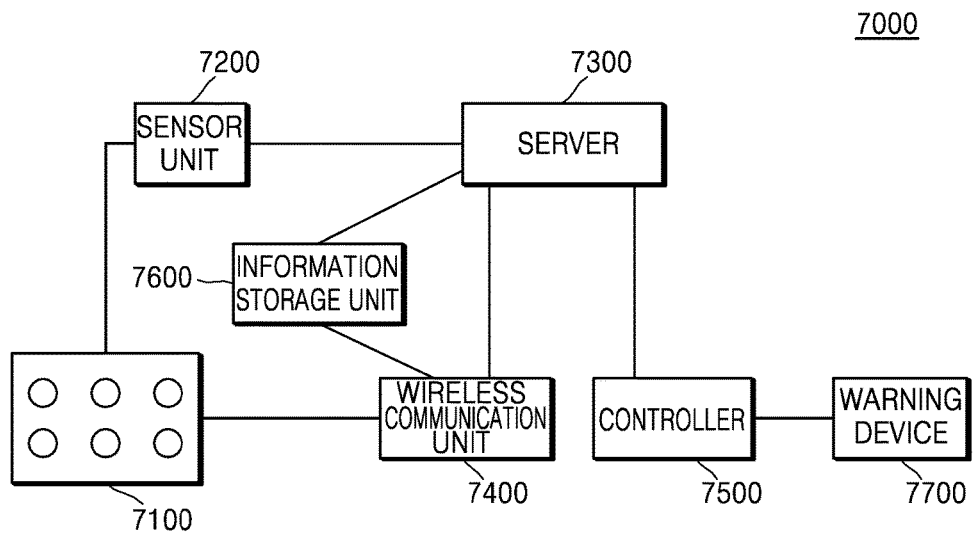
FIG. 48 is a schematic diagram of a smart lighting system including a light-emitting device manufactured by using a method of manufacturing a light-emitting device according to an embodiment.

FIG. 48 is a schematic diagram of a smart lighting system 7000 including a light-emitting device according to an example embodiment.

In particular, the smart lighting system 7000 may include an illumination unit 7100, a sensor unit 7200, a server 7300, a wireless communication unit 7400, a controller 7500, and an information storage unit 7600. The illumination unit 7100 may include one lighting apparatus or a plurality of lighting apparatuses in a building, and a type of the lighting apparatus is not limited. For example, the illumination unit 7100 may include basic lamps for a living room, a room, a balcony, a kitchen, a bathroom, a staircase, and a front door, a mood lamp, a stand lamp, or a decorative lamp. The lighting apparatus may include one of the light-emitting devices 100 to 100P according to the above-described example embodiments.

The sensor unit 7200 may sense illumination states related to the turning on/off of each lighting apparatus and the intensity of a lamp, output sensing signals, and transmit the sensing signals to the server 7300. The sensor unit 7200 may be prepared in a building in which the lighting apparatuses are installed. One sensor unit or a plurality of sensor units 7200 may be located in such positions as to sense illumination states of all lighting apparatus that are under the control of the smart lighting system 7000.

Information regarding the illumination states may be transmitted to the server 7300 in real-time or at predetermined time intervals, for example, minute intervals or hour intervals. The server 7300 may be installed inside and/or outside the building. The server 7300 may receive signals from the sensor unit 7200, collect information regarding the illumination states related to the turning on/off of the illumination unit 7100 in the building, group the collected information, define illumination patterns based on the grouped information, and provide information regarding the defined illumination patterns to the wireless communication unit 7400. Also, the server 7300 may serve as a medium for transmitting commands received from the wireless communication unit 7400 to the controller 7500.

In particular, when the sensor unit 7200 senses an illumination state in the building and transmits a sensing signal, the server 7300 may receive the sensing signal, collect information regarding the illumination state, and analyze the information. For example, the server 7300 may classify the collected information into groups according to various periods of time, for example, hour, date, day of the week, weekday/weekend, set specific days, week, or month. Thereafter, the server 7300 may define illumination patterns in average units of days, weeks, weekdays, weekends, and months based on several groups of information and program 'defined illumination patterns'. The 'defined illumination patterns' may be periodically provided to the wireless communication unit 7400 or received from the server 7300 when a user requests information regarding illumination patterns, for example.

In addition to the operation of defining the illumination patterns based on information regarding the illumination states provided by the sensor unit 7200, the server 7300 may provide previously programmed 'typical illumination patterns' to the wireless communication unit 7400 based on a typical illumination state sensed in the home. Similar to the 'defined illumination patterns', the 'typical illumination patterns' may be periodically provided from the server 7300 or provided at a user's request. Although only one server 7300 is illustrated in FIG. 48, inventive concepts are not limited thereto and a plurality of servers may be provided. Optionally, the 'typical illumination pattern' and/or the 'defined illumination pattern' may be stored in the information storage unit 7600. The information storage unit 7600 may be a storage device that may be accessed via a network, such as, for example, the cloud.

The wireless communication unit 7400 may select any one of a plurality of illumination patterns provided by the server 7300 and/or the information storage unit 7600 and transmit a command signal for executing or stopping an 'automatic illumination mode' to the server 7300. The wireless communication unit 7400 may be one of various portable wireless communication devices (e.g., a smartphone, a tablet PC, a personal digital assistant (PDA), a laptop computer, and a netbook) that a user of the smart lighting system 7000 may carry.

In particular, the wireless communication unit 7400 may receive various defined illumination patterns from the server 7300 and/or the information storage unit 7600, select an illumination pattern from among the illumination patterns, and transmit a command signal to the server 7300 to execute the 'automatic illumination mode' in which the illumination unit 7100 may operate according to the selected illumination pattern. The command signal may be transmitted at a fixed execution time. Alternatively, after the command signal is transmitted without fixing an interruption time, an interruption signal may be transmitted so that the execution of the 'automatic illumination mode' may be interrupted.

The wireless communication unit 7400 may additionally include a function of enabling a user to partially revise the illumination pattern provided by the server 7300 and/or the information storage unit 7600 or manipulate or configure a new illumination pattern. The revised or newly manipulated 'user setting illumination pattern' may be stored in the wireless communication unit 7400 and automatically transmitted to the server 7300 and/or the information storage unit 7600 or transmitted at a user's request. Additionally, the wireless communication unit 7400 may receive the 'defined illumination pattern' and the 'typical illumination pattern' set by the server 7300 from the server 7300 and/or the information storage unit 7600 automatically or by transmitting a provision request signal to the server 7300.

As described above, the wireless communication unit 7400 may transmit and receive commands or information signals to and from the server 7300 and/or the information storage unit 7600. The server 7300 may serve as a medium among the wireless communication unit 7400, the sensor unit 7200, and the controller 7500 and operate a smart illumination system.

Connection of the wireless communication unit 7400 with the server 7300 may be performed by using, for example, an application or "app," which is an application program of a smartphone. That is, a user may command a server to execute an 'automatic illumination mode' via an application downloaded from the smartphone, or provide information regarding a 'user setting illumination pattern' on which the user has performed a manipulation or revision, for example.

A method of providing information in accordance with principles of inventive concepts may include automatically transmitting information to the server 7300 and/or the information storage unit 7600 by storing the 'user setting illumination pattern' or include performing a manipulation for transmitting the information. The method of providing information may be determined as a basic setting of an application or selected by a user according to options.

The controller 7500 may receive the command signal for executing and stopping the 'automatic illumination mode' from the server 7300, enable the illumination unit 7100 to execute the command signal, and control one or a plurality of lighting apparatuses. That is, the controller 7500 may control turning on/off and other operations of each lighting apparatus included in the illumination unit 7100 in response to commands of the server 7300.

In addition, the smart illumination system 7000 may further include a warning device 7700 located in a building. When there is an intruder in the building, the warning device 7700 may be configured to warn a user of the intruder.

In particular, when the user is absent and the 'automatic illumination mode' is operating in the building, an intruder may intrude into the building and an abnormal sign deviating from a set illumination pattern may occur. In this case, the sensor unit 7200 may sense the abnormal sign and transmit a warning signal to the server 7300. Additionally, the server 7300 may inform the wireless communication unit 7400 of the warning signal and simultaneously, transmit a signal to the controller 7500 so that the warning device 7700 may operate in the building.

When the warning signal is transmitted to the server 7300, the server 7300 may further include a system capable of directly informing a security enterprise (for example, a subscription security service) of an emergency via the wireless communication unit 7400 or a transmission control protocol/Internet protocol (TCP/IP) network.

Figure 49:
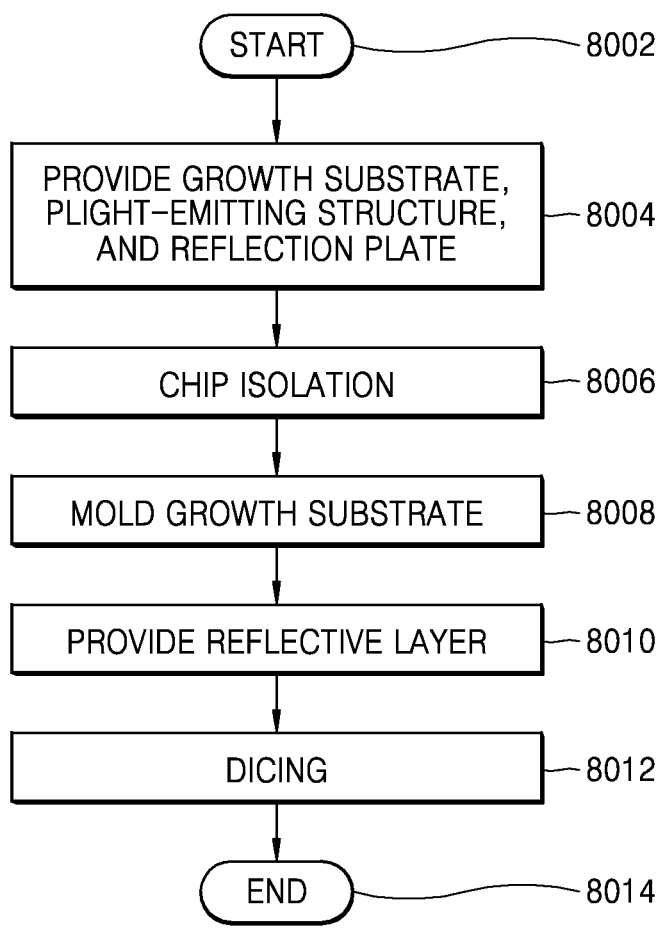
FIG. 49 is a flowchart of a method of manufacturing a light-emitting device according to an embodiment.

FIG. 49 is a flowchart of a method of manufacturing a light-emitting device according to an example embodiment.

FIGS. 50 to 54 are cross-sectional views illustrating the method of manufacturing the light-emitting device shown in FIG. 49, according to an example embodiment.

Figure 50:
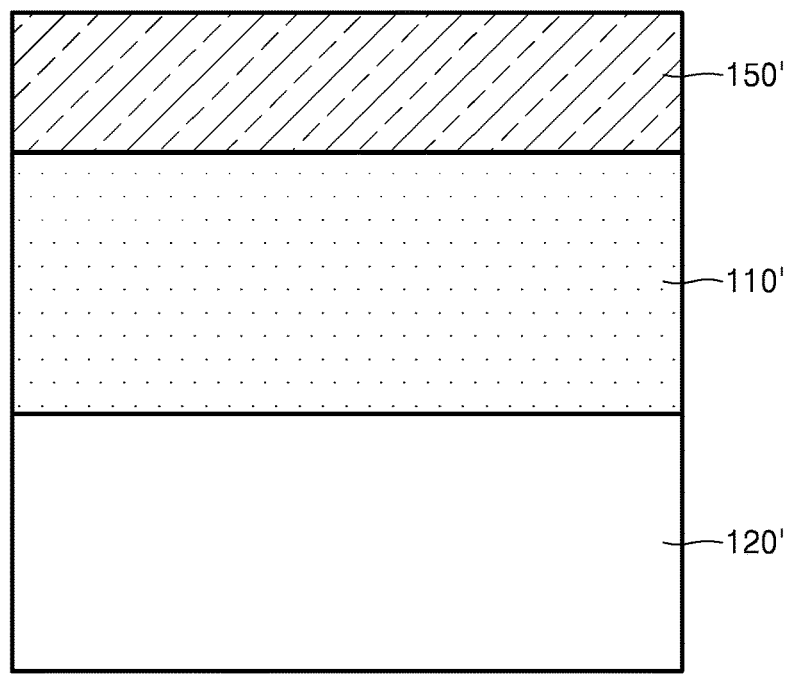
FIGS. 50 to 54 are cross-sectional views illustrating a method of manufacturing a light-emitting device according to an embodiment.

Referring to FIG. 49 and FIG. 50, in the process 8004, a growth substrate 120', a light-emitting structure 110', and a reflection plate 150' may be provided. The growth substrate 120' may include at least one transparent material, such as sapphire, silicon carbide (SiC), and gallium nitride (GaN).

The light-emitting structure 110' may be formed by depositing a first-conductivity-type semiconductor layer, an active layer, and a second-conductivity-type semiconductor layer. For example, the first-conductivity-type semiconductor layer, the active layer, and the second-conductivity-type semiconductor layer may be deposited by using at least one of: a chemical vapor deposition (CVD) process, a physical vapor deposition (PVD) process, and an atomic layer deposition (ALD) process. At least one contact hole may be formed and extend to at least a partial region of the first-conductivity-type semiconductor layer so that the first electrode layer may be electrically connected to the first-conductivity-type semiconductor layer but electrically insulated from the second-conductivity-type semiconductor layer and the active layer. The at least one contact hole may extend from an interface of the first electrode layer through a second electrode layer, the second-conductivity-type semiconductor layer, and the active layer into the first-conductivity-type semiconductor layer. The at least one contact hole may be formed using an etching process, for example, an ICP-RIE process.

The reflection plate 150' may include a metal, a DBR, or a composite organic material including white silicone (or TiO$_2$ silicone). The reflection plate 150' may be provided using a CVD process, a PVD process, or an ALD process, for example. The reflection plate 150' may or may not be provided.

Figure 51:
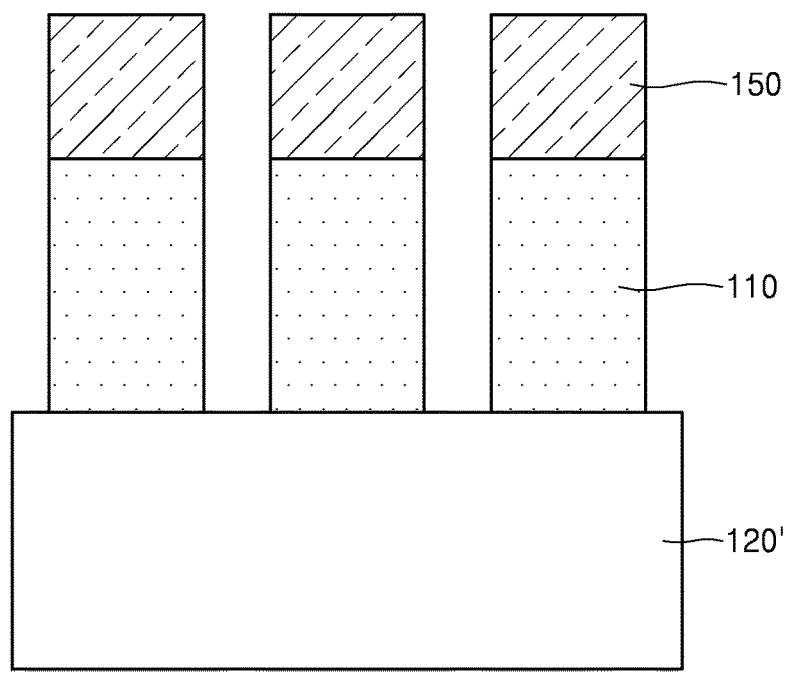

Referring to FIG. 49 and FIG. 51, in the process 8006, the light-emitting structure 110' and the reflection plate 150' may be chip-isolated to form a light-emitting structure 110 and a reflection plate 150. In such embodiments, various processes, such as a laser processing process or a plasma etching process, may be employed.

Figure 52:
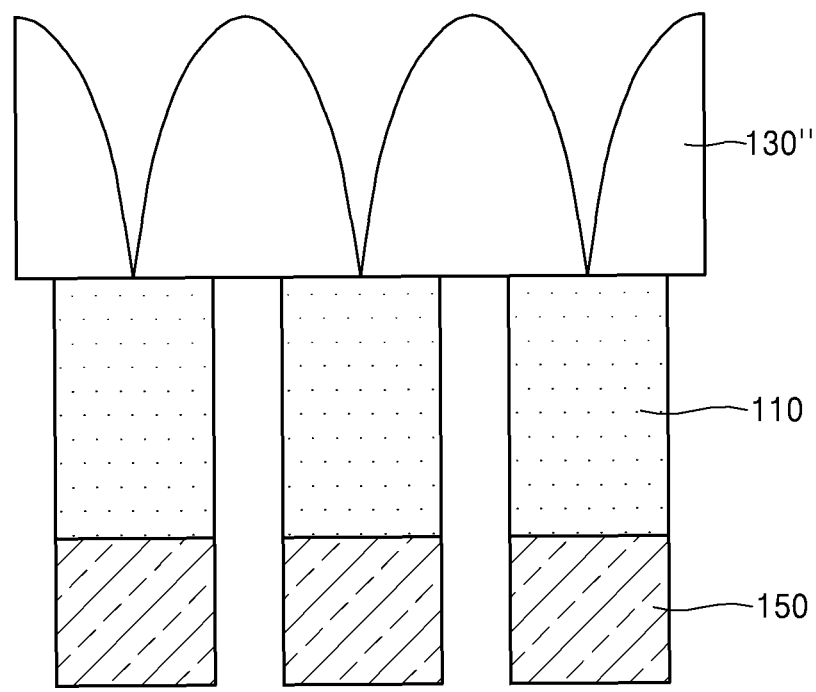

Referring to FIG. 49 and FIG. 52, in the process 8008 the growth substrate 120' may be molded into a lens array 130". In such embodiments, a laser process, a molding process, or a plasma etching process may be employed. Photoresist may be used to mold the growth substrate 120' into the lens array 130" having a desired shape (refer to FIGS. 1 to 21). The photoresist may be annealed so that a shape of the photoresist may be modified into various shapes including a curved surface shape. Thereafter, the shape of the photoresist may be transferred to a shape of the growth substrate 120' during a photolithography process so that the lens array 130" may have various shapes including a curved surface shape.

Figure 53:
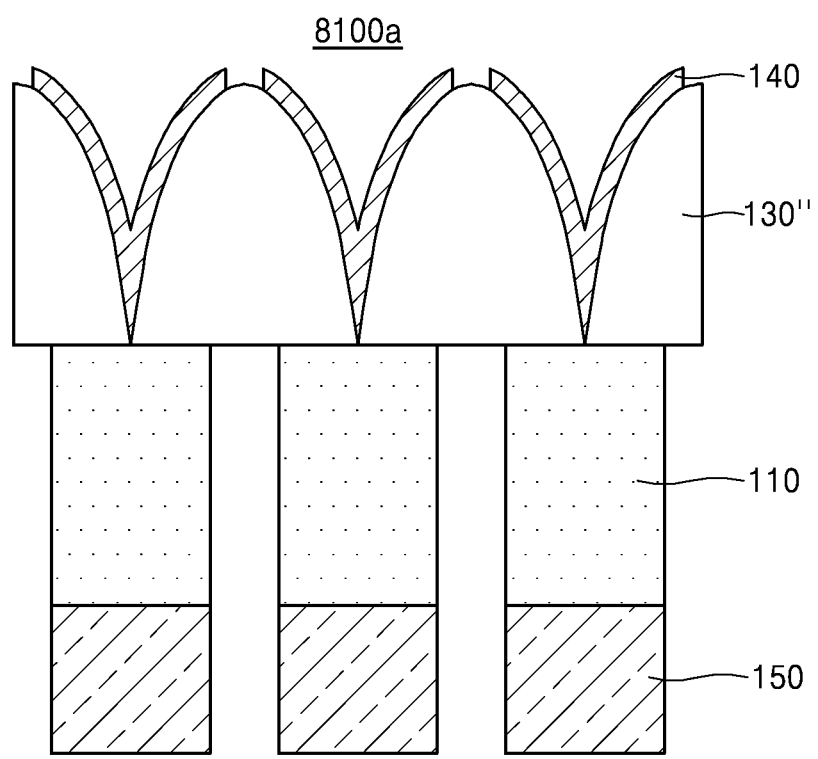

Referring to FIG. 49 and FIG. 53, in the process 8010 a reflective layer 140 may be provided on the lens array 130". The process shown in FIG. 53 may be performed to form a light-emitting structure array 8100*a*. The reflective layer 140 may include at least one of: a metal, a DBR, and a composite organic material including white silicone (TiO$_2$ silicone). A portion of the reflective layer 140 may be removed using a lithography process or an ion sputtering process, for example. Alternatively, the reflective layer 140 may not be deposited on a portion of the lens array 130," leaving one or more openings, using a masking process.

Figure 54:
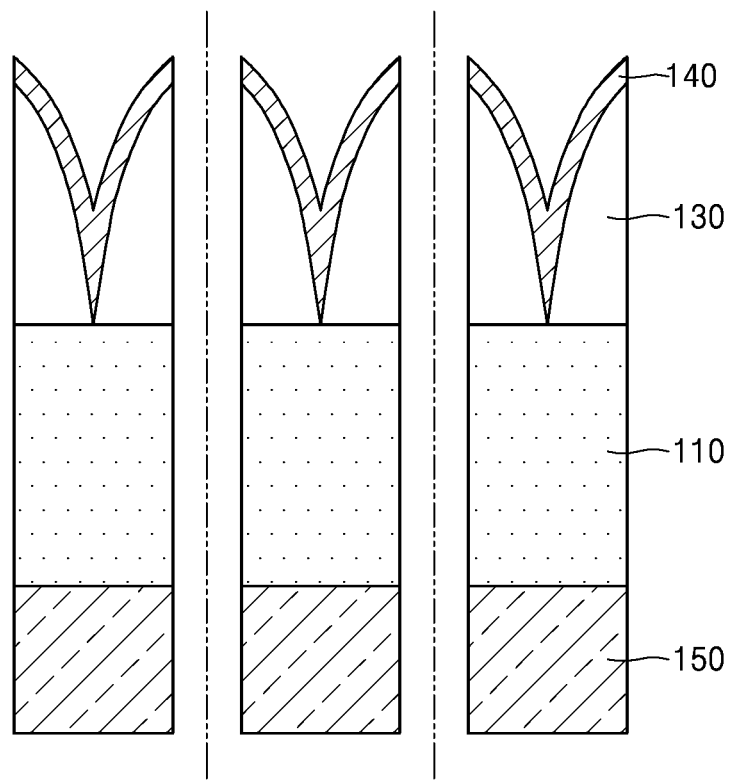

Referring to FIG. 49 and FIG. 54, in the process 8012 the light-emitting structure array 8100*a* may be diced into unit light-emitting devices. In such embodiments, the lens array 130" may also be divided into unit lenses 130.

The processes described above with reference to FIGS. 50 to 54 are exemplarily provided and may be embodied in various orders.

FIGS. 55 to 61 are cross-sectional views illustrating a method of manufacturing a light-emitting device according to an example embodiment.

Hereinafter, the same descriptions as in the above-described embodiments will not be repeated, and differences between the present example embodiment and the above-described example embodiments will chiefly be described.

Figure 55:
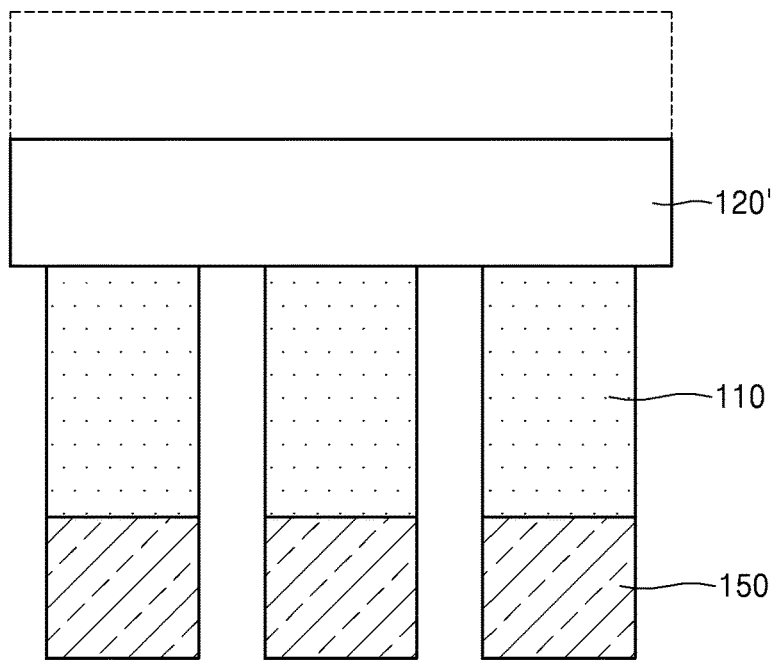
FIGS. 55 to 61 are cross-sectional views illustrating a method of manufacturing a light-emitting device according to an embodiment.

Referring to FIG. 55, a growth substrate 120' may be thinned. The thinning of the growth substrate 120' may be performed by using a chemical mechanical polishing (CMP) process, for example. The thinning of the growth substrate 120' may be performed by flipping the growth substrate 120' upside down, then polishing, for example.

Figure 56:
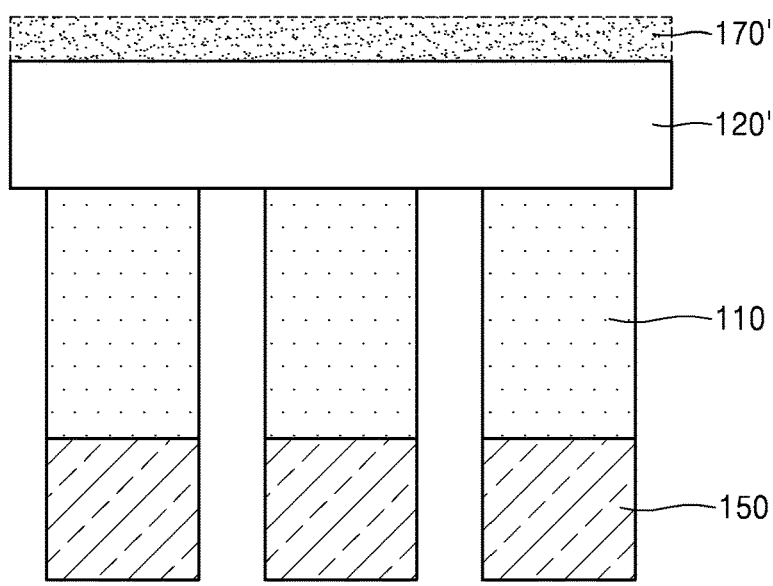

Referring to FIG. 56, a light conversion layer 170' may be provided on the growth substrate 120'. The light conversion layer 170' may include at least one of materials including phosphors and QDs. The process of providing the light conversion layer 170' may be omitted.

Figure 57:
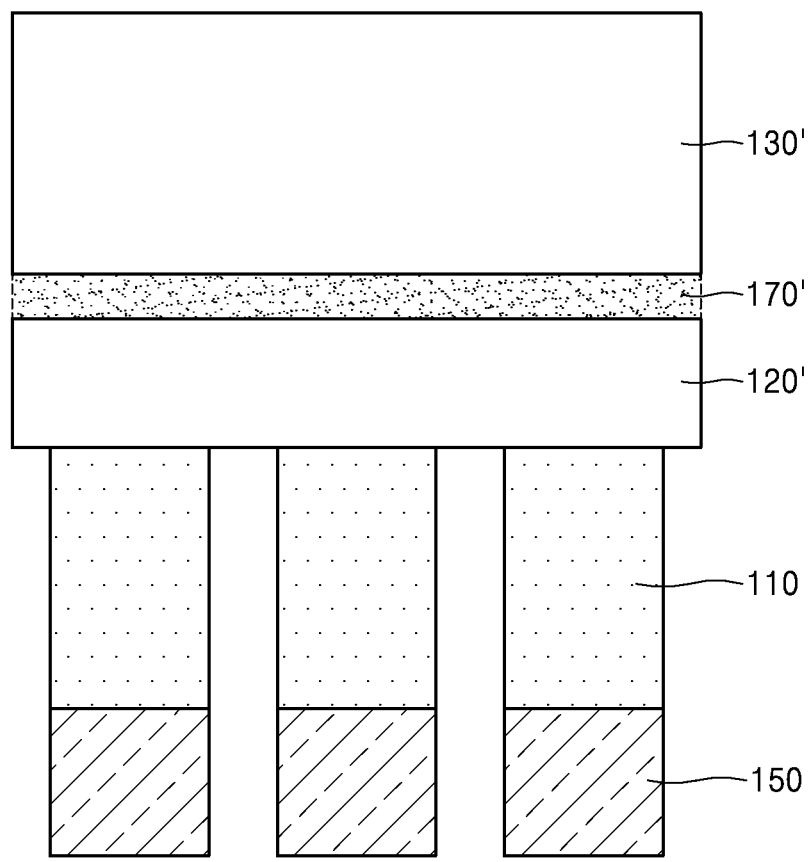

Referring to FIG. 57, a transparent substrate 130' may be provided. The transparent substrate 130' may be formed by depositing at least one of: glass, SiC, SiO$_2$, Al$_2$O$_3$, quartz, diamond, PMMA, and SOG. For example, the transparent substrate 130' may be formed by using a CVD process, a PVD process, or an ALD process.

Figure 58:
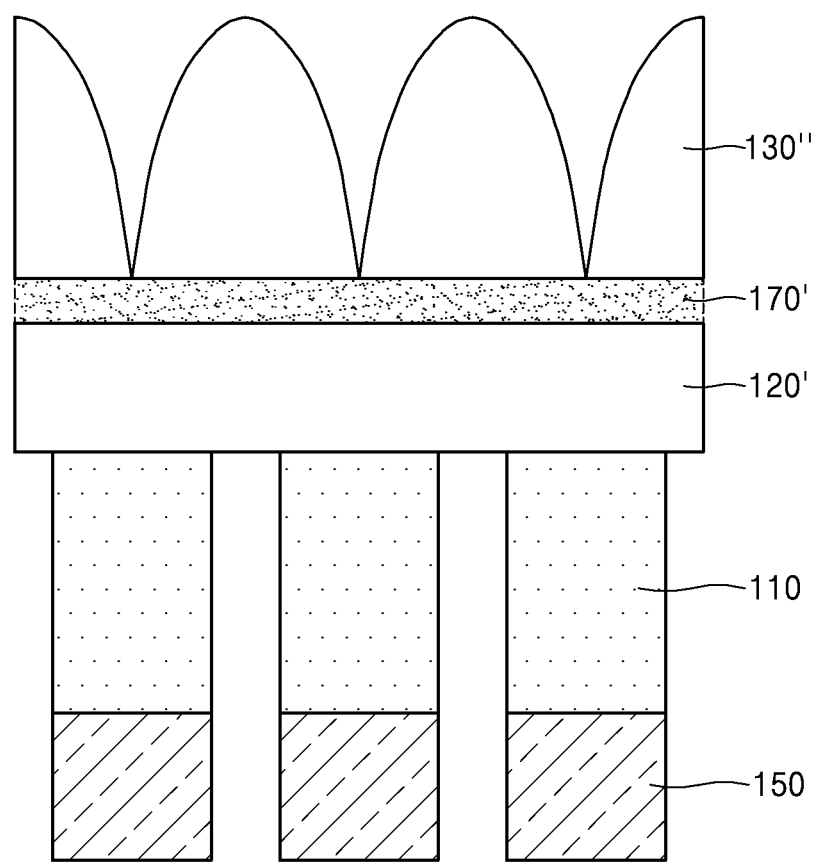

Referring to FIG. 58, the transparent substrate 130' may be molded into a lens array 130". In such embodiments, a laser process, a molding process, or a plasma etching process may be employed. Photoresist may be used to mold the transparent substrate 130' into the lens array 130" having a desired shape (refer to FIGS. 1 to 21). The photoresist may be annealed so that the shape of the photoresist may be modified into various shapes including a curved surface shape. Thereafter, the shape of the photoresist may be transferred to the shape of the transparent substrate 130' during a photolithography process so that the lens array 130" may have various shapes including a curved surface shape.

Figure 59:
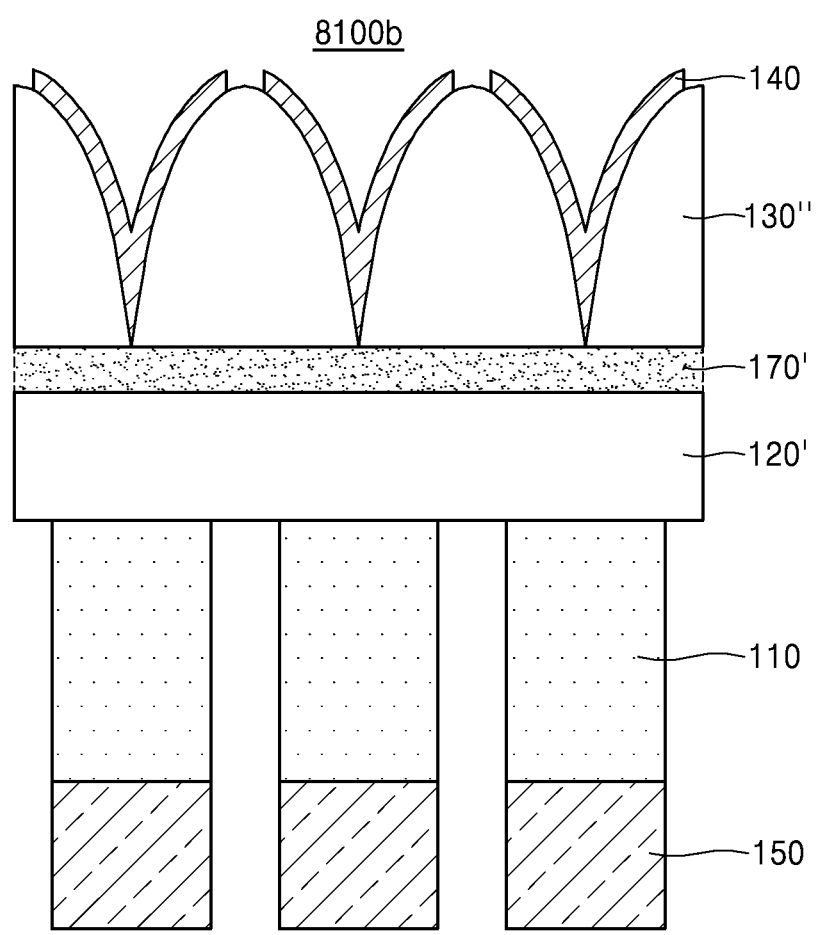

Referring to FIG. 59, a reflective layer 140 may be provided on the lens array 130". The process shown in FIG. 59 may be performed to form a light-emitting structure array 8100*b*. The reflective layer 140 may include at least one of: a metal, a DBR, and a composite organic material including white silicone (TiO$_2$ silicone). A portion of the reflective layer 140 may be removed using a lithography process or an ion sputtering process, for example. Alternatively, the reflective layer 140 may not be deposited on a portion of the lens array 130," leaving one or more openings, using a masking process.

Figure 60:
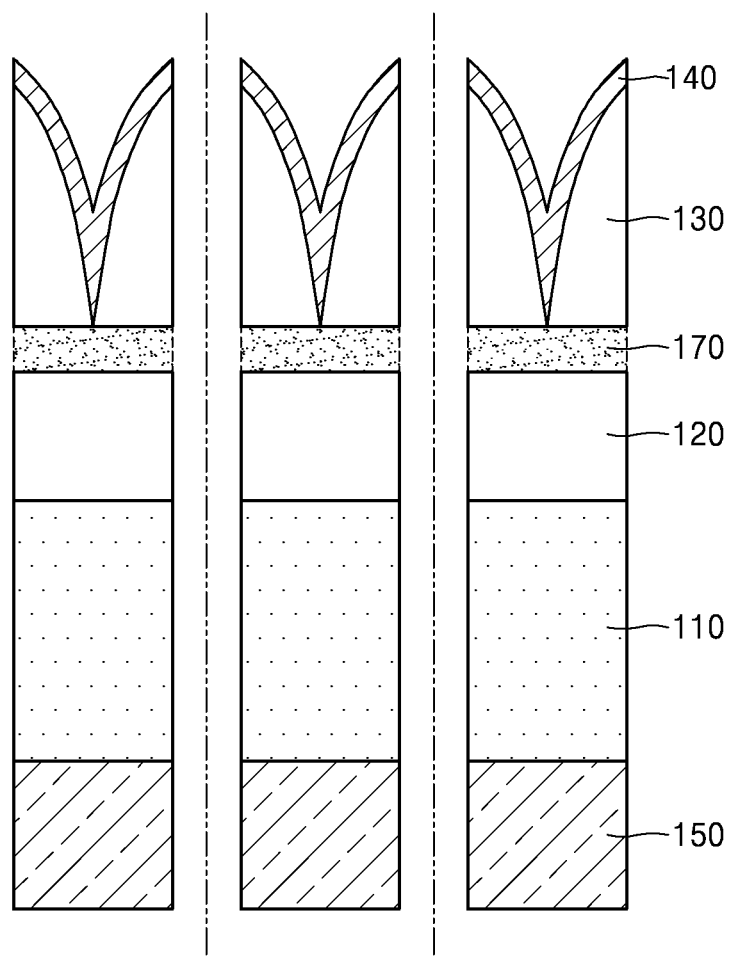

Referring to FIG. 60, the light-emitting structure array 8100*b* may be diced into unit light-emitting devices. In such embodiments, the lens array 130" may also be divided into unit lenses 130.

Figure 61:
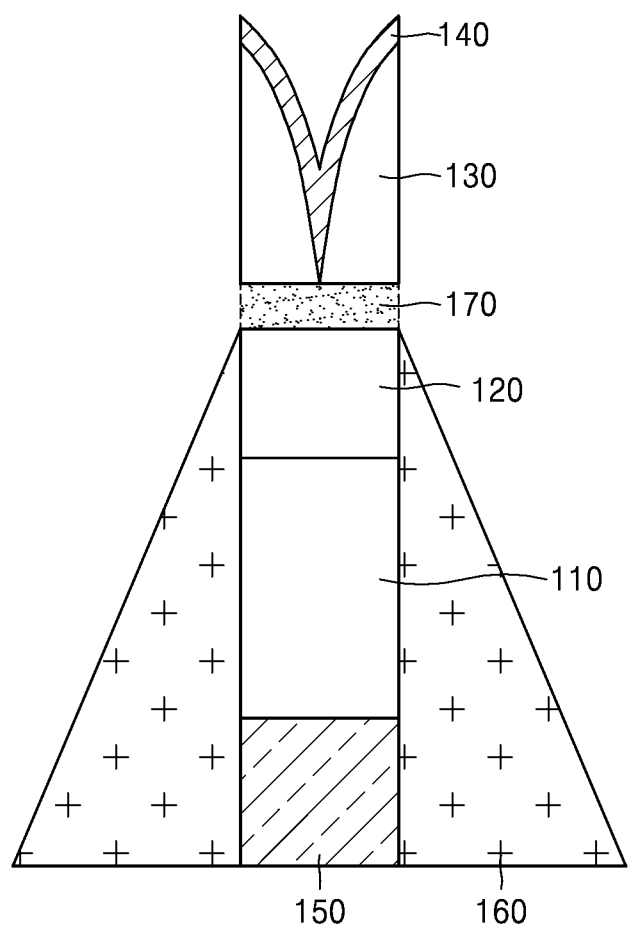

Referring to FIG. 61, a blocking layer 160 may be provided. The blocking layer 160 may include at least one of: a metal, a DBR, white silicone (TiO$_2$ silicone), and a composite organic material. The blocking layer 160 may cover exposed side surfaces of the growth substrate 120 and/or the light-emitting structure 110. The blocking layer 160 may extend to the light conversion layer 170, for example. The illustrated shape of the blocking layer 160 is only an example, and is not intended to limit the scope of inventive concepts in any sense; the blocking layer 160 may have a different shape.

Figure 62:
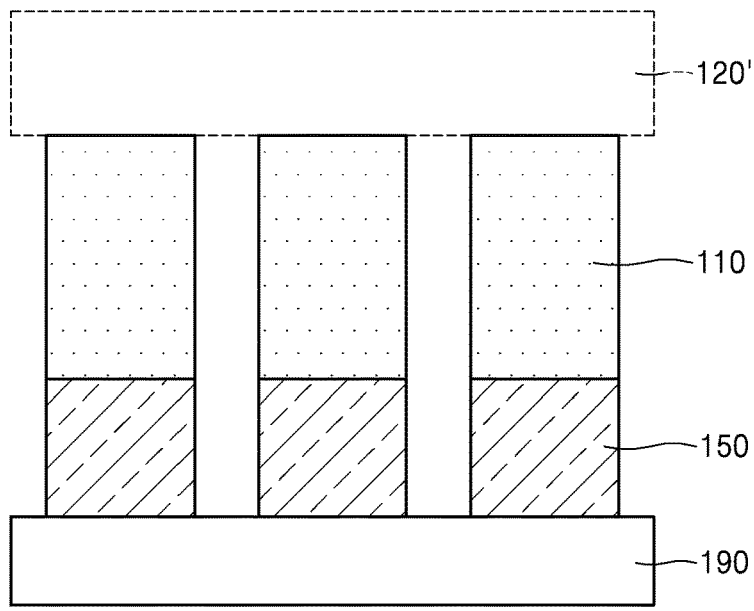
FIGS. 62 and 63 are diagrams of a method of manufacturing a light-emitting device according to an embodiment.
Figure 63:
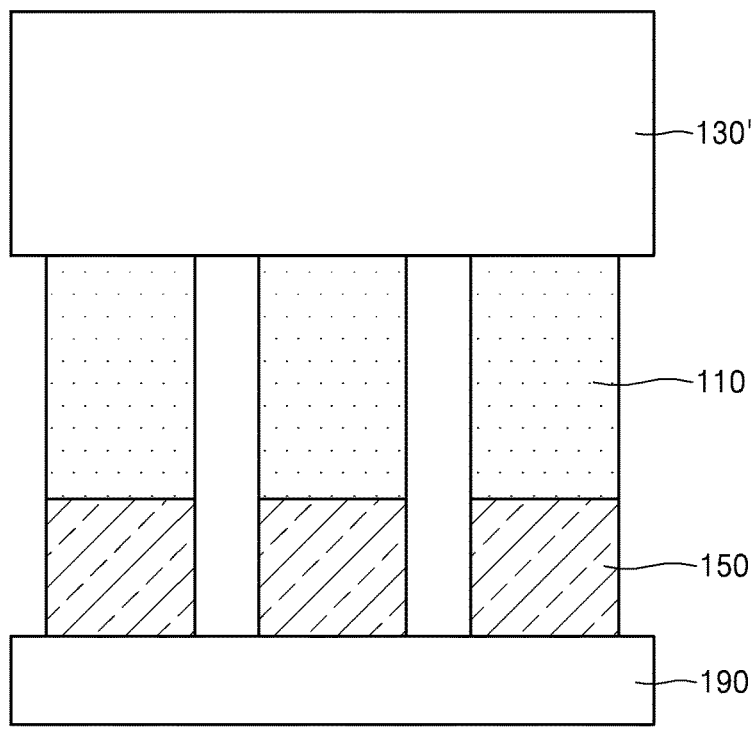

FIGS. 62 and 63 are cross-sectional views of a method of manufacturing a light-emitting device according to an example embodiment.

Hereinafter, the same descriptions as in the above-described embodiments will not be repeated, and differences between the present embodiment and the above-described embodiments will chiefly be described.

Referring to FIG. 62, the growth substrate 120' may be completely removed. In such an embodiment, a support substrate 190 for supporting unit light-emitting structures may be provided.

Referring to FIG. 63, a transparent substrate 130' may be provided. The transparent substrate 130' may be formed by depositing at least one of glass, SiC, SiO$_2$, Al$_2$O$_3$, quartz, diamond, PMMA, and SOG. For example, the transparent substrate 130' may be formed using a CVD process, a PVD process, or an ALD process. Subsequently, the support substrate 190 may be removed.

While the inventive concepts have been particularly shown and described with reference to example embodiments thereof, it will be understood that various changes in form and details may be made therein without departing from the spirit and scope of inventive concepts, as set forth in the following claims.

What is claimed is:

1. A light-emitting device comprising:
   a light-emitting structure comprising a light-emitting stack structure including a first-conductivity-type semiconductor layer, an active layer, and a second-conductivity-type semiconductor layer, which are stacked, a first electrode electrically connected to the first-conductivity-type semiconductor layer, and a second electrode electrically connected to the second-conductivity-type semiconductor layer;
  a lens on the light-emitting structure, a bottom plane of the lens facing the light emitting structure having an area less than or equal to a horizontal cross-sectional area of the light-emitting structure;
  a reflective layer on the lens, wherein the lens and reflective layer are configured to direct light emitted by the light-emitting structure at an incline to a central axis of the lens; and
  a growth substrate between the lens and the light-emitting structure.

2. The light-emitting device of claim 1, wherein the reflective layer is located opposite the light-emitting structure across the lens.

3. The light-emitting device of claim 1, wherein the reflective layer covers only a portion of an exposed portion of the lens.

4. The light-emitting device of claim 1, wherein the lens and/or the reflective layer are configured such that different paths of light emitted by the light emitting structure are directed far away from one another in a direction in which the light travels.

5. The light-emitting device of claim 1, wherein the reflective layer does not wholly cover a surface of the lens on which the reflective layer is located.

6. The light-emitting device of claim 1, further comprising a reflection plate under the light-emitting structure.

7. The light-emitting device of claim 1, wherein the lens comprises silicon carbide (SiC).

8. The light-emitting device of claim 1, wherein the growth substrate comprises an exposed side surface and the light-emitting device further comprising a blocking layer on the exposed side surface of the growth substrate.

9. The light-emitting device of claim 1, further comprising a light conversion layer surrounding at least a portion of the light-emitting structure.

10. The light-emitting device of claim 8, wherein the light-emitting structure comprises an exposed portion on a side surface of the light-emitting structure and wherein the blocking layer extends on at least a portion of the exposed portion of the light-emitting structure.

11. A light-emitting device comprising:
  a light-emitting structure;
  a multi-faceted lens on the light-emitting structure, a bottom plane of the multi-faceted lens facing the light emitting structure having an area less than or equal to a horizontal cross-sectional area of the light emitting structure, and
  a reflective layer on the multi-faceted lens, wherein the multi-faceted lens and reflective layer are configured to distribute light emitted by the light-emitting structure in a direction inclined with respect to an axis about which the multi-faceted lens is located; and
  a growth substrate between the multi-faceted lens and the light-emitting structure.

12. The light emitting device of claim 11, wherein the multi-faceted lens includes four lenses, each of which has a quadrisected spherical shape.

13. The light emitting device of claim 11, wherein the multi-faceted lens includes two lenses, each of which has a quadrisected spherical shape.

14. The light emitting device of claim 11, wherein the multi-faceted lens includes eight lenses, each of which has a quadrisected spherical shape.

15. The light emitting device of claim 11, wherein the multi-faceted lens includes a lens having a quadrisected elliptical pillar shape.

* * * * *